(12) United States Patent
Shishido et al.

(10) Patent No.: US 11,044,433 B2
(45) Date of Patent: *Jun. 22, 2021

(54) IMAGING DEVICE

(71) Applicant: Panasonic Intellectual Property Management Co., Ltd., Osaka (JP)

(72) Inventors: Sanshiro Shishido, Osaka (JP); Takeyoshi Tokuhara, Osaka (JP); Masaaki Yanagida, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/681,370

(22) Filed: Nov. 12, 2019

(65) Prior Publication Data
US 2020/0084404 A1 Mar. 12, 2020

Related U.S. Application Data

(63) Continuation of application No. 15/876,258, filed on Jan. 22, 2018, now Pat. No. 10,523,888.

(30) Foreign Application Priority Data

Feb. 3, 2017 (JP) .............................. JP2017-019090
Feb. 3, 2017 (JP) .............................. JP2017-019091
Sep. 22, 2017 (JP) .............................. JP2017-182534

(51) Int. Cl.
*H04N 5/378* (2011.01)
*H01L 27/146* (2006.01)
(Continued)

(52) U.S. Cl.
CPC ........... *H04N 5/378* (2013.01); *H01L 27/146* (2013.01); *H01L 27/14612* (2013.01);
(Continued)

(58) Field of Classification Search
CPC .... H04N 5/378; H04N 5/35563; H04N 5/369; H04N 5/3698; H04N 5/2251;
(Continued)

(56) References Cited

U.S. PATENT DOCUMENTS

| 10,141,354 B2 | 11/2018 | Takase et al. |
| 2007/0013798 A1 | 1/2007 | Ahn et al. |

(Continued)

FOREIGN PATENT DOCUMENTS

| JP | 2008-227092 A | 9/2008 |
| JP | 2011-119694 A | 6/2011 |

(Continued)

OTHER PUBLICATIONS

The Extended European Search Report dated Mar. 19, 2020 for the related European Patent Application No. 18154455.2.
(Continued)

*Primary Examiner* — Shahbaz Nazrul
(74) *Attorney, Agent, or Firm* — McDermott Will & Emery LLP

(57) ABSTRACT

An imaging device including an imaging cell including a photoelectric converter including a first electrode, a second electrode, and a photoelectric conversion layer between the first electrode and the second electrode, and a first transistor one of a source and a drain of which is coupled to the first electrode; and voltage supply circuitry coupled to the other of the source and the drain of the first transistor, the voltage supply circuitry being configured to supply a first voltage in a first period and a second voltage different from the first voltage in a second period different from the first period.

11 Claims, 34 Drawing Sheets

(51) Int. Cl.
  *H04N 5/355* (2011.01)
  *H01L 27/30* (2006.01)
  *H01L 51/00* (2006.01)

(52) U.S. Cl.
  CPC .. *H01L 27/14665* (2013.01); *H01L 27/14667* (2013.01); *H01L 27/307* (2013.01); *H04N 5/35563* (2013.01); *H01L 51/0046* (2013.01); *H01L 51/0061* (2013.01); *H01L 51/0068* (2013.01); *H01L 51/0071* (2013.01); *H01L 51/0072* (2013.01); *H01L 51/0073* (2013.01); *H01L 51/0078* (2013.01)

(58) Field of Classification Search
  CPC ............ H04N 5/2253; H01L 27/14665; H01L 27/146; H01L 27/14667; H01L 27/307; H01L 27/14612; H01L 51/0046; H01L 51/0061; H01L 51/0068; H01L 51/0071; H01L 51/0072; H01L 51/0073; H01L 51/0078
  See application file for complete search history.

(56) References Cited

U.S. PATENT DOCUMENTS

| | | |
|---|---|---|
| 2011/0216212 A1 | 9/2011 | Watanabe et al. |
| 2012/0200752 A1 | 8/2012 | Matsunaga |
| 2012/0204960 A1 | 8/2012 | Kato et al. |
| 2013/0277536 A1 | 10/2013 | Mizuno et al. |
| 2013/0341491 A1* | 12/2013 | Hirose .............. H01L 27/14638 250/208.1 |
| 2015/0115339 A1 | 4/2015 | Tamaki et al. |
| 2015/0207087 A1 | 7/2015 | Udaka et al. |
| 2016/0119562 A1 | 4/2016 | Takase et al. |
| 2016/0190188 A1 | 6/2016 | Murakami et al. |
| 2016/0191825 A1* | 6/2016 | Sato .................. H01L 27/14665 348/250 |
| 2016/0360131 A1* | 12/2016 | Shimasaki ............. H04N 5/378 |
| 2017/0272662 A1 | 9/2017 | Tamaki et al. |
| 2017/0328776 A1 | 11/2017 | Shimasaki et al. |
| 2018/0219047 A1* | 8/2018 | Tokuhara .............. G01J 1/0407 |
| 2018/0227526 A1* | 8/2018 | Tokuhara .......... H01L 27/14612 |
| 2018/0227551 A1 | 8/2018 | Shishido |
| 2018/0315798 A1* | 11/2018 | Shimasaki ................ G01J 1/44 |
| 2018/0331140 A1 | 11/2018 | Sato |

FOREIGN PATENT DOCUMENTS

| | | |
|---|---|---|
| JP | 2011-187544 A | 9/2011 |
| JP | 2014/002367 A | 1/2014 |
| JP | 2015-099338 A | 5/2015 |
| JP | 2016-021488 A | 2/2016 |
| JP | 2016-076921 A | 5/2016 |
| JP | 2016-086407 A | 5/2016 |
| JP | 2016-127265 A | 7/2016 |
| JP | 2016-219849 A | 12/2016 |
| WO | 2011/058684 A1 | 5/2011 |
| WO | 2012/169127 A1 | 12/2012 |
| WO | 2014/024581 A1 | 2/2014 |

OTHER PUBLICATIONS

The Extended European Search Report dated Jul. 3, 2018 for the related European Patent Application No. 18154473.5.
The Extended European Search Report dated Jun. 11, 2018 for the related European Patent Application No. 18154455.2.
Non-final Office Action issued in corresponding U.S. Appl. No. 15/876,258, dated Apr. 4, 2019.
Notice of Allowance issued in corresponding U.S. Appl. No. 15/876,258, dated Aug. 13, 2019.

* cited by examiner

FIG. 26
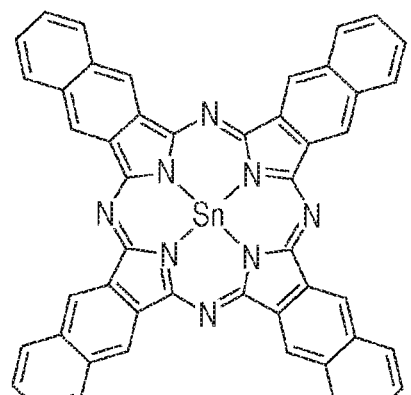
SnNc
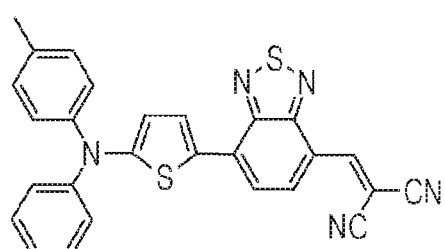
DTDCTB
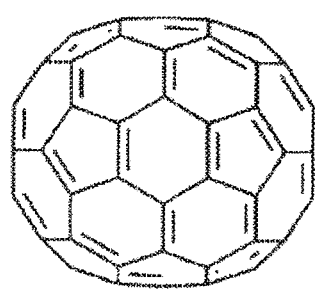
C70

CZBDF

IMAGING DEVICE

RELATED APPLICATION

This application is a Continuation of U.S. patent application Ser. No. 15/876,258, filed on Jan. 22, 2018, which in turn claims the benefit of Japanese Application No. 2017-182534, filed on Sep. 22, 2017, Japanese Application No. 2017-019091, filed on Feb. 3, 2017, and Japanese Application No. 2017-019090, filed on Feb. 3, 2017, the disclosures of which are incorporated in their entirety by reference herein.

BACKGROUND

1. Technical Field

The present disclosure relates to an imaging device.

2. Description of the Related Art

Image sensors utilizing photoelectric conversion are widely used. As a replacement for pinned photodiodes, a structure in which a photoelectric conversion device is arranged above a semiconductor substrate has been proposed (see International Publication No. WO 2014/002367). The solid-state imaging device described in International Publication No. WO 2014/002367 has a photoelectric conversion device including a lower electrode, an upper transparent electrode, and a photoelectric conversion film interposed between the lower electrode and the upper transparent electrode. Signal charges, which are generated in the photoelectric conversion device and collected by the lower electrode, are accumulated in a charge accumulation node. The signal charges accumulated in the charge accumulation node are read to a vertical signal line in the form of pixel signal. The contents of the disclosure of International Publication No. WO 2014/002367 are incorporated herein by reference in its entirety.

SUMMARY

One non-limiting and exemplary embodiment provides an imaging device that reduces complexity of circuits in an imaging cell and has improved flexibility at the time of photographing.

In one general aspect, the techniques disclosed herein feature the following: an imaging device including: an imaging cell including a photoelectric converter including a first electrode, a second electrode, and a photoelectric conversion layer between the first electrode and the second electrode, and a first transistor one of a source and a drain of which is coupled to the first electrode; and voltage supply circuitry coupled to the other of the source and the drain of the first transistor, the voltage supply circuitry being configured to supply a first voltage in a first period and a second voltage different from the first voltage in a second period different from the first period.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 26 is a diagram illustrating an instance of a material applicable to a photoelectric conversion layer;

DETAILED DESCRIPTION (Underlying Knowledge of Inventors)

Figure 1:
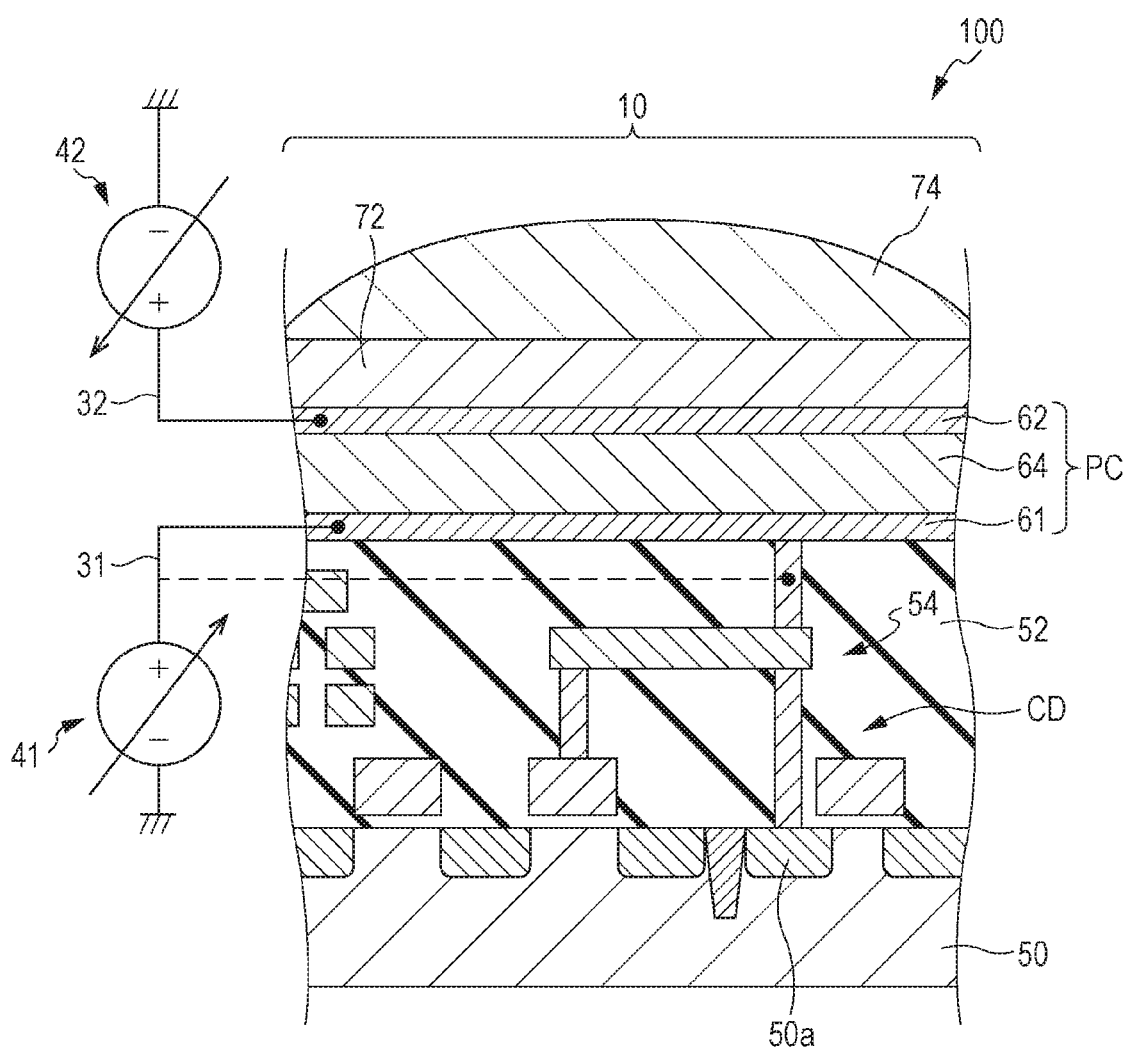
FIG. 1 is a diagram schematically illustrating an overview of an exemplary configuration of an imaging device according to Embodiments of the present disclosure.

The solid-state imaging device described in International Publication No. WO 2014/002367 applies a positive bias voltage to the upper transparent electrode at the time of operation. Thus, a positive hole, which is one of an electron and a positive hole generated in the photoelectric conversion film upon receiving incident light, is collected by the lower electrode and utilized as a signal charge. The inventors have focused attention on the phenomenon that the charges generated by photoelectric conversion are moved in the photoelectric conversion film by an electric field according to a difference of potential applied across the electrodes by which the photoelectric conversion film is interposed. The inventors have found out that efficiency (in other words, sensitivity) of collection of signal charges can be changed according to a bias voltage applied to the upper transparent electrode.

In the solid-state imaging device described in International Publication No. WO 2014/002367, for instance, as illustrated in FIG. 3A, the upper transparent electrode, to which the bias voltage is applied, is provided on the photoelectric conversion film in common with multiple unit pixel cells included in the pixel section of the solid-state imaging device. That is, the bias voltage applied to the upper transparent electrode of each unit pixel cell is in common. Therefore, when the bias voltage applied to the upper transparent electrode is changed, the sensitivity of all unit pixel cells is changed according to the bias voltage, and it is not possible to selectively change the sensitivity of part of the unit pixel cells. For instance, it is not possible to selectively make the sensitivity of the unit pixel cells located in one row of the array of unit pixel cells higher or lower than the sensitivity of the unit pixel cells located in another row.

In the field of imaging devices, for photographing a scene with a large dynamic range, there is demand for selective change of the sensitivity of part of the unit pixel cells. For instance, when a scene including a subject which emits intense light is simply photographed, blown out highlights occur in a photographed image. Although blown out highlights can be suppressed by reducing the sensitivity of the unit pixel cells, overall brightness of the image is decreased, and blocked up shadows may occur in the image. A technique called "high dynamic range imaging" is known, in which a scene is photographed with varied sensitivities, and multiple images obtained with different sensitivities are rendered, thereby forming an image without blown out highlights and blocked up shadows. However, in such a technique in related art, the timing of photographing multiple images obtained with different sensitivities is off. Therefore, the technique may be unsuitable for photographing a scene including an object moving at a high speed, for instance.

It is useful when multiple image signals according to different sensitivities are obtained by single photographing. In particular, it is useful when the sensitivity of part of the cells can be selectively changed. For instance, it is useful when the sensitivity of imaging cells can be changed row by row in multiple imaging cells, or imaging cell by imaging cell. The inventors have discussed in consideration of the aforementioned points, and have made the disclosure of the present application.

Summary of Embodiments

Before Embodiments of the present disclosure is described, a summary of the Embodiments of the present disclosure will be described. The summary in an aspect of the present disclosure is as follows.

[Item 1]

An imaging device including:
an imaging cell including
a photoelectric converter including a first electrode, a second electrode, and a photoelectric conversion layer between the first electrode and the second electrode, the photoelectric converter generating signal charge by photoelectric conversion, and
a charge detection circuit connected to the first electrode, the charge detection circuit detecting the signal charge;
a signal line electrically coupled to the first electrode; and
a voltage supply circuit selectively supplying a first voltage and a second voltage different from the first voltage to the signal line.

[Item 2]

The imaging device according to Item 1, wherein the charge detection circuit includes a first transistor having a source and a drain, one of the source and the drain of the first transistor being connected to the first electrode, the other of the source and the drain of the first transistor being connected to the signal line.

[Item 3]

The imaging device according to Item 2, further including a selection circuit connected to a first control line and a second control line, the selection circuit switching between ON and OFF of the first transistor based on a voltage of the first control line and a voltage of the second control line.

[Item 4]

The imaging device according to Item 1, further including an inverting amplifier having an inverting input terminal, a non-inverting input terminal, and an output terminal, wherein
the charge detection circuit includes:
a first transistor having a source and a drain, one of the source and the drain of the first transistor being connected to the first electrode, the other of the source and the drain of the first transistor being electrically connected to the output terminal; and
a second transistor having a source, a drain and a gate, the gate of the second transistor being connected to the first electrode, one of the source and the drain of the second transistor being electrically connected to the inverting input terminal, and
the signal line is connected to the non-inverting input terminal.

[Item 5]

The imaging device according to Item 1, wherein the charge detection circuit includes a first capacitor having one terminal connected to the first electrode, and the other terminal connected to the signal line.

[Item 6]

The imaging device according to Item 5, wherein the voltage supply circuit supplies the first voltage to the signal line in a reset period in a first frame period, and supplies the second voltage to the signal line in a charge accumulation period in the first frame period.

[Item 7]

The imaging device according to any one of Items 2 to 4, wherein the voltage supply circuit supplies the first voltage to the signal line in a reset period in a first frame period, and supplies the second voltage to the signal line in a reset period in a second frame period different from the first frame period.

[Item 8]

The imaging device according to Item 5, wherein the voltage supply circuit supplies the first voltage to the signal line in a charge accumulation period in a first frame period, and supplies the second voltage to the signal line in a charge accumulation period in a second frame period different from the first frame period.

[Item 9]

The imaging device according to any one of Items 1 to 8, wherein
the photoelectric conversion layer includes a first layer and a second layer stacked one on the other,
the first layer includes a first material,
the second layer includes a second material, and
impedance of the first layer is greater than impedance of the second layer.

[Item 10]

The imaging device according to any one of Items 1 to 8, wherein
the photoelectric conversion layer includes a first layer and a second layer stacked one on the other,
the first layer includes a first material,
the second layer includes a second material, and
an ionization potential of the first material is greater than an ionization potential of the second material by 0.2 eV or more.

[Item 11]

The imaging device according to Item 9 or 10, wherein the first material and the second material are both electron-donating molecules.

[Item 12]

An imaging device having one or more imaging cells,
the imaging device including:
a semiconductor substrate; and
a first voltage supply circuit to which a first signal line is connected, wherein
each of the one or more imaging cells has
a photoelectric converter supported by the semiconductor substrate, the photoelectric converter including a first electrode, a second electrode disposed more distantly from the semiconductor substrate than the first electrode, and a photoelectric conversion structure inserted between the first electrode and the second electrode, and
a charge detector including a first transistor connected to the first electrode,
the first electrode of the photoelectric converter is electrically coupled to the first signal line, and
the first voltage supply circuit applies at least a first voltage and a second voltage different from the first voltage in absolute value to the first signal line at different timings.

With the configuration of Item 12, the voltage applied to the first signal line can be switched, and the sensitivity of the imaging cells may be changed by switching the voltage applied to the first signal line.

[Item 13]

The imaging device according to Item 12, wherein the first electrode is connected to the gate of the first transistor of the charge detector.

With the configuration of Item 13, non-destructive read of a signal charge is possible.

[Item 14]

The imaging device according to Item 13, wherein the charge detector includes a reset circuit having a second transistor having one of the source and the drain connected to the first electrode.

[Item 15]

The imaging device according to Item 14, wherein the other of the source and the drain of the second transistor is connected to the first signal line.

With the configuration of Item 15, it is possible to reset the potential of the charge storage node to a predetermined voltage level by using the voltage applied to the first signal line from the first voltage supply circuit.

[Item 16]

The imaging device according to Item 15, wherein the one or more imaging cells include multiple imaging cells, the multiple imaging cells are disposed two-dimensionally in a first direction and a second direction different from the first direction, the imaging devices further include multiple second signal lines extending in the first direction, and multiple third signal lines extending in the second direction, each imaging cell has a selection circuit that switches between ON and OFF of the second transistor according to a voltage level of corresponding one of multiple second signal lines and a voltage level of corresponding one of multiple third signal lines.

With the configuration of Item 16, it is possible to select an imaging cell at any position in the pixel array, and change the potential of the first electrode of the selected imaging cell.

[Item 17]

The imaging device according to Item 14, wherein the reset circuit includes a feedback circuit that causes negative feedback of an electrical signal generated in the photoelectric converter, the feedback circuit includes an inverting amplifier having an inverting input terminal electrically connected to one of the source and the drain of the first transistor and an output terminal electrically connected to the other of the source and the drain of the second transistor, and a non-inverting input terminal of the inverting amplifier is connected to the first signal line.

With the configuration of Item 17, it is possible to reset the potential of the charge storage node to a predetermined voltage level by using the voltage applied to the first signal line from the first voltage supply circuit, and the effect of random noise can be cancelled utilizing the negative feedback.

[Item 18]

The imaging device according to Item 14, wherein the charge detector includes a capacitive circuit connected between the first electrode and the first signal line, the capacitive circuit has a first capacitor, and the first electrode of the photoelectric converter is electrically coupled to the first signal line via the first capacitor.

With the configuration of Item 18, it is possible to change the potential of the pixel electrode by the change in the voltage applied to the first signal line without affecting the quantity of charge accumulated in the charge accumulation node. Therefore, for instance, as a voltage applied to the first signal line in the charge accumulation period, a voltage different from the voltage applied to the first signal line can be used in the reset period.

[Item 19]

The imaging device according to Item 18, wherein the first voltage supply circuit applies the first voltage to the first signal line in the charge accumulation period, and applies the second voltage to the first signal line in a period other than the charge accumulation period out of the frame period.

With the configuration of Item 19, it is possible to temporarily increase or decrease the potential of the first electrode in the charge accumulation period. The potential difference between the first electrode and the second electrode is reduced or enlarged at the start of the charge accumulation period, and thus the sensitivity of the imaging cells is changed by switching the voltage applied to the first signal line.

[Item 20]

The imaging device according to Item 18 or 19, wherein the one or more imaging cells include a first imaging cell and a second imaging cell.

[Item 21]

The imaging device according to Item 20, wherein the reset circuit includes a feedback circuit that causes negative feedback of an electrical signal generated in the photoelectric converter, the feedback circuit includes an inverting amplifier having an inverting input terminal electrically connected to one of the source and the drain of the first transistor, and an output terminal electrically connected to the other of the source and the drain of the second transistor, and the first capacitor of the first imaging cell is connected between the first signal line and the first electrode of the first imaging cell.

With the configuration of Item 21, the change in the potential difference between the first electrode and the second electrode can be made different between the first imaging cell and the second imaging cell while the voltage applied to the first signal line is used in common.

[Item 22]

The imaging device according to Item 21, wherein the first capacitor of the second imaging cell is connected between the first signal line and the first electrode of the second imaging cell.

With the configuration of Item 22, the change in the potential difference between the first electrode and the second electrode can be made different between the first imaging cell and the second imaging cell while the voltage applied to the first signal line is used in common.

[Item 23]

The imaging device according to Item 22, wherein the feedback circuit of the first imaging cell further includes a third transistor connected between the other of the source and the drain of the second transistor and the output terminal of the inverting amplifier, the capacitive circuit of the first imaging cell further includes a second capacitor having one of the electrodes connected to the first electrode of the first imaging cell, and the other of the electrodes connected to the other of the source and the drain of the second transistor, and the capacitive value of the second capacitor is smaller than the capacitive value of the first capacitor of the first imaging cell.

With the configuration of Item 23, it is possible to reduce the effect the change in the voltage applied to the first signal line on the potential difference between the first electrode and the second electrode. In addition, random noise can be reduced more effectively.

[Item 24]

The imaging device according to Item 22 or 23, wherein the capacitive value of the first capacitor is different between the first imaging cell and the second imaging cell.

With the configuration of Item 24, the change in the potential difference between the first electrode and the second electrode can be made different between the first imaging cell and the second imaging cell while the voltage applied to the first signal line is used in common.

[Item 25]

The imaging device according to any one of Items 12 to 24, further including a second voltage supply circuit connected to the second electrode, wherein the second voltage supply circuit switches the voltage applied to the second electrode between a third voltage and a fourth voltage different from the third voltage in absolute value at a timing between two different charge accumulation periods.

With the configuration of Item 25, the change in the potential difference between the first electrode and the second electrode can be made different between two charge accumulation periods included in different frames while the voltage applied to the first signal line is used in common.

[Item 26]

The imaging device according to any one of Items 20 to 25, wherein the second electrode of the first imaging cell and the second electrode of the second imaging cell are electrically separated, the imaging device further includes a second voltage supply circuit connected to the second electrode of the first imaging cell and the second electrode of the second imaging cell, and the second voltage supply circuit independently applies different voltages to the second electrode of the first imaging cell and the second electrode of the second imaging cell, respectively.

With the configuration of Item 26, the bias voltage applied to the photoelectric conversion structure in the charge accumulation period can be made different between the first and second imaging cells.

[Item 27]

The imaging device according to Item 15, wherein the one or more imaging cells include the first imaging cell and the second imaging cell, and the first voltage supply circuit supplies the first voltage to the second transistor of the first imaging cell by applying the first voltage to the first signal line at a first timing, and supplies the second voltage to the second transistor of the second imaging cell by applying the second voltage to the first signal line at a second timing.

With the configuration of Item 27, the bias voltage applied to the photoelectric conversion structure can be made different between the first and second imaging cells.

[Item 28]

The imaging device according to Item 17, wherein the one or more imaging cells include the first imaging cell and the second imaging cell, and the first voltage supply circuit supplies the first voltage to the inverting amplifier of the first imaging cell by applying the first voltage to the first signal line at a first timing, and supplies the second voltage to the inverting amplifier of the second imaging cell by applying the second voltage to the first signal line at a second timing.

With the configuration of Item 28, the bias voltage applied to the photoelectric conversion structure can be made different between the first and second imaging cells.

[Item 29]

An imaging device having one or more imaging cells, the imaging device including:

a semiconductor substrate; and a voltage supply circuit, in which each of the one or more imaging cells includes a first imaging cell and a second imaging cell each having:

a photoelectric converter supported by the semiconductor substrate, the photoelectric converter including a first electrode, a second electrode disposed more distantly from the semiconductor substrate than the first electrode, and a photoelectric conversion structure inserted between the first electrode and the second electrode, and a charge detector including a first transistor connected to the first electrode, the second electrode of the first imaging cell and the second electrode of the second imaging cell are electrically separated, the voltage supply circuit is connected to the second electrode of the first imaging cell and the second electrode of the second imaging cell, and the voltage supply circuit independently applies different voltages to the second electrode of the first imaging cell and the second electrode of the second imaging cell, respectively.

With the configuration of Item 29, the bias voltage applied to the photoelectric conversion structure can be made different between the first and second imaging cells.

[Item 30]

The imaging device according to any one of Items 20 to 29, wherein a potential difference applied across the first electrode and the second electrode of the first imaging cell at the time of start of a charge accumulation period is different from a potential difference applied across the first electrode and the second electrode of the second imaging cell at the time of start of the charge accumulation period.

[Item 31]

The imaging device according to any one of Items 12 to 30, wherein the photoelectric conversion structure includes a multilayer structure having a first photoelectric conversion layer and a second photoelectric conversion layer, the first photoelectric conversion layer and the second photoelectric conversion layer include a first material and a second material, respectively, and impedance of the first photoelectric conversion layer is greater than impedance of the second photoelectric conversion layer.

With the configuration of Item 31, the spectral sensitivity characteristic of the photoelectric conversion structure can be changed by changing the potential difference applied across the first electrode and the second electrode.

[Item 32]

The imaging device according to any one of Items 12 to 30, wherein the photoelectric conversion structure includes a multilayer structure having a first photoelectric conversion layer and a second photoelectric conversion layer, the first photoelectric conversion layer and the second photoelectric conversion layer include a first material and a second material, respectively, and the ionization potential of the first material is greater than the ionization potential of the second material by 0.2 eV or more.

With the configuration of Item 32, the spectral sensitivity characteristic of the photoelectric conversion structure can be changed by changing the potential difference applied across the first electrode and the second electrode.

[Item 33]

The imaging device according to Item 31 or 32, wherein the first material and the second material are electron-donating molecules.

[Item 34]

An imaging device having multiple imaging cells each including a first imaging cell and a second imaging cell, in which the first imaging cell has a first photoelectric converter and a first charge detector, the second imaging cell has a second photoelectric converter and a second charge detector, the first photoelectric converter includes a first electrode, a second electrode, and a first photoelectric conversion structure located between the first electrode and the second electrode, the first charge detector includes a first transistor connected to the first electrode, and a second transistor having one of a source and a drain connected to the first electrode, the second photoelectric converter includes a third electrode, a fourth electrode, and a second photoelectric conversion structure located between the third electrode and the fourth electrode, the second charge detector includes a third transistor connected to the third electrode, and a fourth transistor having one of a source and a drain connected to the third electrode, the imaging device further includes:

a first signal line that is connected to the other of the source and the drain of the second transistor, and supplies a first voltage to the other of the source and the drain of the second transistor; and a second signal line that is connected to the other of the source and the drain of the fourth transistor, and supplies a second voltage different from the first voltage in absolute value to the other of the source and the drain of the fourth transistor.

With the configuration of Item 34, the bias voltage applied to the photoelectric conversion structure can be made different between the first and second imaging cells.

[Item 35]

An imaging device having multiple imaging cells each including a first imaging cell and a second imaging cell, in which the first imaging cell has a first photoelectric converter and a first charge detector, the second imaging cell has a second photoelectric converter and a second charge detector, the first photoelectric converter includes a first electrode, a second electrode, and a first photoelectric conversion structure located between the first electrode and the second electrode, the first charge detector includes a first transistor connected to the first electrode, and a first feedback circuit that causes negative feedback of an electrical signal generated in the first photoelectric converter, the second photoelectric converter includes a third electrode, a fourth electrode, and a second photoelectric conversion structure located between the third electrode and the fourth electrode, the second charge detector includes a second transistor connected to the third electrode, and a second feedback circuit that causes negative feedback of an electrical signal generated in the second photoelectric converter, the first feedback circuit includes a first inverting amplifier having an inverting input terminal electrically connected to one of the source and the drain of the first transistor, the second feedback circuit includes a second inverting amplifier having an inverting input terminal electrically connected to one of the source and the drain of the second transistor, the imaging device further includes:

a first signal line that is connected to a non-inverting input terminal of the first inverting amplifier, and supplies a first voltage to the non-inverting input terminal of the first inverting amplifier; and a second signal line that is connected to a non-inverting input terminal of the second inverting amplifier, and supplies a second voltage to the non-inverting input terminal of the second inverting amplifier.

With the configuration of Item 35, the bias voltage applied to the photoelectric conversion structure can be made different between the first and second imaging cells.

[Item 36]

The imaging device according to Item 34 or 35, wherein a potential difference applied across the first electrode and the second electrode at the time of start of a charge accumulation period is different from a potential difference applied across the third electrode and the fourth electrode at the time of start of the charge accumulation period.

[Item 37]

The imaging device according to any one of Items 34 to 36, wherein each of the first photoelectric conversion structure and the second photoelectric conversion structure includes at least part of a multilayer structure having a first photoelectric conversion layer and a second photoelectric conversion layer, the first photoelectric conversion layer and the second photoelectric conversion layer include a first material and a second material, respectively, and impedance of the first photoelectric conversion layer is greater than impedance of the second photoelectric conversion layer.

With the configuration of Item 37, the spectral sensitivity characteristic of the photoelectric conversion structure can be changed by changing the potential difference applied across the first electrode and the second electrode.

[Item 38]

The imaging device according to any one of Items 34 to 36, wherein each of the first photoelectric conversion structure and the second photoelectric conversion structure includes at least part of a multilayer structure having a first photoelectric conversion layer and a second photoelectric conversion layer, the first photoelectric conversion layer and the second photoelectric conversion layer include a first material and a second material, respectively, and the ionization potential of the first material is greater than the ionization potential of the second material by 0.2 eV or more.

With the configuration of Item 38, the spectral sensitivity characteristic of the photoelectric conversion structure can be changed by changing the potential difference applied across the first electrode and the second electrode.

[Item 39]

The imaging device according to Item 37 or 38, wherein the first material and the second material are electron-donating molecules.

As described later with reference to the drawings, the imaging device according to a typical Embodiment of the present disclosure has an array of multiple imaging cells. Each of the imaging cells includes a photoelectric converter supported by a semiconductor substrate, and a charge detector connected to the photoelectric converter. The photoelectric converter has a pixel electrode, an opposite electrode, and a photoelectric conversion structure. The charges generated by the photoelectric conversion are temporarily held in a charge accumulation node. The charge detector reads a charge held in the charge accumulation node. The imaging device according to an Embodiment further includes a voltage supply circuit. The voltage supply circuit is connected to a signal line electrically coupled to pixel electrodes, and supplies at least two voltages different from each other in absolute value to the signal line.

The voltage supply circuit switches, for instance, the voltage applied to the signal line between the first and second voltages that are different from each other in absolute value. It is possible to change the potential of the charge accumulation node by changing the potential of the signal line. For instance, it is possible to make difference between the potential of the charge accumulation node immediately before accumulation of a signal charge in an imaging cell, and the potential of the charge accumulation node immediately before accumulation of a signal charge in another imaging cell by changing the potential of the signal line. For instance, the potential difference between the pixel electrode and the opposite electrode is reduced by increasing the potential of the signal line, and the sensitivity of a target imaging cell and the sensitivity of another imaging cell can be made different.

Hereinafter, Embodiments of the present disclosure will be described in detail. It is to be noted that each of the Embodiments described below represents a comprehensive or specific example. The numerical values, shapes, materials, components, arrangement and connection topologies of the components, steps, the order of the steps which are presented in the following Embodiments are examples, and not intended to limit the present disclosure. Various aspects described in the present description may be combined as long as no contradiction occurs. Any component which is included in the components of the following Embodiments and is not recited in the independent claim providing the most generic concept will be described as an arbitrary component. In the following description, components having substantially the same function are labeled with a common reference symbol, and a description may be omitted.

(Embodiment of Imaging Device)

FIG. 1 illustrates an overview of an exemplary configuration of an imaging device according to Embodiments of the present disclosure. An imaging device 100 illustrated in FIG. 1 includes multiple imaging cells 10. FIG. 1 representatively illustrates one of the multiple imaging cells 10. FIG. 1 schematically illustrates the arrangement of the units included in the imaging cell 10. The dimension in the units illustrated in FIG. 1 does not necessarily match the dimension in an actual device. This applies to other drawings of the present disclosure.

The imaging device 100 has a semiconductor substrate 50, and an interlayer insulation layer 52 that covers the semiconductor substrate 50. In the semiconductor substrate 50, multiple impurity regions including an impurity region 50a are formed. The imaging cell 10 has a photoelectric converter PC that is supported by the semiconductor substrate 50 and the interlayer insulation layer 52. The imaging cell 10 further has a charge detector CD that detects a signal charge generated in the photoelectric converter PC. The charge detector CD includes the impurity region 50a which is one of the impurity regions formed in the semiconductor substrate 50. As schematically illustrated in FIG. 1, the impurity region 50a is connected to the photoelectric converter PC by a connector 54 disposed in the interlayer insulation layer 52.

The photoelectric converter PC is located above the semiconductor substrate 50. The photoelectric converter PC includes a pixel electrode 61, an opposite electrode 62, and a photoelectric conversion structure 64 interposed therebetween. In the instance illustrated in FIG. 1, a color filter 72 and a microlens 74 are disposed above the opposite electrode 62. As a replacement for the color filter 72 or along with the color filter 72, an infrared transmissive filter, a protection layer, or the like is disposed between the microlens 74 and the opposite electrode 62.

The photoelectric conversion structure 64 in the photoelectric converter PC receives incident light, and generates positive and negative charges (typically positive hole-electron pair) by photoelectric conversion. When a potential difference is applied across the pixel electrode 61 and the opposite electrode 62, positive and negative charges are moved according to the electric field generated between the pixel electrode 61 and the opposite electrode 62. For instance, it is assumed that the potential of the opposite electrode 62 is higher than the potential of the pixel electrode 61, and the potential difference $\Phi$ between the opposite electrode 62 and pixel electrode 61 is high to some extent. In this situation, the positive charges out of the positive and negative charges generated in the photoelectric conversion structure 64 can be collected as signal charges by the pixel electrode 61. The collected signal charges are accumulated in the charge accumulation region which includes, in part, the connector 54 and the impurity region 50a. The charge detector CD has a function of detecting a signal charge accumulated in the charge accumulation region.

In Embodiments of the present disclosure, at the time of operation of the imaging device 100, the potential difference between the opposite electrode 62 and the pixel electrode 61 can be changed. As schematically illustrated in FIG. 1, in an aspect, it is possible to change the potential of the pixel electrode 61 by the change in the voltage applied to a first signal line 31 connected to a voltage supply circuit 41. In another aspect, the potential of the opposite electrode 62 can be changed by the change in the voltage applied to an accumulation control line 32 connected to a voltage supply circuit 42. Specifically, as described in detail later, in Embodiments of the present disclosure, the potential difference $\Phi$ between the pixel electrode 61 and the opposite electrode 62 is controlled by positively changing the potential of at least one of the pixel electrode 61 and the opposite electrode 62. For instance, the potential of the pixel electrode 61 and/or the opposite electrode 62 at the start of accumulation of signal charges is controlled to be different between the multiple imaging cells 10.

It is to be noted that in FIG. 1, it appears that the first signal line 31 is connected to the pixel electrode 61. However, it is not required that the first signal line 31 is physically connected to the pixel electrode 61 by a wire. It is sufficient that the voltage of the pixel electrode 61 can be positively changed by the change in the voltage of the first signal line 31. As describes later, electrical coupling may be formed between the first signal line 31 and pixel electrode 61 via a capacitor. Furthermore, a voltage change according to the change in the voltage of the first signal line 31 may be generated in the pixel electrode 61 via electrical coupling between the first signal line 31 and pixel electrode 61. It is sufficient that the voltage of the pixel electrode 61 can be changed. Thus, as illustrated by a dashed line in FIG. 1, the first signal line 31 may be electrically connected or coupled to not only the pixel electrode 61 but also the connector 54 and the impurity region 50a which have connection to the pixel electrode 61. A switching device such as a transistor may be interposed between the first signal line 31 and the pixel electrode 61.

Embodiment 1

Figure 2:
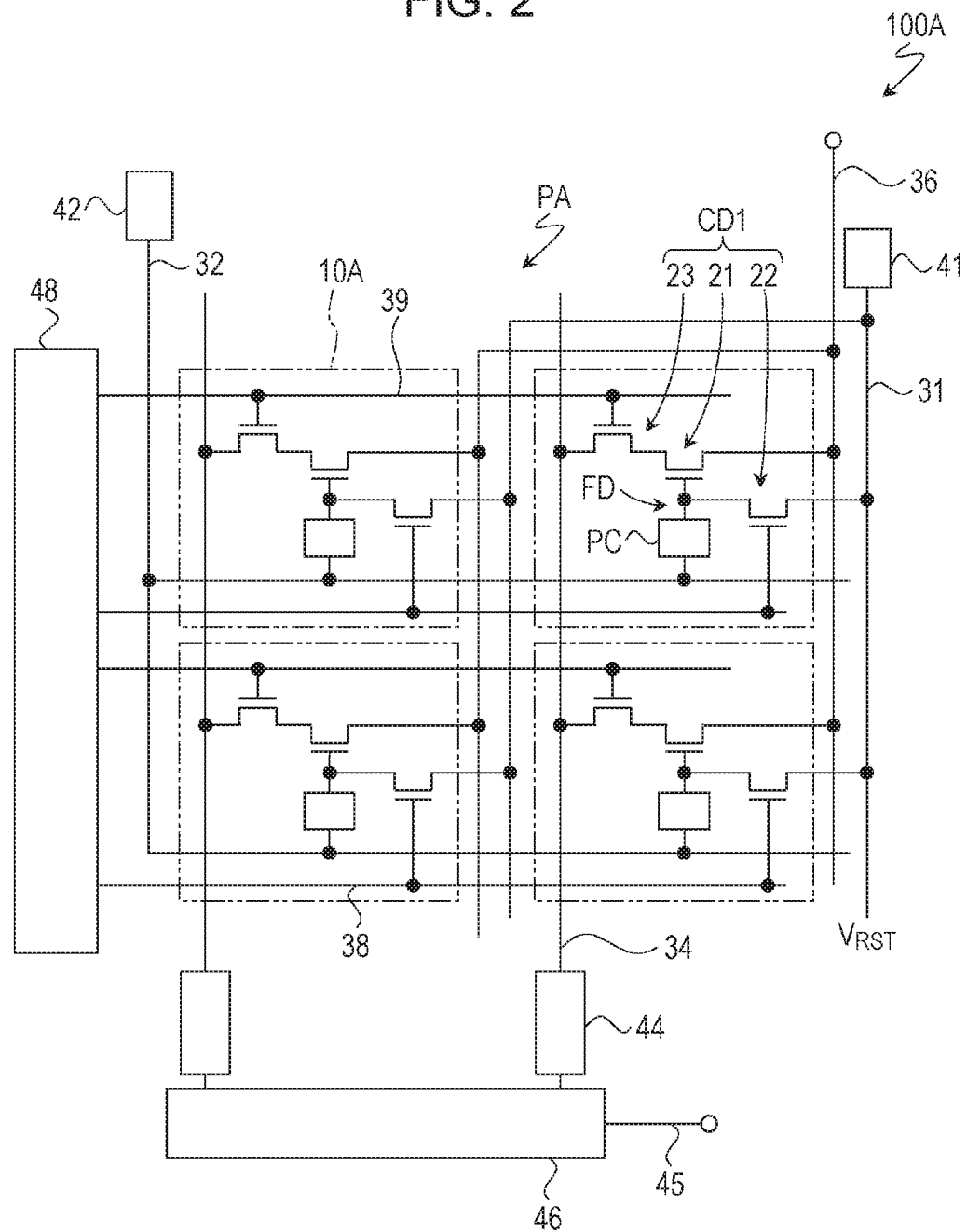
FIG. 2 is a diagram illustrating an exemplary circuit configuration of an imaging device according to Embodiment 1 of the present disclosure.

FIG. 2 illustrates an exemplary circuit configuration of an imaging device according to Embodiment 1 of the present disclosure. The imaging device 100A illustrated in FIG. 2 has a pixel array PA including multiple imaging cells 10A arranged two-dimensionally. FIG. 2 schematically illustrates an instance in which imaging cells 10A are arranged in a matrix. FIG. 2 illustrates four imaging cells 10A arranged in two rows by two columns, taken from the imaging cells 10A due to limitations of space. Needless to say, the number and arrangement of the imaging cells 10A are not limited to the instance illustrated in FIG. 2.

Each of the imaging cells 10A has a photoelectric converter PC and a charge detector CD1. The charge detector CD1 is connected to the pixel electrode 61 (see FIG. 1) of the photoelectric converter PC, and detects a signal charge collected by the pixel electrode 61. In this instance, the charge detector CD1 has a signal detection transistor 21, a reset transistor 22, and an address transistor 23. These transistors are typically field effect transistors (FET). Hereinafter an instance, in which N-channel MOS is used for the aforementioned transistors, will be described.

The imaging device 100A has a vertical signal line 34 provided for each column of the multiple imaging cells 10A, and a power source wire 36 for supplying power supply voltage AVDD to each imaging cell 10A. The drain of the signal detection transistor 21 is connected to the power source wire 36. The source of the signal detection transistor 21 is connected to a corresponding vertical signal line 34 via the address transistor 23.

As schematically illustrated in FIG. 2, the gate of the signal detection transistor 21 is connected to the photoelectric converter PC. As described later, the gate of the signal detection transistor 21 is connected to the pixel electrode 61 of the photoelectric converter PC. The signal charges generated by the photoelectric converter PC are temporarily accumulated in the charge accumulation region. The charge accumulation region includes a charge accumulation node (also called "floating diffusion node") FD between the gate of the signal detection transistor 21 and the photoelectric converter PC. The signal detection transistor 21 outputs a signal which is generated by the photoelectric converter PC with the power source wire 36 serving as a source follower power supply. In other words, a voltage according to the signal charges accumulated in the charge accumulation region is read to the vertical signal line 34. It is to be noted that the connection terminal of the signal detection transistor 21 connected to the photoelectric converter PC is not limited to the gate electrode. For instance, the connection terminal may be the source or the drain according to the circuit configuration of a charge detection circuit.

The vertical signal line 34 is connected to a column signal processing circuit (also called a "row signal accumulation circuit") 44. The column signal processing circuit 44 performs, for instance, noise suppression signal processing represented by Correlated Double Sampling, and analog-to-digital conversion (A/D conversion). The column signal processing circuit 44 is provided for each row of the imaging cells 10A in the pixel array PA. These column signal processing circuits 44 are connected to a horizontal signal read circuit (also called a "column scanning circuit") 46. The horizontal signal read circuit 46 successively reads signals from multiple column signal processing circuits 44 to a horizontal common signal line 45.

The imaging device 100A further has a first voltage supply circuit 41 and a second voltage supply circuit 42. The first voltage supply circuit 41 is connected to the first signal line 31. The first signal line 31 is electrically coupled to the pixel electrode 61 of the imaging cell 10A. In the configuration illustrated in FIG. 2, the first signal line 31 is connected to the source of the reset transistor 22. The drain of the reset transistor 22 is connected to the charge accumulation node FD. In other words, in this example, the voltage supply circuit 41 supplies a reset voltage $V_{RST}$ for resetting the potential of the charge accumulation node FD to each imaging cell 10A. In the present description, "electrical coupling" refers to a relationship in which positive variation in one of voltages induces a variation in the other voltage. The "electrical coupling" is interpreted to broadly include not only direct connection by a wire, and connection via a device such as a transistor, but also connection in the form of no current path, such as connection via a capacitor.

The voltage supply circuit 41 is configured to switch between multiple voltages with different absolute values and to allow a voltage to be applied to the first signal line 31. In the instance illustrated in FIG. 2, the first signal line 31 is connected to the reset transistor 22 of each imaging cell 10A. Therefore, in this example, the voltage supply circuit 41 selectively supplies one of multiple voltages with different absolute values to each imaging cell 10A as the reset voltage $V_{RST}$. For instance, at the time of operation of the imaging device 100A, the voltage supply circuit 41 applies the first reset voltage to the first signal line 31 in a certain period, and applies the second reset voltage different from the first reset voltage in absolute value to the first signal line 31 in another period. It is to be noted that the first signal line 31 is not limited to a single wire. The first signal line 31 may be a structure that is electrically coupled or connected to a target imaging cell, and may be a grid-shaped structure, for instance. This applies to other voltage lines, signal lines, control lines, and wires in the present disclosure. In the present description, the term "line" or "wire" used as the name of a member is only for the sake of convenience of description, and it is not intended to limit a specific structure, such as a voltage line, a signal line, a control line, and a wire, to a single linear conductor.

The voltage supply circuit 42 is connected to the accumulation control line 32 which is connected to the photoelectric converter PC of each imaging cell 10A. As described later, the accumulation control line 32 is connected to the opposite electrode 62 (see FIG. 1) of the photoelectric converter PC. Therefore, the voltage supply circuit 42 can supply a predetermined voltage $V_{OPP}$ to the opposite electrode 62 of the photoelectric converter PC of each imaging cell 10A via the accumulation control line 32. Similarly to the first signal line 31, the accumulation control line 32 may be a structure that is electrically coupled or connected to a target imaging cell. That is, the accumulation control line 32 is not limited to a single wire, and may be a grid-shaped structure, for instance. Hereinafter, for the sake of convenience of description, the voltage $V_{OPP}$ supplied by the voltage supply circuit 42 may be called "opposite electrode voltage $V_{OPP}$". In an aspect, the opposite electrode voltage $V_{OPP}$ is fixed to a certain voltage at the time of operation of the imaging device 100A.

The imaging device 100A has a reset signal line 38 and an address signal line 39 which are provided for each row of the imaging cell 10A. The reset signal line 38 and the address signal line 39 are connected to a vertical scanning circuit (called a "row scanning circuit") 48. As illustrated, the reset signal line 38 is connected to the gate of the reset transistor 22 of each of multiple imaging cells 10A belonging to the same row. The vertical scanning circuit 48 controls the potential of the reset signal line 38 and turns on the reset transistor 22, thereby making it possible to collectively reset the potentials of the charge accumulation nodes FD of the imaging cells 10A belonging to the same row. The address signal line 39 is connected to the gate of the address transistor 23 of each of the multiple imaging cells 10A belonging to the same row. The vertical scanning circuit 48 can select the multiple imaging cells 10A belonging to the same row on a row-by-row basis by controlling the potential of the address signal line 39. The multiple imaging cells 10A belonging to the same row are selected on a row-by-row basis, thus the outputs of the signal detection transistors 21 of the imaging cells 10A belonging to the same row can be collectively read to a corresponding vertical signal line 34.

Figure 3:
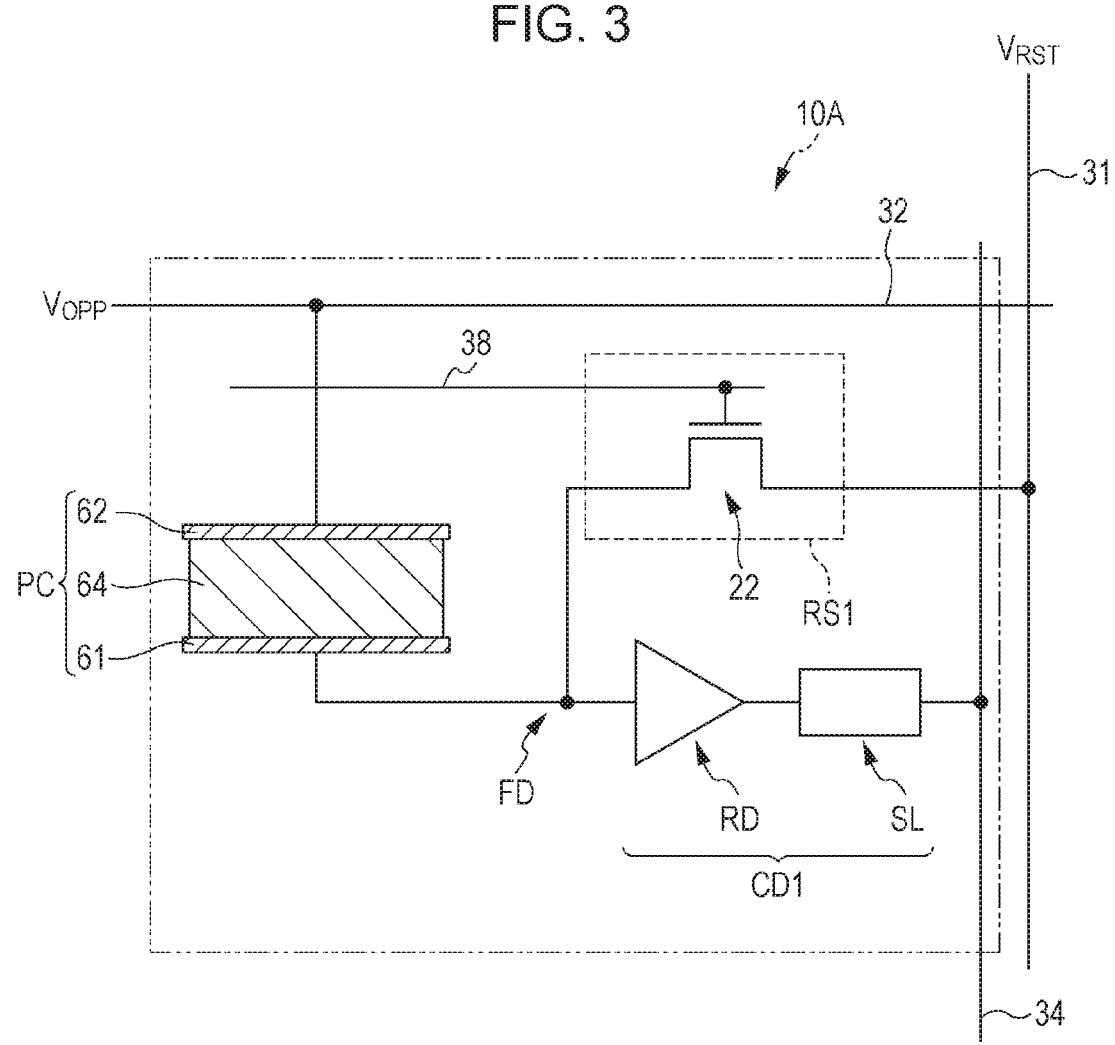
FIG. 3 is a diagram illustrating an instance of electrical coupling between a first signal line and a pixel electrode.

FIG. 3 illustrates an instance of electrical coupling between the first signal line 31 and the pixel electrode 61. FIG. 3 schematically illustrates the circuit configuration of one of the imaging cells 10A in the pixel array PA.

In the configuration illustrated in FIG. 3, the charge detector CD1 of the imaging cell 10A includes a reset circuit RS1, a read circuit RD, and a row selection circuit SL. The reset circuit RS1 includes a reset transistor 22 in which one of the source and the drain is connected to the pixel electrode 61. The reset circuit RS1 is not limited to a circuit including the reset transistor 22. The reset circuit RS1 may be configured to allow the potential of the charge accumulation node FD to be reset to a desired potential by using a voltage supplied from the outside, such as a power supply voltage. The read circuit RD is a source follower that includes, for instance, the signal detection transistor 21 and the power source wire 36. The row selection circuit SL is, for instance, the address transistor 23.

In this instance, the other of the source and the drain of the reset transistor 22 is connected to the first signal line 31, thus the pixel electrode 61 and the first signal line 31 are electrically coupled to each other via the reset transistor 22. With such a circuit configuration, by turning on the reset transistor 22, the potential of the charge accumulation node FD can be reset to a desired voltage level by using the reset voltage $V_{RST}$ applied to the first signal line 31 by the voltage supply circuit 41.

(Instance of Operation of Imaging Device)

Figure 4:
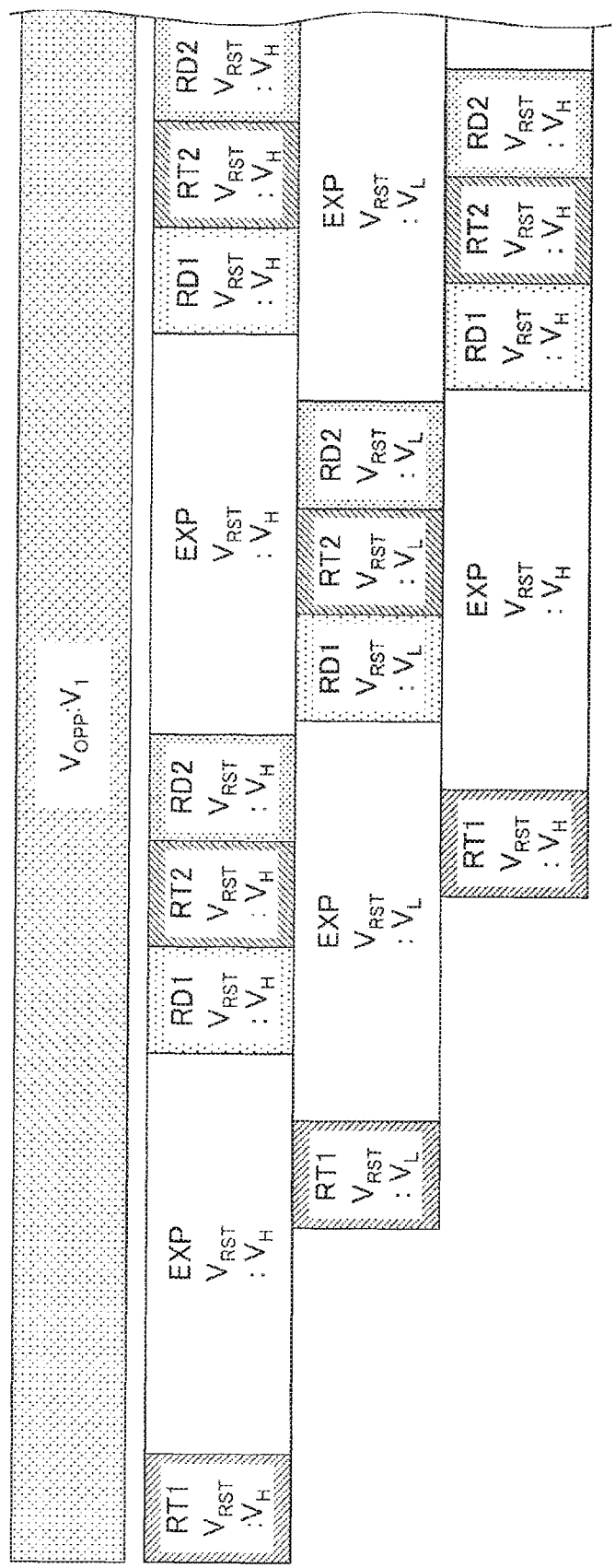
FIG. 4 is a diagram for explaining an instance of the operation when a rolling shutter is applied to an imaging device illustrated in FIG. 2.

FIG. 4 illustrates an instance of the operation when a rolling shutter is applied to the imaging device 100A illustrated in FIG. 2. In FIG. 4, rectangular arrangements in the second, third, and fourth stages schematically represent the operation of the imaging cells 10A belonging to the first, second, and third rows of the pixel array PA, respectively. It is to be noted that the actual number of rows included in the pixel array PA may reach several hundred to several thousand rows. Here, just three rows are taken and illustrated due to limitations of space.

As described above, the voltage supply circuit 41 is configured to allow one of at least two voltages with different absolute values to be selectively applied to the first signal line 31. Here, the voltage supply circuit 41 is configured to allow the reset voltage $V_{RST}$ to be applied to the first signal line 31 by switching between a first voltage $V_H$ and a second relatively low voltage $V_L$. For instance, the power supply voltage, or a voltage decreased (or increased) from the power supply voltage may be used as the first voltage $V_H$. This applies to the second voltage $V_L$. In this case, the voltage supply circuit 41 may be part of the voltage supply circuit (not illustrated in FIG. 2) that supplies the power supply voltage to each imaging cell 10A. Hereinafter, the voltage level corresponding to the voltage $V_H$ is represented by high-level for convenience, and the voltage level corresponding to the voltage $V_L$ is represented by low-level for convenience. It is to be noted that the terms "high-level" and "low-level" only represent the height of potential relatively, and it is not intended to indicate that high-level is equivalent to the power supply voltage.

In this instance, it is assumed that the opposite electrode voltage $V_{OPP}$ applied from the voltage supply circuit 42 to the accumulation control line 32 is fixed to a certain voltage $V_1$. In FIG. 4, the shaded rectangle in the uppermost stage indicates that the opposite electrode voltage $V_{OPP}$ at the time of operation of the imaging device 100A is fixed to the voltage $V_1$. However, in Embodiments of the present disclosure, it is not required that the opposite electrode voltage $V_{OPP}$ be a fixed value, and as described later, it is naturally possible to perform control to cause the opposite electrode voltage $V_{OPP}$ to be changed.

First, attention is focused on the rectangular arrangement in the second stage in FIG. 4. When an image signal is obtained, first, the potential of the charge accumulation node FD is reset. In other words, the charge in the charge accumulation node FD is discharged. Specifically, in the configuration exemplified to FIG. 2, the reset transistor 22 is turned on. Here, at this point, the voltage supply circuit 41 applies the high-level voltage $V_H$ to the first signal line 31 as the reset voltage $V_{RST}$. Therefore, the voltage $V_H$ is applied to the charge accumulation node FD, and the potential of the pixel electrode 61 is reset to a level according to the voltage $V_H$. The voltage level of the pixel electrode 61 then determines a level of the image signal at a dark time. The first reset period corresponds to what is called an electronic shutter. In FIG. 4, a hatched rectangle RT1 at the left end represents the first reset period.

Next, the reset transistor 22 is turned off. Accumulation of signal charges in the charge accumulation node FD is started by turning off the reset transistor 22. Subsequently, the address transistor 23 is turned on at a desired timing, and a signal is read to the vertical signal line 34. The level of a signal read at this point corresponds to the amount of signal charges accumulated in the charge accumulation region in the period from the initial reset of the charge accumulation node FD until turning on of the address transistor 23. In FIG. 4, a lightly hatched rectangle RD1 represents a period in which a signal is read (first signal read period) according to the amount of signal charges accumulated in the charge accumulation region. In FIG. 4, a white rectangle EXP represents a period from a state of dark level of the potential of the charge accumulation node FD until the first signal read period. In the present description, the signal read period is called an "charge accumulation period". The charge accumulation period is a period in which signal charges are essentially accumulated in the charge accumulation region, and may also be called an exposure period.

After a signal is read, the reset transistor 22 is turned on again, and the potential of the pixel electrode 61 is again reset to a level according to the voltage $V_H$. In FIG. 4, a hatched rectangle RT2 represents the reset period following the first signal read period.

Subsequently, the address transistor 23 is turned on again, and a signal after the reset is read again. The level of a signal read here corresponds to a level at a dark time. Thus, an image signal with fixed noise removed is obtained by calculating the difference between the level of a signal read at this point and the level of a signal read in the first signal read period represented by the rectangle RT1. In FIG. 4, a relatively dark hatched rectangle RD2 represents a period in which a signal is read (second signal read period) after the potential of the charge accumulation node FD is reset. After a signal corresponding to a level at a dark time, the address transistor 23 is turned off. The time taken for reading a signal is relatively short, thus the potential of the charge accumulation region hardly changes before and after the signal is read.

After the second signal read period is completed, the subsequent charge accumulation period starts. After the second signal read period is completed, an electronic shutter may be operated again before the subsequent signal accumulation period. In a rolling shutter operation, the above-mentioned operation is successively performed for each row in the pixel array PA with start timing shifted.

Attention is focused on the rectangular arrangement in the third stage in FIG. 4. In the second row of the pixel array PA, a low-level voltage $V_L$ is supplied to the imaging cell 10A in the first reset period. In other words, in the electronic shutter operation for the second row, the voltage supply circuit 41 switches the voltage applied to the first signal line 31 from the voltage $V_H$ to the voltage $V_L$. Therefore, the imaging cell 10A belonging to the second row of the pixel array PA is reset by a reset voltage different from the reset voltage for the imaging cell 10A belonging to the first row of the pixel array PA. In other words, the level of an image signal at a dark time of the imaging cell 10A belonging to the second row of the pixel array PA is different from the level of an image signal at a dark time of the imaging cell 10A belonging to the first row of the pixel array PA.

Subsequently, accumulation of signal charges is started. In FIG. 4, the white rectangle EXP represents a charge accumulation period. Here, in the second row of the pixel array PA, the voltage applied to the first signal line 31 is switched from the voltage $V_H$ to the voltage $V_L$. Thus, the potential of the pixel electrode 61 at the start of accumulation of signal charges is different between the imaging cell 10A belonging to the first row of the pixel array PA, and the imaging cell 10A belonging to the second row. Specifically, the potential difference Φ between the pixel electrode 61 and the opposite electrode 62 at the start of the charge accumulation period for the imaging cell 10A belonging to the second row of the pixel array PA is greater than the potential difference Φ at the start of the charge accumulation period for the imaging cell 10A belonging to the first row of the pixel array PA. In other words, the sensitivity of the imaging cell 10A belonging to the second row of the pixel array PA is a higher than the sensitivity of the imaging cell 10A belonging to the first row of the pixel array PA. Therefore, an image signal, which is obtained with a relatively high sensitivity, is outputted from the imaging cell 10A belonging to the second row of the pixel array PA.

When attention is focused on the rectangular arrangement in the fourth stage in FIG. 4, the voltage supply circuit 41 switches the voltage supplied to the first signal line 31 to the high-level voltage $V_H$ again in the first reset period for the imaging cell 10A belonging to the third row of pixel array PA. Similarly to the imaging cell 10A belonging to the first row, an image signal, which is obtained with a relatively low sensitivity, is outputted from the imaging cell 10A belonging to the third row of the pixel array PA.

Figure 5A:
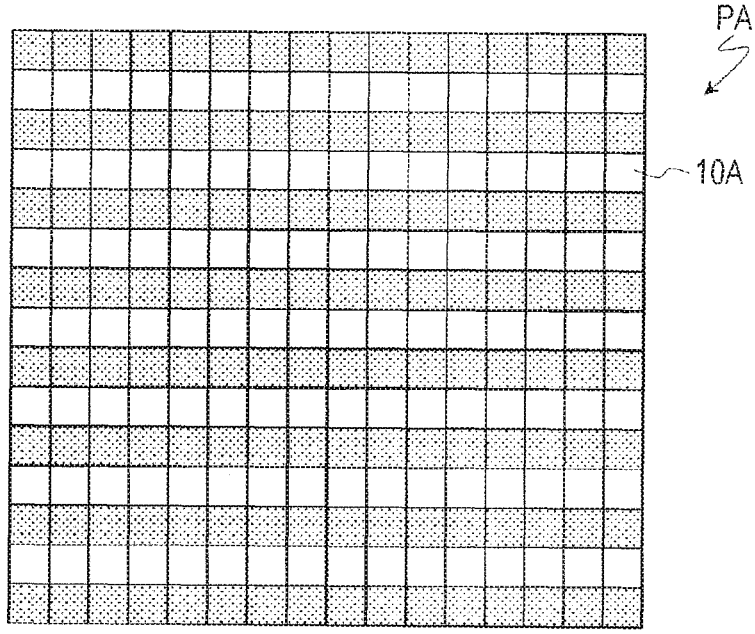
FIG. 5A is a diagram schematically illustrating arrangement of imaging cells with different sensitivities when a reset voltage is switched between a high voltage and a low voltage row by row in a pixel array.

FIG. 5A schematically illustrates arrangement of imaging cells 10A with different sensitivities when a reset voltage $V_{RST}$ is switched between a voltage $V_H$ and a voltage $V_L$ row by row in the pixel array PA. In FIG. 5A, each hatched rectangle represents an imaging cell 10A with sensitivity relatively reduced. As in this example, the voltage supply circuit 41 switches the reset voltage $V_{RST}$ between the voltage $V_H$ and the voltage $V_L$ row by row in the pixel array PA. In this case, an output, in which an image signal obtained by an imaging cell having a relatively low sensitivity, and an image signal obtained by an imaging cell having a relatively high sensitivity are interleaved row by row, is obtained. In this instance, when the outputs of the imaging cells 10A in the odd rows are extracted, images obtained by photographing with a relatively low sensitivity can be constructed, and when the outputs of the imaging cells 10A in the even rows are extracted, images obtained by photographing with a relatively high sensitivity can be constructed. In short, multiple image signals obtained with different sensitivities can be acquired by single photographing. Like this, according to Embodiments of the present disclosure, it is not necessary to perform processing corresponding to exposure correction after signals are obtained, for instance, processing of amplifying signals by changing the gain row by row, and multiple image signals obtained with different sensitivities can be acquired. Here, although an instance has been described, in which the voltage applied to the first signal line 31 is switched between two voltages with different absolute values, the voltage applied to the first signal line 31 may be switched between three or more voltages with different absolute values on a row-by-row basis, for instance.

The reset voltage $V_{RST}$ may be in common with all the imaging cells 10A included in the pixel array PA. When the reset voltage $V_{RST}$ is in common with all the imaging cells 10A included in the pixel array PA, it is possible to change the sensitivity of all the imaging cells 10A at once. For instance, when the reset voltage $V_{RST}$ is switched from the voltage $V_L$ to the voltage $V_H$ for all the imaging cells 10A included in the pixel array PA, each of the imaging cells 10A included in the pixel array PA can be switched to a state with a relatively low sensitivity.

Figure 5B:
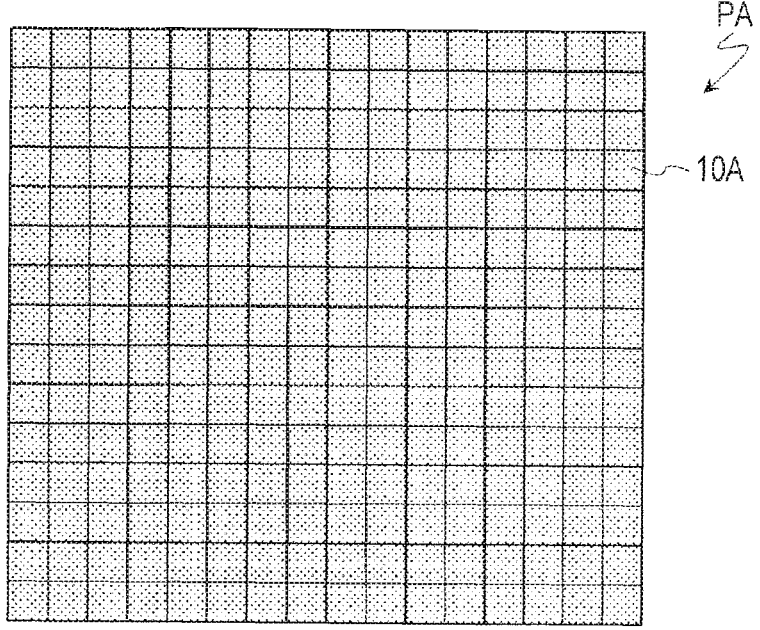
FIG. 5B is a diagram schematically illustrating arrangement of the imaging cells with sensitivities changed when the reset voltage is switched between the high voltage and the low voltage for all the imaging cells included in the pixel array.

FIG. 5B schematically illustrates the sensitivity of the imaging cells 10A when the reset voltage $V_{RST}$ is switched from the voltage $V_H$ to the voltage $V_L$ for all the imaging cells 10A included in the pixel array PA. In FIG. 5B, each hatched rectangle represents an imaging cell 10A with sensitivity relatively reduced. When the reset voltage $V_{RST}$ is switched from the voltage $V_L$ to the voltage $V_H$ for all the imaging cells 10A included in the pixel array PA, all the sensitivities of the imaging cells 10A included in the pixel array PA are returned to a relatively high sensitivity. For instance, when the reset voltage $V_{RST}$ is switched between frames for all the imaging cells 10A included in the pixel array PA, an image signal obtained by an imaging cell having a relatively low sensitivity, and an image signal obtained by an imaging cell having a relatively high sensitivity are switched for each frame and can be obtained. When sufficient light is incident into imaging cells like outdoors in daytime, all the imaging cells may be switched to a relatively low sensitivity state, and when an amount of incident light is small, all the imaging cells may be switched to a relatively high sensitivity state. In this manner, the sensitivity may be flexibly switched according to an amount of incident light. For determination of daytime or nighttime, and detection of an amount of incident light, external information, for instance, time information or an output of other sensor, such as an illuminance sensor, may be used.

Alternatively, the voltage supplied to all the imaging cells 10A included in the pixel array PA via the first signal line 31 may be switched in an analog manner. Switching in an analog manner refers to, for instance, changing without step.

The sensitivity of the entire imaging region can be changed in an analog manner by changing the voltage applied to the first signal line 31 in an analog manner.

The reset voltage $V_{RST}$, which causes the potential difference Φ between the pixel electrode 61 and the opposite electrode 62 to assume a value near 0 V, may be supplied in common with all the imaging cells 10A in the pixel array PA. As described later, a configuration of the photoelectric conversion structure 64 may be adopted, in which when the potential difference Φ is small to some extent, the photoelectric conversion structure 64 exhibits characteristics such that charges are not moved between the photoelectric conversion structure 64 and the electrode (the pixel electrode 61 or the opposite electrode 62). Thus, a state with sensitivity of zero can be achieved. The sensitivity of all the imaging cells 10A in the pixel array PA can be set to substantially 0 by causing the potential difference Φ between the pixel electrode 61 and the opposite electrode 62 to be closer to 0 V. In other words, a state with a shutter closed for all the imaging cells 10A in the pixel array PA can be electrically achieved.

(Change of Sensitivity in Unit of Imaging Cell)

As described with reference to FIG. 1, typically, the common address signal line 39 is connected to the gates of the reset transistors 22 of the imaging cells 10A belonging to the same row. That is, reset of the imaging cell 10 included in the pixel array PA is typically executed on a row-by-row basis. Therefore, when the voltage supply circuit 41 alternately switches the reset voltage $V_{RST}$ applied to the first signal line 31 row by row, as illustrated in FIG. 5A, the imaging cells 10A with different sensitivities are alternately arranged row by row. It is more useful if the sensitivities between the imaging cells 10 belonging to the same row can be made different from each other rather than the sensitivities are made different row by row. Hereinafter, an instance of configuration will be described, in which the voltage written to the pixel electrode 61 can be made different between part of the imaging cells in the pixel array PA and the other imaging cells.

Figure 6:
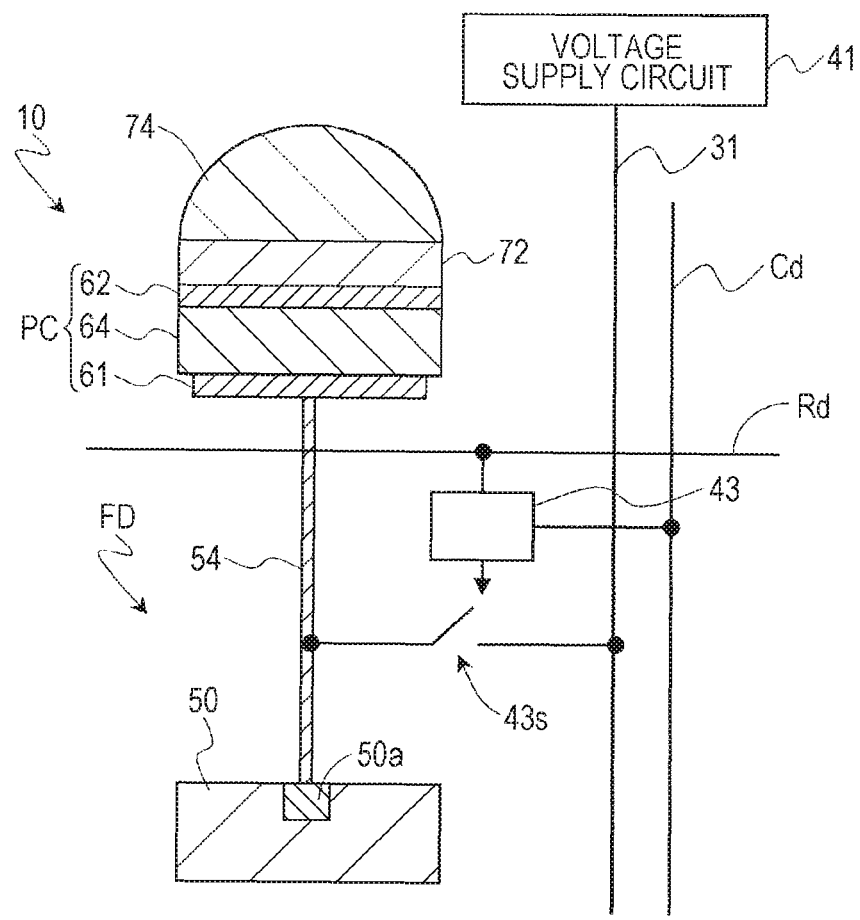
FIG. 6 is a diagram schematically illustrating an overview of configuration in which a voltage written to the pixel electrode is controllable imaging cell by imaging cell.

FIG. 6 schematically illustrates an overview of configuration in which a voltage written to the pixel electrode 61 is controllable imaging cell by imaging cell. For instance, it is assumed that multiple imaging cells in a matrix form are arranged in a direction in which the rows of the multiple imaging cells extend (hereinafter simply called a "row direction"), and in a direction in which the columns extend (hereinafter simply called a "column direction"). At this point, multiple row signal lines extending in the row direction, and multiple row signal lines extending in the column direction may be provided in the pixel array PA corresponding to the multiple imaging cells arranged in a matrix form.

FIG. 6 illustrates part of one imaging cell 10 of the imaging cells 10 in the pixel array PA. A corresponding one of multiple row signal lines Rd and a corresponding one of column signal lines Cd are representatively illustrated. Each of the row signal lines Rd is connected to a row driver (not illustrated in FIG. 6), and a predetermined control signal is applied to each row signal line Rd from a row driver at a predetermined timing. The row driver may be part of the vertical scanning circuit 48. Similarly, each of the column signal lines Cd is connected to a column driver (not illustrated in FIG. 6), and a predetermined control signal is applied to each column signal line Cd from a column driver at a predetermined timing.

In the instance illustrated in FIG. 6, the selection circuit 43 is located at an intersection point at which the row signal line Rd and the column signal line Cd intersect each other.

In the configuration exemplified to FIG. 6, the selection circuit 43 switches between ON and OFF of a switching device 43s connected between the charge accumulation node FD and the first signal line 31 according to the voltage levels of the row signal line Rd and the column signal line Cd. For instance, when a high-level signal is applied to the row signal line Rd from the row driver, and a high-level signal is applied to the column signal line Cd from the column driver the selection circuit 43 turns on the switching device 43s.

The switching device 43s is, for instance, the reset transistor 22 described above. The selection circuit 43 turns on the reset transistor 22, thereby establishing the connection between the charge accumulation node FD and the first signal line 31. Thus, the potential of pixel electrode 61 can be reset to a voltage level corresponding to the reset voltage $V_{RST}$ applied to the first signal line 31 from the voltage supply circuit 41. It is to be noted that although in FIG. 6, one end of the switching device 43s is connected to the connector 54, FIG. 6 schematically illustrates the connection of the switching device 43s. It is not necessary that one end of the switching device 43s is physically connected to the connector 54 actually.

For instance, when the signal applied to the row signal line Rd is set to high-level in every other row, and the signal applied to the column signal line Cd is set to high-level in every other column at a certain timing, the pixel electrode 61 of an imaging cell 10 located at an intersection point of the row signal line Rd and the column signal line Cd with high-level signal can be reset to a common potential. For instance, the potential of the pixel electrode 61 can be reset to a voltage level corresponding to the high-level voltage $V_H$.

Subsequently, the applied signal is switched between high-level and low-level, and the reset voltage $V_{RST}$ applied to the first signal line 31 from the voltage supply circuit 41 is switched to the low-level voltage $V_L$, and thereby the potential of the pixel electrode 61 of each of the remaining imaging cells 10 can be reset to a voltage level corresponding to the low-level voltage $V_L$.

Figure 7:
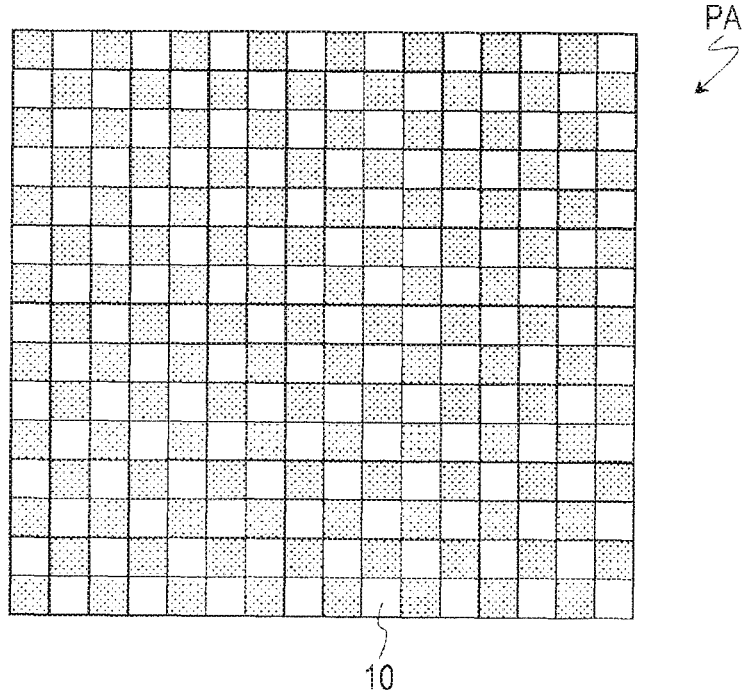
FIG. 7 is a diagram illustrating an instance in which imaging cells for which voltages written to pixel electrodes are different are mixed in a row direction and a column direction.

FIG. 7 illustrates an instance in which imaging cells for which voltages written to pixel electrodes 61 are different are mixed in the row direction and the column direction. Similarly to FIGS. 5A and 5B, each hatched rectangle in FIG. 7 represents an imaging cell 10 with sensitivity relatively reduced. By disposing the selection circuit 43 in each imaging cell 10, different reset voltages $V_{RST}$ can be alternately applied to the imaging cell 10, for instance, in the row direction and the column direction. Therefore, as schematically illustrated in FIG. 7, it is possible to alternately arrange imaging cells 10 with different sensitivities in the row direction and the column direction. In this manner, according to Embodiments of the present disclosure, the potential of the pixel electrode 61 is controlled by changing the voltage applied to the first signal line 31, for instance. Thus, the sensitivity of each imaging cell can be changed on an imaging cell-by-imaging cell basis. With such an imaging device, for instance, even at the same time, an imaging cell with a relatively large amount of incident light can be switched to a relatively low sensitivity state, and an imaging cell with a relatively small amount of incident light can be switched to a relatively high sensitivity state.

Figure 8:
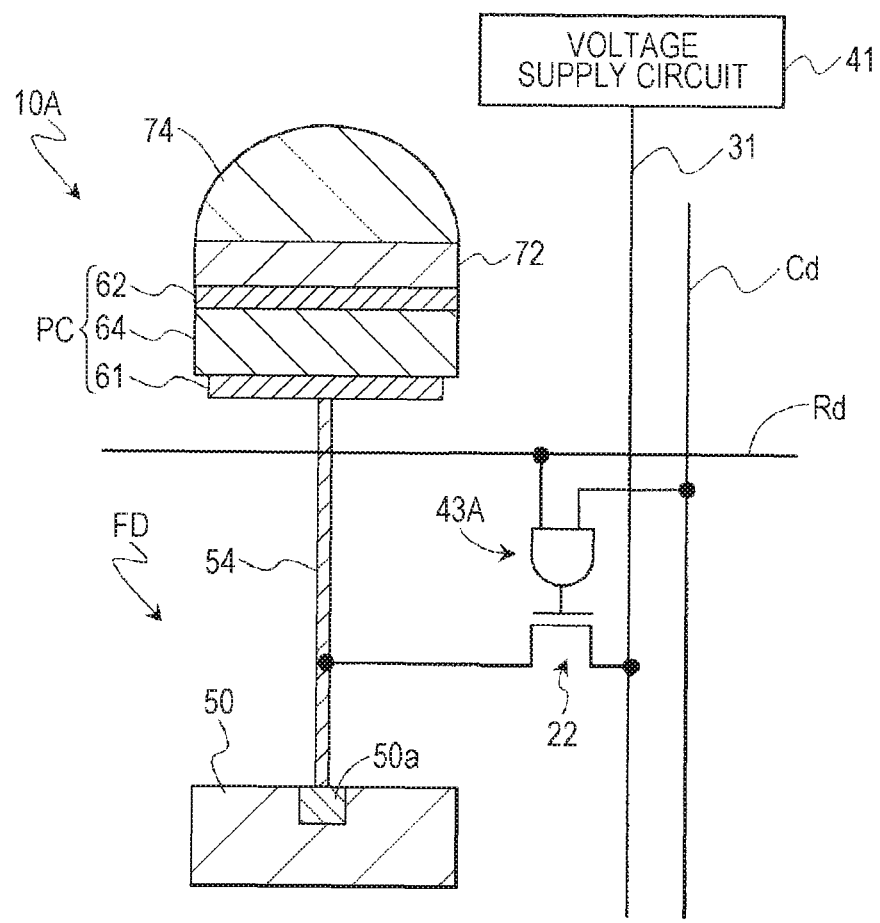
FIG. 8 is a diagram illustrating an instance of a specific configuration of a selection circuit.

FIG. 8 illustrates an instance of a specific configuration of the selection circuit 43. In the instance illustrated in FIG. 8, an AND gate is used as the selection circuit 43A, and the reset transistor 22 is used as the switching device 43s. In this instance, the output of the AND gate is connected to the gate of the reset transistor 22, and when the signal levels of the row signal line Rd and the column signal line Cd are both high-level, the connection between the first signal line 31 and the charge accumulation node FD is established. As a replacement for AND gate, NAND gate is used, and the number of devices in the selection circuit 43 can be reduced by using P-channel MOS as the switching device 43s.

Figure 9:
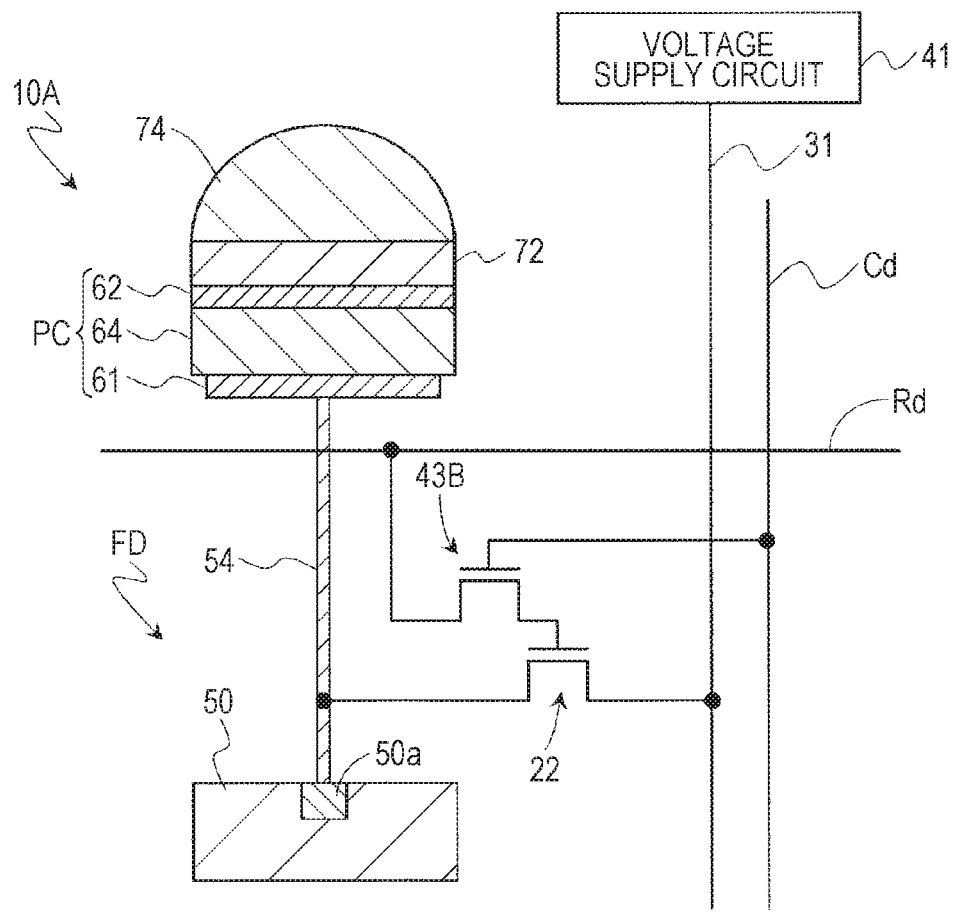
FIG. 9 is a diagram illustrating another example of a specific configuration of the selection circuit.

FIG. 9 illustrates another instance of a specific configuration of the selection circuit 43. In the instance illustrated in FIG. 9, N-channel MOS is used as the selection circuit 43B. The number of devices can be further reduced by using a transistor as the selection circuit 43. The gate and the drain of a transistor serving as the selection circuit 43B are connected to the row signal line Rd and the column signal line Cd, respectively. According to this example, the operation of active matrix system can be achieved by two transistors.

Similarly to the active matrix system, an imaging cell at any position in the pixel array PA can be selected by providing the selection circuit 43 in each imaging cell. Application of a voltage to a selected imaging cell from the first signal line 31 allows the potential of the pixel electrode 61 of the imaging cell to be changed. The direction of extension of the signal line (for instance, the row signal line Rd and the column signal line Cd) for selecting an imaging cell 10 to which a voltage is applied from the first signal line 31 is not limited to the row direction and the column direction, and may be changed as needed according to the arrangement of the multiple imaging cells 10.

The opposite electrode 62 may be electrically separated for each imaging cell 10, for instance. Furthermore, when the reset voltage $V_{RST}$ is written to the pixel electrode 61, an opposite electrode voltage $V_{OPP}$, which causes the potential difference Φ between the pixel electrode 61 and the opposite electrode 62 to assume a value near 0 V, may be applied to the opposite electrode 62 of each imaging cell 10 according to the voltage written to the pixel electrode 61. In Embodiments of the present disclosure, a configuration of the photoelectric conversion structure 64 is adopted, in which when the potential difference Φ between the pixel electrode 61 and the opposite electrode 62 is small to some extent, the photoelectric conversion structure 64 exhibits characteristics such that charges are not moved between the photoelectric conversion structure 64 and the electrode (the pixel electrode 61 or the opposite electrode 62). The details of the configuration of the photoelectric conversion structure 64, which gives such a characteristic, will be described later.

When the photoelectric conversion structure 64 has such a characteristic, adjustment of the potential of at least one of the pixel electrode 61 and the opposite electrode 62 can achieve a state in which substantially, accumulation of charges from the photoelectric conversion structure 64 to the charge accumulation region does not occur, and drawing out of charges from the charge accumulation region to the photoelectric conversion structure 64 does not occur. That is, a state is achieved, in which even when the photoelectric conversion structure 64 is irradiated with light, no signal charge is accumulated in the charge accumulation region, and the signal charges already accumulated in the charge accumulation region are not drawn out by the photoelectric conversion structure 64. In other words, a state with sensitivity of zero can be achieved. When the reset voltage $V_{RST}$ is written to the pixel electrode 61, it is useful to set the imaging cell 10 to a state with sensitivity of zero because accumulation of signal charges does not start while the reset voltage $V_{RST}$ is being written to the pixel electrode 61.

(Device Structure of Imaging Cell)

Figure 10:
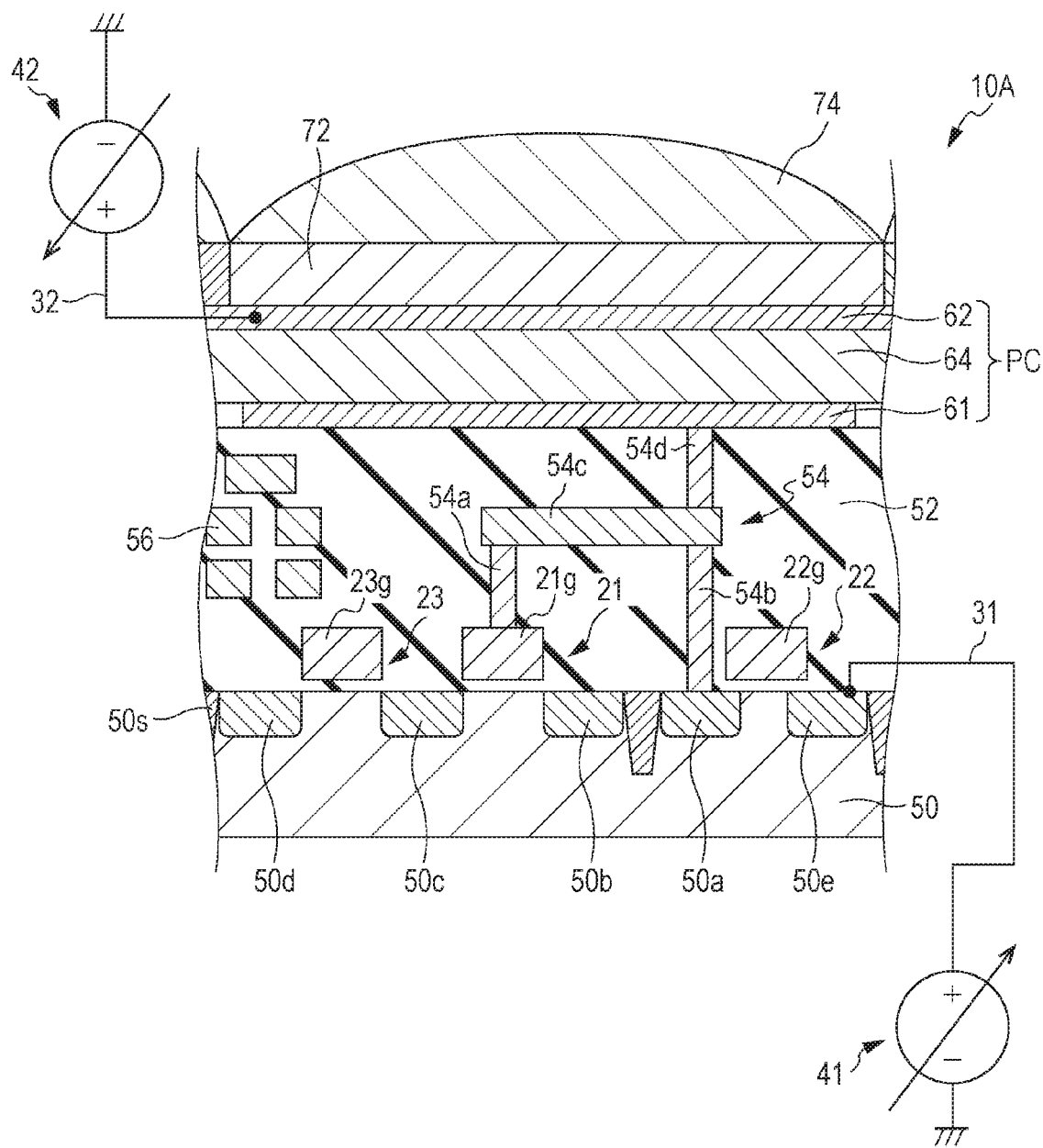
FIG. 10 is a schematic sectional view illustrating an exemplary device structure of each imaging cell.

Here, the device structure of the imaging cell will be described in detail with reference to FIG. 10. FIG. 10 schematically illustrates an exemplary device structure of the imaging cell 10A. As illustrated in FIG. 10, each of the multiple imaging cells 10A includes part of the semiconductor substrate 50. The interlayer insulation layer 52, which covers the semiconductor substrate 50, is typically a silicon dioxide layer, and may have a multilayer structure of multiple insulation layers. The semiconductor substrate 50 is not limited to a substrate which is a semiconductor layer in its entirety, and may be an insulation substrate in which a semiconductor layer is provided on the surface on which the photoelectric converter PC is disposed. Hereinafter, P-type silicon (Si) substrate is exemplified as the semiconductor substrate 50.

The semiconductor substrate 50 has impurity regions (here, N-type regions) 50a to 50e, and a device separation region 50s for electrical separation between the imaging cells 10A. The impurity regions 50a to 50e are typically diffusion layers formed in the semiconductor substrate 50. The device separation region 50s is formed by, for instance, ion implantation of donor on predetermined implantation conditions. In this instance, the device separation region 50s is also provided between the impurity region 50a and the impurity region 50b. It is to be noted that the center-to-center distance (pixel pitch) between two adjacent imaging cells 10A in the row direction or the column direction of the multiple imaging cells 10A may be on the order of 2 μm, for instance.

The above-described signal detection transistor 21 includes the impurity regions 50b and 50c formed in the semiconductor substrate 50, and a gate electrode 21g (typically a polysilicon electrode) positioned above the region between the impurity regions 50b and 50c out of the major surface of the semiconductor substrate 50. The impurity regions 50b and 50c respectively serve as the drain region and the source region of the signal detection transistor 21. Although not illustrated in FIG. 10, the impurity region 50b is connected to the power source wire 36 (see FIG. 2).

As schematically illustrated in FIG. 10, the gate electrode 21g of the signal detection transistor 21 is connected to the pixel electrode 61 and the impurity region 50a via the connector 54 disposed in the interlayer insulation layer 52. In the instance illustrated, the connector 54 includes a contact plug 54a having one end connected to the gate electrode 21g, a contact plug 54b having one end connected to the impurity region 50a, a wiring layer 54c, and a plug 54d. The wiring layer 54c connects the other ends of the contact plugs 54a and 54b. The pixel electrode 61, the connector 54, and the impurity region 50a form at least part of the charge accumulation region.

The contact plugs 54a, 54b and the wiring layer 54c are typically composed of polysilicon. The plug 54d disposed between the wiring layer 54c and the pixel electrode 61 is composed of copper, for instance. It is to be noted that in addition to the connector 54, a wiring layer 56 including the vertical signal line 34 (see FIG. 2) is disposed in the interlayer insulation layer 52. The number of insulation layers in the interlayer insulation layer 52, and the number of wiring layers 56 disposed in the interlayer insulation layer 52 can be set to any number.

In the semiconductor substrate 50, not only the signal detection transistor 21, but also other transistors, such as the address transistor 23, and the reset transistor 22 are also formed. The address transistor 23 includes the impurity regions 50c and 50d, and a gate electrode 23g (typically a polysilicon electrode) positioned above the region between the impurity regions 50c and 50d out of the major surface of the semiconductor substrate 50. The gate electrode 23g is connected to the address signal line 39 (not illustrated in FIG. 10, see FIG. 2). The impurity regions 50c and 50d respectively serve as the drain region and the source region of the address transistor 23. Here, the address transistor 23 is electrically connected to the signal detection transistor 21 by sharing the impurity region 50c with the signal detection transistor 21. The impurity region 50d is connected to the vertical signal line 34 via a plug which is not illustrated in FIG. 10.

The reset transistor 22 includes the impurity regions 50a and 50e, and a gate electrode 22g (typically a polysilicon electrode) which is positioned above the region between the impurity regions 50a and 50e and is connected to the reset signal line 38 (see FIG. 2). The impurity region 50a serves as one of the drain region and the source region of the reset transistor 22, and the impurity region 50e serves as the other of the drain region and the source region of the reset transistor 22. In this instance, the impurity region 50e is connected to the first signal line 31.

The opposite electrode 62 of the photoelectric converter PC is typically a transparent electrode composed of a transparent conductive material, and is disposed on the light incident side of the photoelectric conversion structure 64. In other words, the opposite electrode 62 is positioned more distant from the semiconductor substrate 50 than the pixel electrode 61. For instance, transparent conducting oxide (TCO), such as ITO, IZO, AZO, FTO, $SnO_2$, $TiO_2$, $ZnO_2$ may be used as the material of the opposite electrode 62. It is to be noted that "transparent" in the present description means that at least part of light with a wavelength range to be detected can transmit, and it is not required that light can transmit for the entire wavelength range of visible light. In the present description, visible light refers to light with a wavelength in a range of 380 nm or greater and less than 750 nm. In the present description, entire electromagnetic wave including infrared light and ultraviolet rays is represented by "light" for the sake of convenience. The light detected by the imaging device in the present disclosure is not limited to the light with a wavelength range of visible light.

As schematically illustrated in FIG. 10, the opposite electrode 62 is connected to the voltage supply circuit 42 via the accumulation control line 32. The voltage supply circuit 42 applies a voltage, which makes the potential of the opposite electrode 62 higher than the potential of the pixel electrode 61, to the opposite electrode 62, for instance. By making the potential of the opposite electrode 62 higher than the potential of the pixel electrode 61, the positive charges out of the positive and negative charges generated in the photoelectric conversion structure 64 can be collected by the pixel electrode 61. Hereinafter, a case will be illustrated where a positive hole is utilized as a signal charge. Needless to say, it is also possible to utilize an electron as a signal charge. When an electron is utilized as signal charge, it is only necessary to perform control to make the potential of the opposite electrode 62 lower than the potential of the pixel electrode 61.

In this instance, the opposite electrode 62 is a single electrode over the multiple imaging cells 10A. Therefore, it is possible to apply a voltage with desired amplitude collectively from the voltage supply circuit 42 to the opposite electrode 62 of the multiple imaging cells 10A via the accumulation control line 32. However, it is not required that the opposite electrode 62 is a single electrode facing the multiple imaging cells 10A. As described later, the opposite electrode 62 may be divided into multiple portions.

In the configuration illustrated in FIG. 10, the photoelectric conversion structure 64 is also formed over the multiple imaging cells 10A. Like this, the entire photoelectric-converter PC does not have to be an independent device for each imaging cell 10A, and part of the photoelectric converter PC may be formed over the multiple imaging cells 10A.

The pixel electrode 61 is typically provided independently for each imaging cell 10A. The pixel electrode 61 is spatially separated from the pixel electrode 61 of another adjacent imaging cell 10A. Thus, the pixel electrode 61 is electrically separated from the pixel electrode 61 of another imaging cell 10A. The pixel electrode 61 is composed of metal such as aluminum, copper, and titanium, metal nitride, or polysilicon to which conductivity is imparted by doping impurities. The pixel electrode 61 may be a single electrode or may include multiple electrodes. The pixel electrode 61 may be a light-blocking electrode.

The signal charges (for instance, positive holes) collected by the pixel electrode 61 are accumulated in a charge accumulation region including the charge accumulation node FD. The accumulation of signal charges in the charge accumulation node FD causes a voltage according to the amount of the accumulated signal charges to be applied to the gate of the signal detection transistor 21. A voltage amplified by the signal detection transistor 21 is selectively read in the form of signal voltage via the address transistor 23. It is to be noted that the charge accumulation region may include a capacitor, for instance. That is, the charge detector CD may include not only the impurity region 50a in which signal charges are accumulated, but also a capacitor (not illustrated in FIG. 10) in which signal charge can be accumulated, for instance.

In Embodiments of the present disclosure, the pixel electrode 61, and the first signal line 31 connected to the voltage supply circuit 41 are electrically coupled to each other. This causes a change in the potential of the charge accumulation node FD including the pixel electrode 61 through a change in the voltage of the first signal line 31. As described above, the voltage supply circuit 41 is configured to switch between at least two voltages with different absolute values and to allow a voltage to be applied to the first signal line 31. Therefore, at the time of operation of the imaging device 100A, the voltage supply circuit 41 can change the potential of the pixel electrode 61 by switching a voltage applied to the first signal line 31 between multiple voltages via electrical coupling between the pixel electrode 61 and the first signal line 31.

(Another Example that Allows Potentials of Pixel Electrodes after Reset to be Different)

Figure 11:
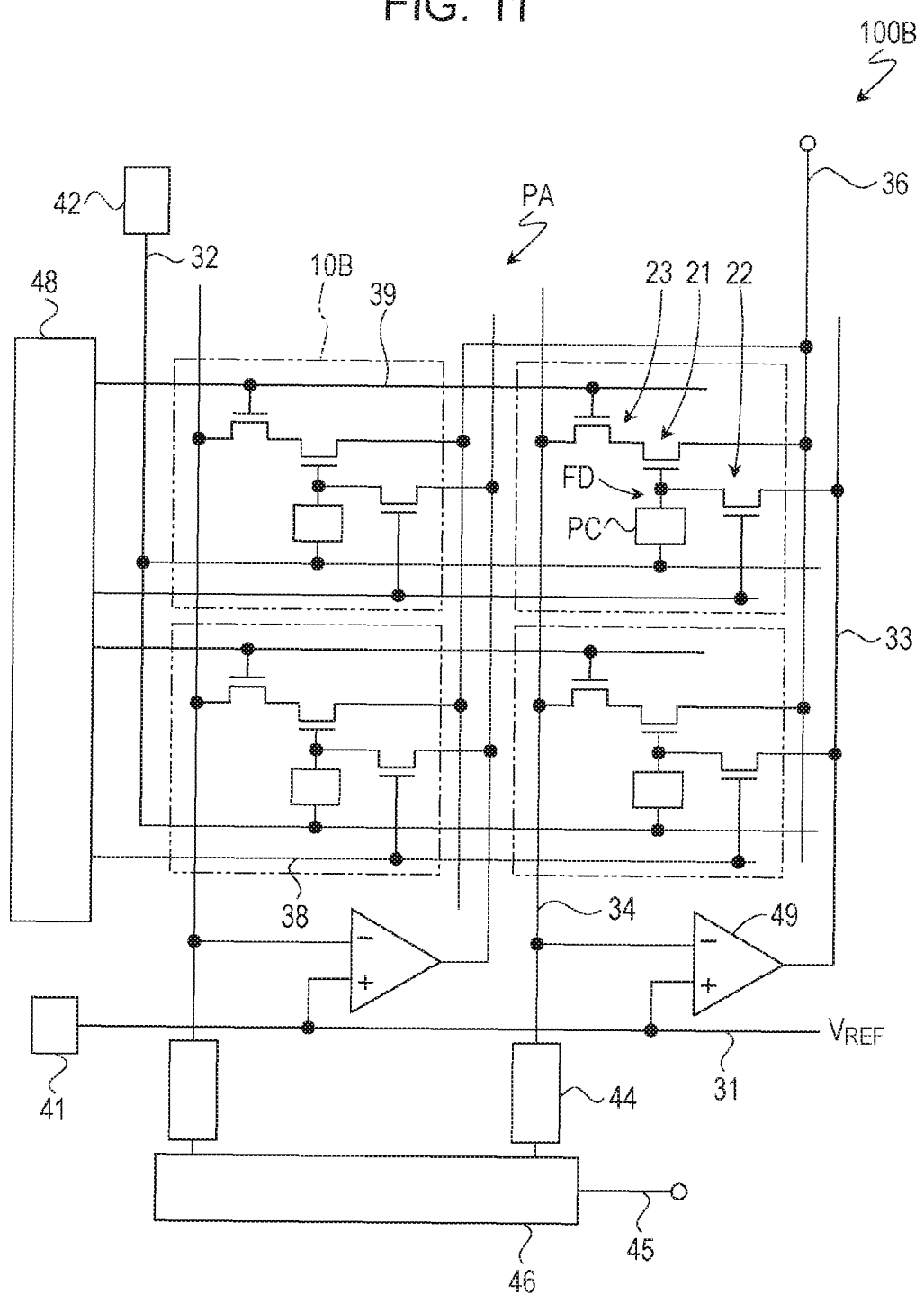
FIG. 11 is a diagram illustrating another exemplary circuit configuration of the imaging device according to Embodiment 1 of the present disclosure.

A configuration that allows the potential of the pixel electrode 61 after reset to be different between the multiple imaging cells 10 is not limited to the configuration described with reference to FIG. 2. FIG. 11 illustrates another exemplary circuit configuration of the imaging device according to Embodiment 1 of the present disclosure. An imaging device 100B illustrated in FIG. 11 has an imaging cell 10B instead of the above-described imaging cell 10A.

The imaging device 100B has an inverting amplifier 49 for each column of multiple imaging cells 10B. An inverting input terminal of the inverting amplifier 49 is connected to the vertical signal line 34 of a corresponding column, and an output terminal of the inverting amplifier 49 is connected to a feedback line 33. The feedback line 33 is connected to the source of the reset transistor 22 of each of the imaging cells 10B belonging to a corresponding row. As seen from FIG.

11, one of the imaging cells 10B belonging to a corresponding column is selected, and the reset transistor 22 and the address transistor 23 are turned on. Thus, it is possible to form a feedback loop for causing negative feedback of the signal generated by the photoelectric converter PC of the imaging cell 10B. The effect of random noise can be canceled by utilizing the negative feedback as described in International Publication No. WO 2014/002367.

In the instance illustrated in FIG. 11, the first signal line 31 connected to the voltage supply circuit 41 is connected to a non-inverting input terminal of the inverting amplifier 49 in each column. In the configuration illustrated to FIG. 11, at the time of operation of the imaging device 100B, the voltage supply circuit 41 supplies a reference voltage $V_{REF}$ for resetting the potential of the charge accumulation node FD to the inverting amplifier 49 in each column via the first signal line 31.

Figure 12:
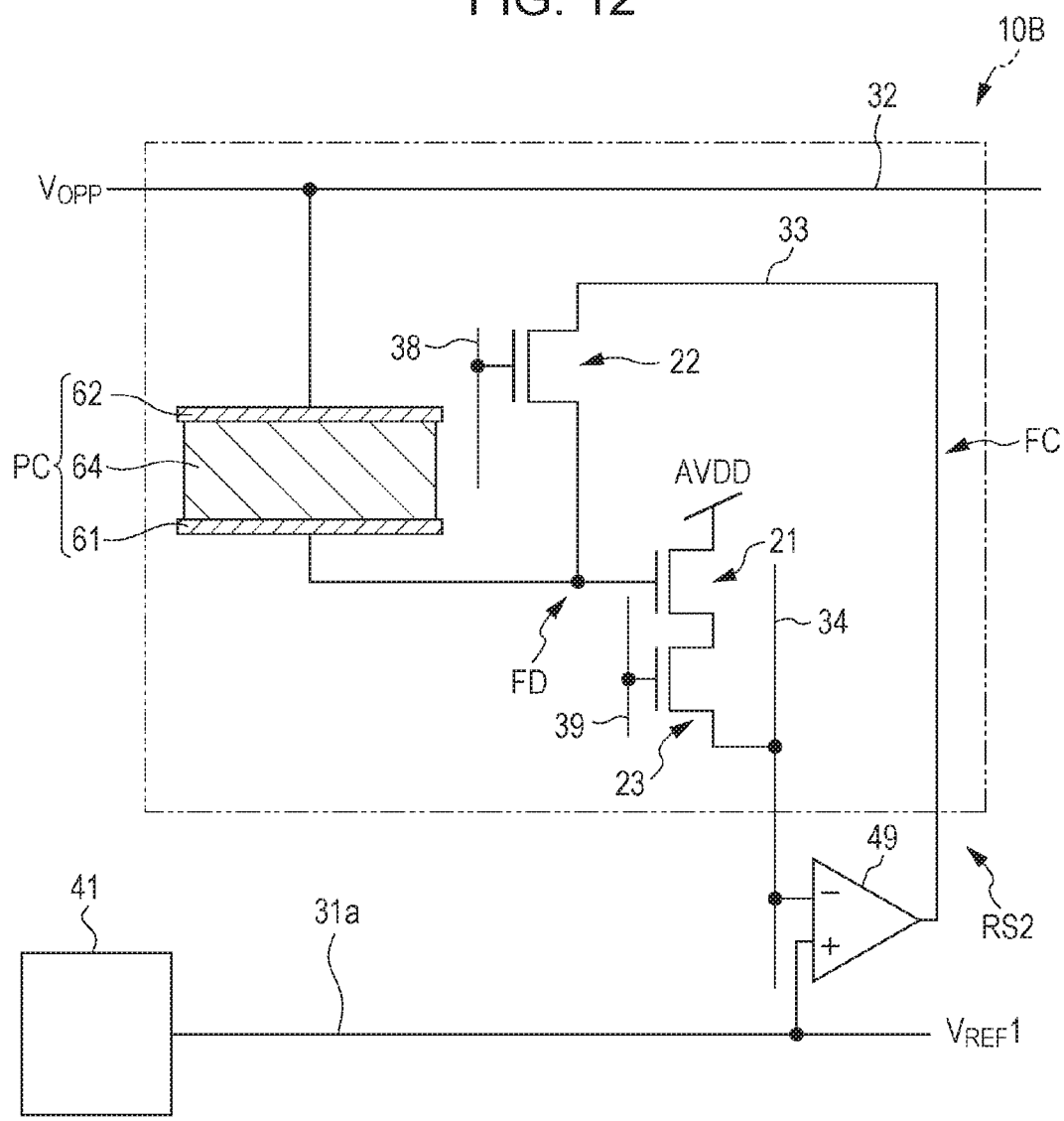
FIG. 12 is a diagram illustrating an overview of a circuit configuration of one imaging cell taken from imaging cells in the pixel array.

FIG. 12 illustrates an overview of the circuit configuration of one imaging cell 10B in the pixel array PA. In the configuration illustrated to FIG. 12, a reset circuit RS2 of the imaging cell 10B includes a feedback circuit FC for causing negative feedback of the signal generated by the photoelectric converter PC. The feedback circuit FC includes the inverting amplifier 49. The inverting input terminal of the inverting amplifier 49 is electrically connected to the source of the signal detection transistor 21 via the vertical signal line 34 and the address transistor 23.

When the reset transistor 22 and the address transistor 23 are turned on, a feedback loop including the inverting amplifier 49 in the path is formed. Due to the formation of a feedback loop, the voltage of the charge accumulation node FD converges to a voltage that causes zero voltage difference between the voltage of the vertical signal line 34, and the voltage applied to the non-inverting input terminal of the inverting amplifier 49. Here, the non-inverting input terminal of the inverting amplifier 49 is connected to the first signal line 31. Therefore, at the time of formation of a feedback loop, the voltage of the charge accumulation node FD converges to a voltage that equate the voltage of the vertical signal line 34, and the reference voltage $V_{REF}$ supplied to the first signal line 31 from the voltage supply circuit 41. In short, the potential of the charge accumulation node FD is reset to a predetermined potential.

In the configuration illustrated in FIGS. 11 and 12, the voltage level of the pixel electrode 61 that gives a level of image signal at a dark time is dependent on and determined by the reference voltage $V_{REF}$ applied to the first signal line 31. In the configuration illustrated in FIGS. 11 and 12, the voltage supply circuit 41 can reset the potential of the charge accumulation node FD to a predetermined voltage level by switching the voltage applied to the first signal line 31 serving as the reference voltage $V_{REF}$ between multiple voltages through the change in the voltage of the first signal line 31.

As described above, the feedback loop is formed by turning on the reset transistor 22 and the address transistor 23. As seen with reference to FIG. 11, here, the gate of the reset transistor 22 of each of the imaging cells 10B belonging to the same row is connected to the common reset signal line 38, and the gate of the address transistor 23 of each of the imaging cells 10B belonging to the same row is connected to the common address signal line 39. That is, resetting of the potential of the charge accumulation node FD is executed on a row-by-row basis.

Thus, by switching the reference voltage applied to the first signal line 31 between resetting of the potential of the charge accumulation node FD of each of the imaging cells 10B belonging to a row, and resetting of the potential of the charge accumulation node FD of each of the imaging cells 10B belonging to another row, the potential of the pixel electrode 61 after the reset can be made different from each other between those rows. For instance, the voltage supply circuit 41 may apply a voltage $V_H$ to the first signal line 31 in the reset of imaging cells 10B in the odd rows, and may apply a voltage $V_L$ lower than the voltage $V_H$ to the first signal line 31 in the reset of the imaging cells 10B in the even rows. In this case, the potential difference Φ between the pixel electrode 61 and the opposite electrode 62 in the imaging cells 10B belonging to the odd rows at the start of the charge accumulation period is relatively smaller than the potential difference Φ in the imaging cells 10B belonging to the even rows. As a consequence, the imaging cells 10B with a relatively low sensitivity and the imaging cells 10B with a relatively high sensitivity are alternately arranged in the column direction, and the same state as in the example described with reference to FIG. 5A is achieved.

Like this, the reference voltage $V_{REF}$ applied to the first signal line 31 may be switched between multiple voltages with different absolute values during a frame period. In the present description, the "frame period" indicates the period from the start of the charge accumulation period in the start row to the end of a second signal read period in the last row. It is to be noted that any voltage may be used as the reference voltage $V_{REF}$. However, it is advantageous to use a voltage lower than the power supply voltage AVDD from the viewpoint of power consumption reduction.

Figure 13:
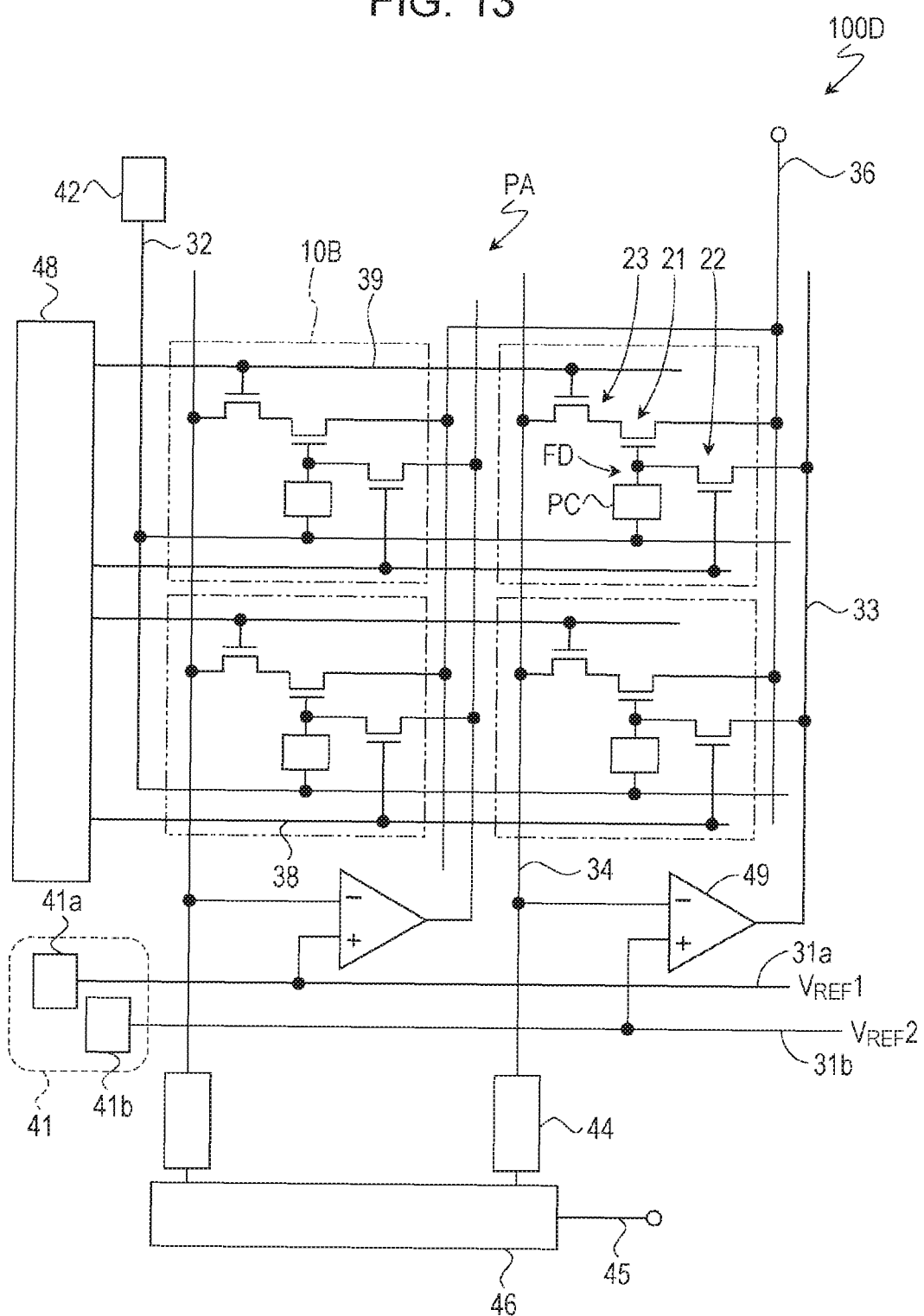
FIG. 13 is a diagram illustrating another example of a circuit configuration of the imaging device including the imaging cell having a feedback circuit.

FIG. 13 illustrates another example of the circuit configuration of an imaging device including the imaging cell 10B having the feedback circuit FC. The imaging device 100D illustrated in FIG. 13 has the voltage supply circuit 41 including a voltage supply circuit 41a connected to a first signal line 31a, and a voltage supply circuit 41b connected to a second signal line 31b. At the time of operation of the imaging device 100D, the voltage supply circuit 41a applies a reference voltage $V_{RST}1$ to the first signal line 31a. The voltage supply circuit 41b applies a reference voltage $V_{RST}2$ different from the reference voltage $V_{RST}1$ in absolute value to the second signal line 31b. Each of the voltage supply circuits 41a and 41b may be separate independent voltage supply circuit, or part of a single voltage supply circuit.

Here, the non-inverting input terminal of the inverting amplifier 49 of the first column is connected to the first signal line 31a, and the non-inverting input terminal of the inverting amplifier 49 of the second column is connected to the second signal line 31b. That is, the voltage supply circuit 41a supplies a reference voltage $V_{REF}1$ to the non-inverting input terminal of the inverting amplifier 49 of the first column via the first signal line 31. The voltage supply circuit 41b supplies a reference voltage $V_{REF}2$ to the non-inverting input terminal of the inverting amplifier 49 of the second column via the second signal line 31b.

Similarly to the instance described with reference to FIG. 11, also in this example, the voltage level of the pixel electrode 61 that gives a level of image signal at a dark time is dependent on and determined by the reference voltage $V_{REF}$ applied to the non-inverting input terminal of the inverting amplifier 49 disposed in each column. That is, in this example, the potential of the pixel electrode 61 after the reset is different between the imaging cells 10B belonging to the first column and the imaging cells 10B belonging to the second column. In short, a state where the imaging cells 10 with different sensitivities are arranged column by column is achieved.

Like this, the reference voltage $V_{REF}$ supplied to the inverting amplifier is switched between multiple voltages in a frame period, and the reference voltage $V_{REF}$ supplied to the inverting amplifier is made different every multiple columns in the imaging cells 10B, thereby making it possible to change the sensitivity of the imaging cell 10B on a row-by-row basis or column-by-column basis. For instance, the source of the reset transistor 22 of each of the imaging cells of the odd columns may be connected to the first signal line 31a, and the source of the reset transistor 22 of each of the imaging cells of the even columns may be connected to the second signal line 31b. In this situation, when the reset voltage $V_{RST}$ with different absolute values is applied to the first signal line 31a and the second signal line 31b, the sensitivity can be made different between the imaging cell of the odd columns and the imaging cell of the even columns. Like this, the voltage supply circuit 41 may supply the reset voltage $V_{RST}$ with different absolute values to imaging cells in part of multiple imaging cells, and other part of multiple imaging cells.

Embodiment 2

Instead of making the potential of the pixel electrode 61 immediately before the start of accumulation of signal charges different between the multiple imaging cells 10 as in the Embodiment described above, the potential of the opposite electrode 62 may be made different between the multiple imaging cells 10. For instance, the opposite electrode 62 is divided into multiple portions, and the opposite electrode voltage $V_{OPP}$ with different absolute values may be supplied to respective divided portions.

Figure 14:
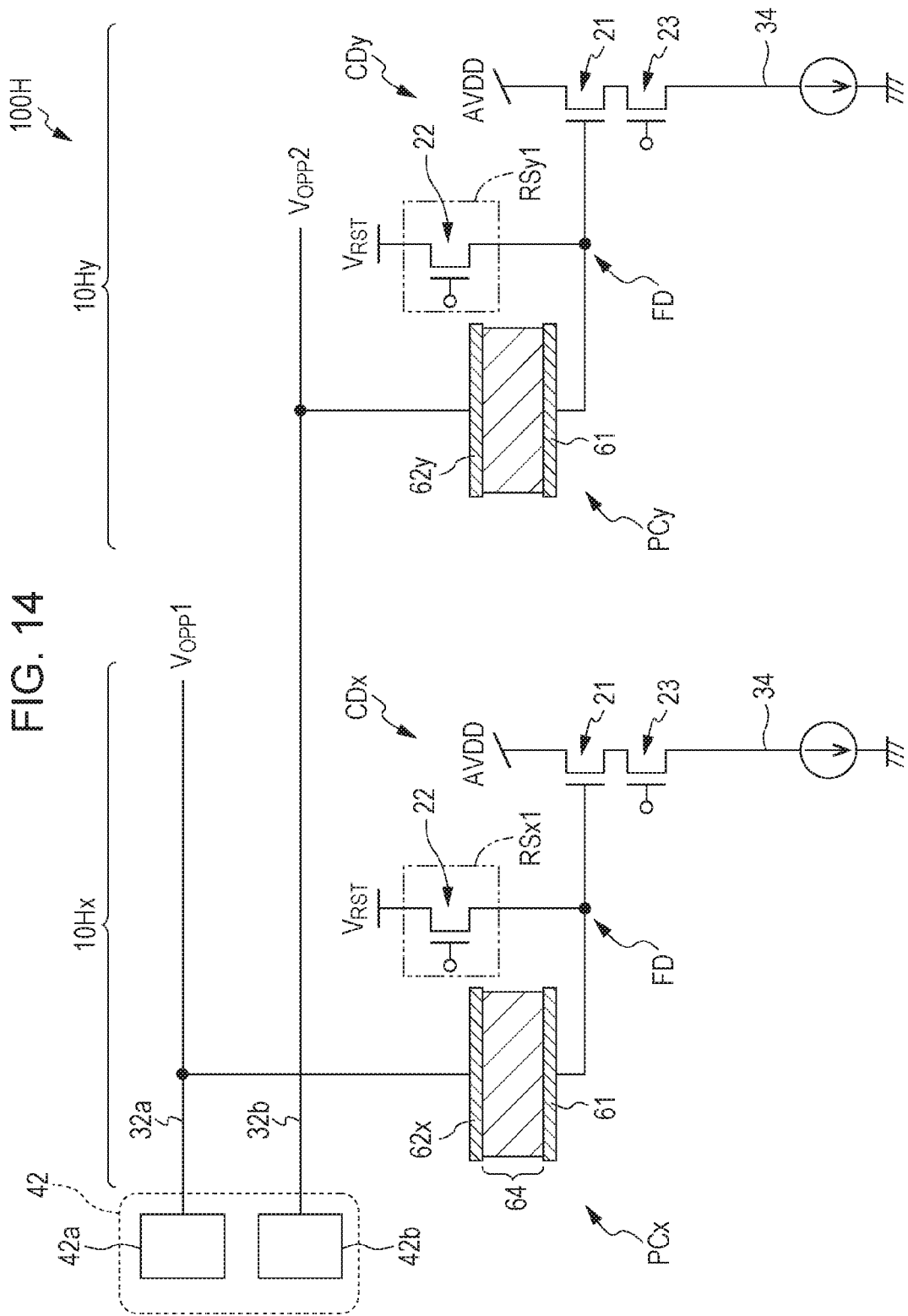
FIG. 14 is a diagram illustrating an exemplary circuit configuration of an imaging cell of an imaging device according to Embodiment 2 of the present disclosure.

FIG. 14 illustrates an exemplary circuit configuration of an imaging cell of an imaging device according to Embodiment 2 of the present disclosure. FIG. 14 illustrates the circuit configurations of two imaging cells 10Hx, 10Hy included in the pixel array PA.

The imaging device 100H illustrated in FIG. 14 has the imaging cells 10Hx and 10Hy. A charge detector CDx of the imaging cell 10Hx and a charge detector CDy of the imaging cell 10Hy respectively include reset circuits RSx1 and RSy1 that each include the reset transistor 22. However, here, the common reset voltage $V_{RST}$ is applied to the source of the reset transistor 22 in the reset circuit RSx1 and the source of the reset transistor 22 in the reset circuit RSx2. In other words, here, the potential of the pixel electrode 61 of the imaging cell 10Hx and the potential of the pixel electrode 61 of the imaging cell 10Hy after the reset are the same.

A photoelectric converter PCx of the imaging cell 10Hx has an opposite electrode 62x, and a photoelectric converter PCy of the imaging cell 10Hy has an opposite electrode 62y electrically separated from the opposite electrode 62x. As illustrated in FIG. 14, the opposite electrode 62x and the opposite electrode 62y are connected to a first accumulation control line 32a and a second accumulation control line 32b, respectively. The first accumulation control line 32a and the second accumulation control line 32b are connected to the voltage supply circuit 42.

In the configuration illustrated to FIG. 14, the voltage supply circuit 42 includes voltage supply circuits 42a and 42b. Here, the first accumulation control line 32a and the second accumulation control line 32b are connected to the voltage supply circuits 42a and 42b, respectively. The voltage supply circuits 42a and 42b supply a first opposite electrode voltage $V_{OPP}1$ and a second opposite electrode voltage $V_{OPP}2$ to the first accumulation control line 32a and the second accumulation control line 32b, respectively. That is, in this example, the imaging device 100H is configured to allow different opposite electrode voltages to be independently applied to the opposite electrode 62x connected to the first accumulation control line 32a, and the opposite electrode 62y connected to the second accumulation control line 32b. The voltage supply circuits 42a and 42b may be separate independent voltage supply circuits, or may be part of a single voltage supply circuit.

At the time of operation of the imaging device 100H, each of the opposite electrode voltage $V_{OPP}1$ and the opposite electrode voltage $V_{OPP}2$ may be fixed to a constant value, or may repeat periodical or quasi-periodical change. For instance, in the charge accumulation period of the imaging cell 10Hx, the opposite electrode voltage $V_{OPP}1$, which is different from the opposite electrode voltage $V_{OPP}2$ in absolute value, may be supplied to the first accumulation control line 32a, the opposite electrode voltage $V_{OPP}2$ being supplied to the second accumulation control line 32b in the charge accumulation period of the imaging cell 10Hy belonging to the same row as the row of the imaging cell 10Hx. The opposite electrode voltage applied to the opposite electrode in the charge accumulation is made different between the imaging cell 10Hx and the imaging cell 10Hy, and thus the potential of the opposite electrode 62x of the imaging cell 10Hx, and the potential of the opposite electrode 62y of the imaging cell 10Hy can be made different in the charge accumulation. When a common reset voltage is used as in this example, the bias voltage applied to the photoelectric conversion structure 64 in the charge accumulation can be made different between the imaging cell 10Hx and the imaging cell 10Hy. Consequently, the sensitivity of the imaging cell 10Hx and the sensitivity of the imaging cell 10Hy can be made different.

In this manner, separation of the opposite electrode 62 between the imaging cell 10Hx and the imaging cell 10Hy allows the opposite electrode voltages with different absolute values to be independently applied to the opposite electrode 62x of the imaging cell 10Hx and the opposite electrode 62y of the imaging cell 10Hy. Similarly to Embodiment 1, the sensitivity of the imaging cell can be made different, for instance, on a row-by-row basis, a column-by-column basis, or imaging cell-by-imaging cell basis by independently applying the opposite electrode voltages with different absolute values to the opposite electrode 62x and the opposite electrode 62y.

For instance, by applying photolithography, the opposite electrode 62x of the imaging cell 10Hx and the opposite electrode 62y of the imaging cell 10Hy can be formed with spatially separated, and these opposite electrodes can be electrically separated. For instance, multiple opposite electrodes may be formed in which the imaging cells are spatially separated column by column. In this case, multiple strip-shaped opposite electrodes each extending in the column direction are arranged in the row direction, and the first accumulation control line 32a and the second accumulation control line 32b may be alternately connected to these multiple opposite electrodes. Specifically, the imaging cells 10Hx and 10Hy are disposed in, for instance, the odd columns and the even columns of the pixel array PA, respectively, and different opposite electrode voltages may be applied to the odd columns and the even columns of the pixel array PA. In this case, an output, in which an image signal from an imaging cell with a certain sensitivity, and an image signal from an imaging cell with a relatively high sensitivity are interleaved column by column, is obtained. Alternatively, the opposite electrodes may be electrically separated row by row in the multiple imaging cells. In this case, multiple strip-shaped opposite electrodes each extending in the row direction are arranged in the column direction, and the first accumulation control line 32a and the second accumulation control line 32b may be alternately connected to these multiple opposite electrodes. The latter is more advantageous than the former from the viewpoint of reduction in the number of wires per row.

In the latter case, specifically, when the opposite electrodes are electrically separated row by row in the multiple imaging cells, and multiple opposite strip-shaped electrodes each extending in the row direction are formed, the imaging cells 10Hx and 10Hy are adjacent to each other in the column direction. Therefore, in this case, the start timing of the charge accumulation period of the imaging cell 10Hx does not match the start timing of the charge accumulation period of the imaging cell 10Hy. For instance, when a rolling shutter operation is applied, the start timing of the charge accumulation period of the imaging cell 10Hx belonging to a certain row may not match the start timing of the charge accumulation period of the imaging cell 10Hx belonging to another row. However, for instance, the vertical signal line 34 is independently connected to the imaging cell 10Hx and the imaging cell 10Hy that are adjacent in the column direction, and thus the start timings of the charge accumulation periods between these imaging cells can be matched.

Needless to say, the opposite electrode 62 may be separated and provided for each imaging cell. The opposite electrode 62 may be separated and formed for each imaging cell by patterning, and an accumulation control line may be separately connected to the opposite electrode 62 of each imaging cell. Thus, the potential difference Φ between the pixel electrode 61 and the opposite electrode 62 can be made different on an imaging cell-by-imaging cell basis.

The voltage supply circuit 41 may be configured to switch between multiple voltages with different absolute values and to allow a voltage to be applied to the accumulation control line. For instance, the opposite electrode voltages $V_{OPP}1$ and $V_{OPP}2$ to be supplied to the first accumulation control line 32a and the second accumulation control line 32b, respectively in a period other than the charge accumulation period may be the same. In a period other than the charge accumulation period (for instance, a period for reset), an opposite electrode voltage $V_{OPP}$ substantially equivalent to the reset voltage $V_{RST}$ may be applied in common to the first accumulation control line 32a and the second accumulation control line 32b. Consequently, in the period, the first bias voltage V1 applied to the photoelectric conversion structure 64 of the imaging cell 10Hx, and the second bias voltage V2 applied to the photoelectric conversion structure 64 of the imaging cell 10Hy can be a value near 0 V. As described above, a state with sensitivity of nearly zero can be achieved by making the potential difference Φ nearly 0 V, the potential difference Φ being applied across a pair of electrodes by which the photoelectric conversion structure is interposed. In other words, a state with a shutter closed can be electrical control.

For the configuration illustrated to FIG. 14, Embodiment 1 and/or another example described later may be combined. For instance, in the configuration described with reference to FIG. 1, the opposite electrodes may be electrically separated row by row in the multiple imaging cells 10A. In this case, multiple strip-shaped opposite electrodes each extending in the column direction are formed. The first accumulation control line 32a and the second accumulation control line 32b may be alternately connected to the multiple opposite electrodes. A case is assumed in which an operation of applying different reset voltages $V_{RST}$ to the multiple imaging cells 10A row by row is used as illustrated in FIG. 14. In a period other than the charge accumulation period, an opposite electrode voltage $V_{OPP}$, which causes the potential difference Φ between the pixel electrode 61 and the opposite electrode 62 to assume 0 V, may be applied to each of the opposite electrode 62 of the imaging cells 10A in the odd rows, and the opposite electrode 62 of the imaging cells 10A in the even rows. With such an operation, a shutter period in which charges are not substantially moved between the pixel electrode 61 and the photoelectric conversion structures 64 can be provided between a frame period and the subsequent frame period.

Embodiment 3

Figure 15:
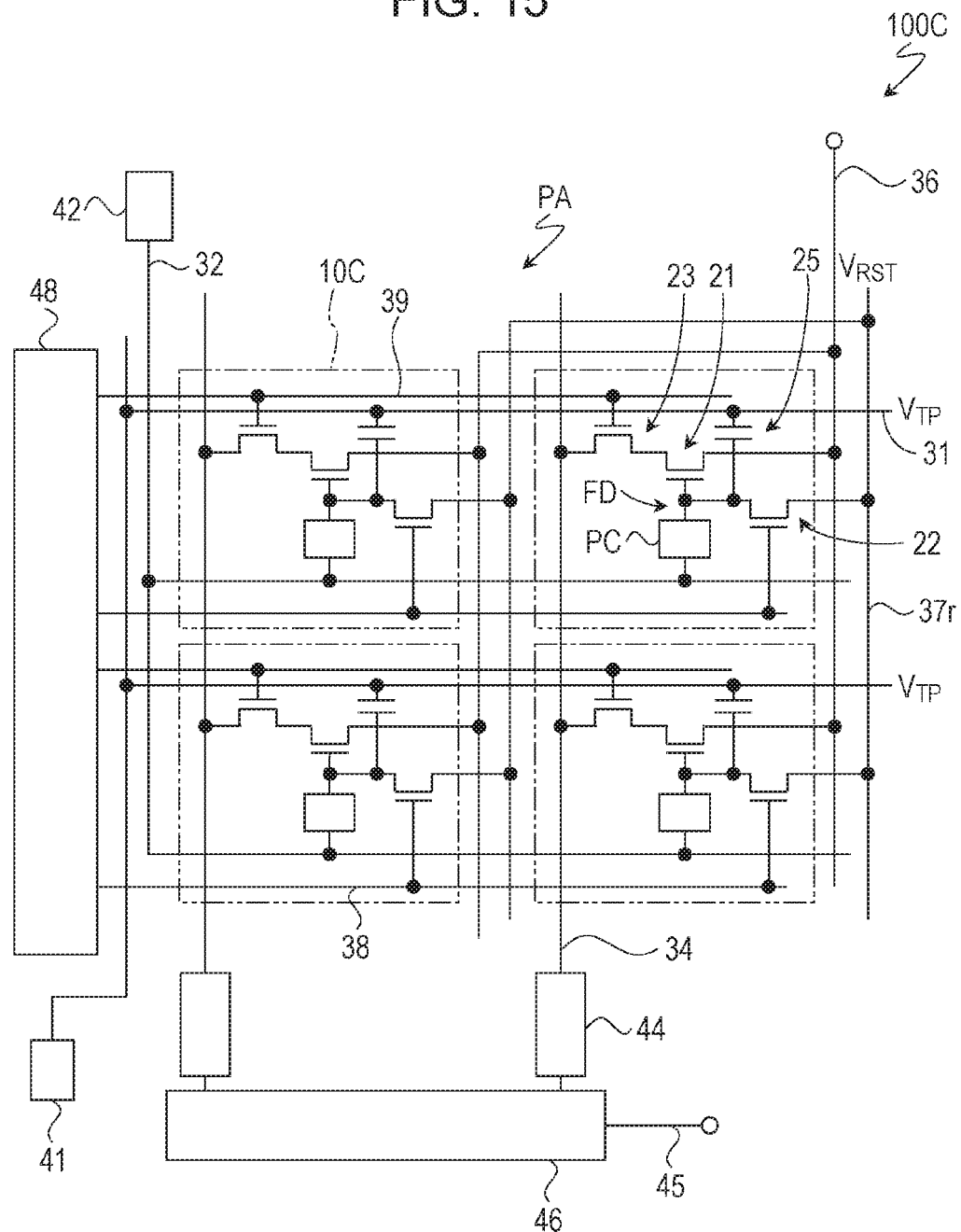
FIG. 15 is a diagram illustrating an exemplary circuit configuration of an imaging device according to Embodiment 3 of the present disclosure.

FIG. 15 illustrates an exemplary circuit configuration of an imaging device according to Embodiment 3 of the present disclosure. In contrast to the above-described imaging device 100A, an imaging device 100C illustrated in FIG. 15 has imaging cells 100 instead of the imaging cells 10A.

Each of the imaging cell 100 has a capacitor 25 in which one of the electrodes is connected to the charge accumulation node FD. In this instance, the source of reset transistor 22 is connected to a reset voltage line 37r that supplies a predetermined reset voltage $V_{RST}$. The first signal line 31 is connected to the other electrode of the capacitor 25. In the configuration illustrated to FIG. 15, at the time of operation of the imaging device 100C, the voltage supply circuit 41 applies an offset voltage $V_{TP}$ to the first signal line 31.

Figure 16:
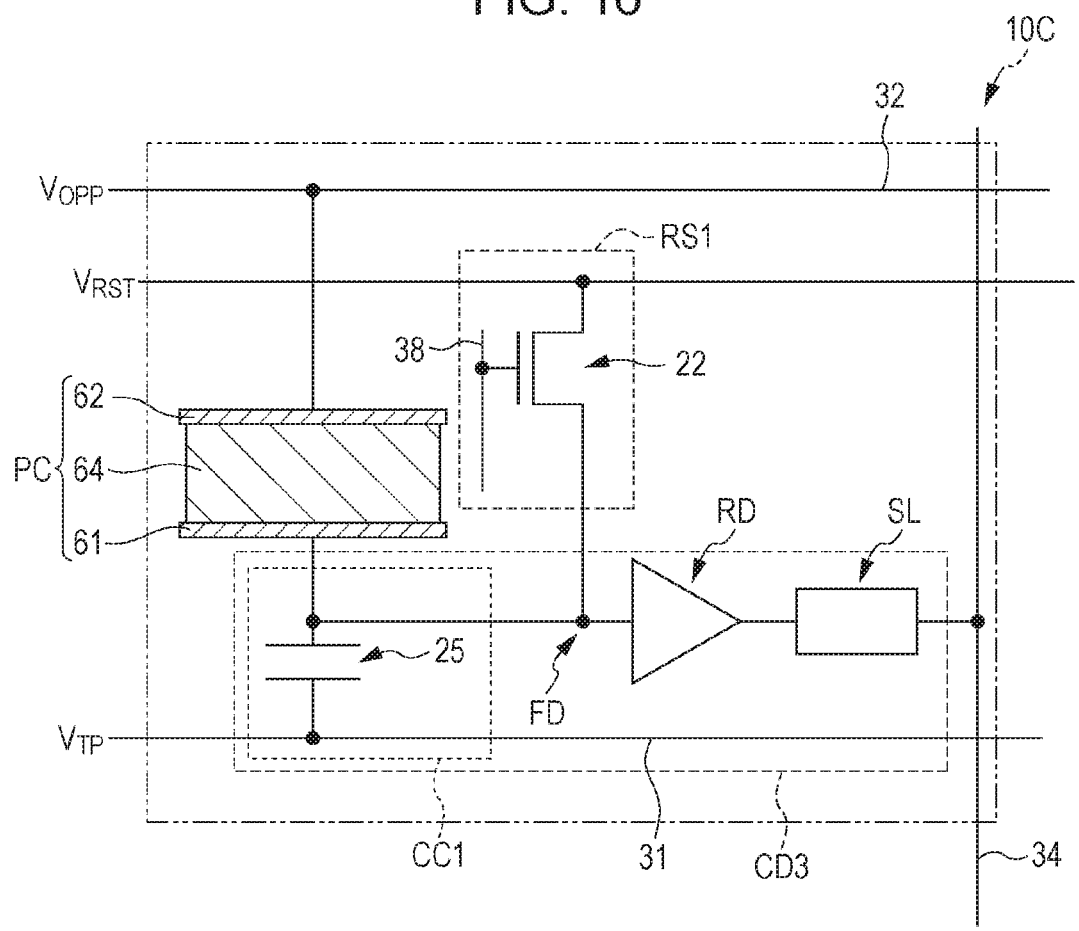
FIG. 16 is a diagram illustrating an overview of a circuit configuration of one imaging cell taken from imaging cells in the pixel array.

FIG. 16 illustrates an overview of the circuit configuration of one imaging cell 100C in the pixel array PA. As schematically illustrated in FIG. 16, a charge detector CD3 of the imaging cell 100 includes a capacitive circuit CC1 connected between the pixel electrode 61 and the first signal line 31. In the configuration illustrated to FIG. 16, the capacitive circuit CC1 has the above-described capacitor 25, and the first signal line 31 is electrically coupled to the charge accumulation node FD via the capacitor 25.

As illustrated in FIG. 16, the first signal line 31 and the pixel electrode 61 are electrically coupled to each other via the capacitor 25. With such a configuration also, the potential of the pixel electrode 61 can be changed by switching a voltage applied to the first signal line 31. For instance, it is assumed that after the potential of the charge accumulation node FD is reset, the reset transistor 22 is turned off, and accumulation of signal charges is started by switching the offset voltage $V_{TP}$ from the low-level voltage $V_L$ to the high-level voltage $V_H$. In this case, when the offset voltage $V_{TP}$ is changed from the voltage $V_L$ to the voltage $V_H$, the voltage of the charge accumulation node FD changes from voltage $V_{RST}$ immediately after the reset, due to the electrical coupling between the first signal line 31 and the charge accumulation node FD via the capacitor 25. The amount of change in the voltage of charge accumulation node FD at this point is determined as follows.

Let $C_{FD}$ be the capacitive value of the charge accumulation node, C1 be the capacitive value of the capacitor 25, and $V_{RST}$ be the voltage of the charge accumulation node FD immediately after the reset. In this situation, the charge quantity Q accumulated in the charge accumulation node FD immediately before the switching of the offset voltage $V_{TP}$ can be expressed by $Q=C_{FD}V_{RST}-C1(V_L-V_{RST})$. On the other hand, let $V_{FD}$ be the voltage of the charge accumulation node FD immediately after the switching of the offset voltage $V_{TP}$ to the voltage $V_H$, then $Q=C_{FD}V_{FD}-C1(V_H-V_{FD})$ holds. When an equation is formed by equating these right-hand sides because of the condition of charge neutrality, and the equation is solved for $V_{FD}$, $V_{FD}=(C1/(C1+C_{FD}))(V_H-V_L)+V_{RST}$ is obtained. Thus, the amount of change in the voltage of the charge accumulation node FD by switching the offset voltage $V_{TP}$ from the voltage $V_L$ to the voltage $V_H$ is expressed by the following Expression (1).

$$(C1/(C1+C_{FD}))(V_H-V_L) \qquad (1)$$

When a capacitive value C1 of the capacitor is sufficiently large with respect to $C_{FD}$, from the above-mentioned Expression (1), Expression (1) approximately gives ($V_H-V_L$). Thus, it is found that the voltage $V_{FD}$ of the charge accumulation node FD is changed by the switching of the offset voltage $V_{TP}$ by an amount approximately equal to ($V_H-V_L$) which is the change in the offset voltage $V_{TP}$.

With the electrical coupling via the capacitor, the change in the voltage applied to the first signal line 31 is accompanied by the above-described changed in the potential of the pixel electrode 61. When the voltage applied to the first signal line 31 is returned to the original voltage, the potential of the pixel electrode 61 is also returned to the voltage before the change of the voltage applied to the first signal line 31. That is, it is possible to change the potential of the pixel electrode 61 by changing the voltage applied to the first signal line 31 without affecting the charge quantity accumulated in the charge accumulation node FD. Thus, for instance, in the charge accumulation period in a frame period, an offset voltage $V_{TP}$, which is higher than in other periods, may be applied to the first signal line 31. Thus, in the charge accumulation period out of the period excluding a shutter period, it is possible to temporarily increase the potential of the pixel electrode 61. Thus, the potential difference Φ between the pixel electrode 61 and the opposite electrode 62 can be selectively reduced in the charge accumulation period, and the sensitivity of the imaging cell 100 can be changed.

With the electrical coupling via the capacitor, the voltage applied to the first signal line 31 can be returned to the original voltage level in a signal read period. Therefore, even when a relatively high voltage is used as the offset voltage $V_{TP}$ applied to the first signal line 31 in the charge accumulation period, a signal can be read from each imaging cell without changing the power supply voltage, and thus the flexibility of design of the imaging device is improved. In short, a higher power supply voltage is not necessary in a read period.

The capacitor 25 may have a metal-insulator-semiconductor (MIS) structure. The capacitor 25 may have a metal-insulator-metal (MIM) structure, for instance, in the interlayer insulation layer 52. The MIM structure refers to a structure in which a dielectric substance is interposed between two electrodes which are composed of a metal or a metal compound. For instance, $SiO_2$, $Al_2O_3$, $SiN$, $HfO_2$, $ZrO_2$ may be used as the dielectric substance interposed between two electrodes. Alternatively, the capacitor 25 may have a structure in which a parasitic capacitance between wires is intentionally utilized. In this case, the capacitive value of the parasitic capacitance between the first signal line 31 and the charge accumulation node FD has a significantly large value compared with the capacitive value of the charge accumulation node FD. The capacitor 25 may include two or more capacitors.

Figure 17:
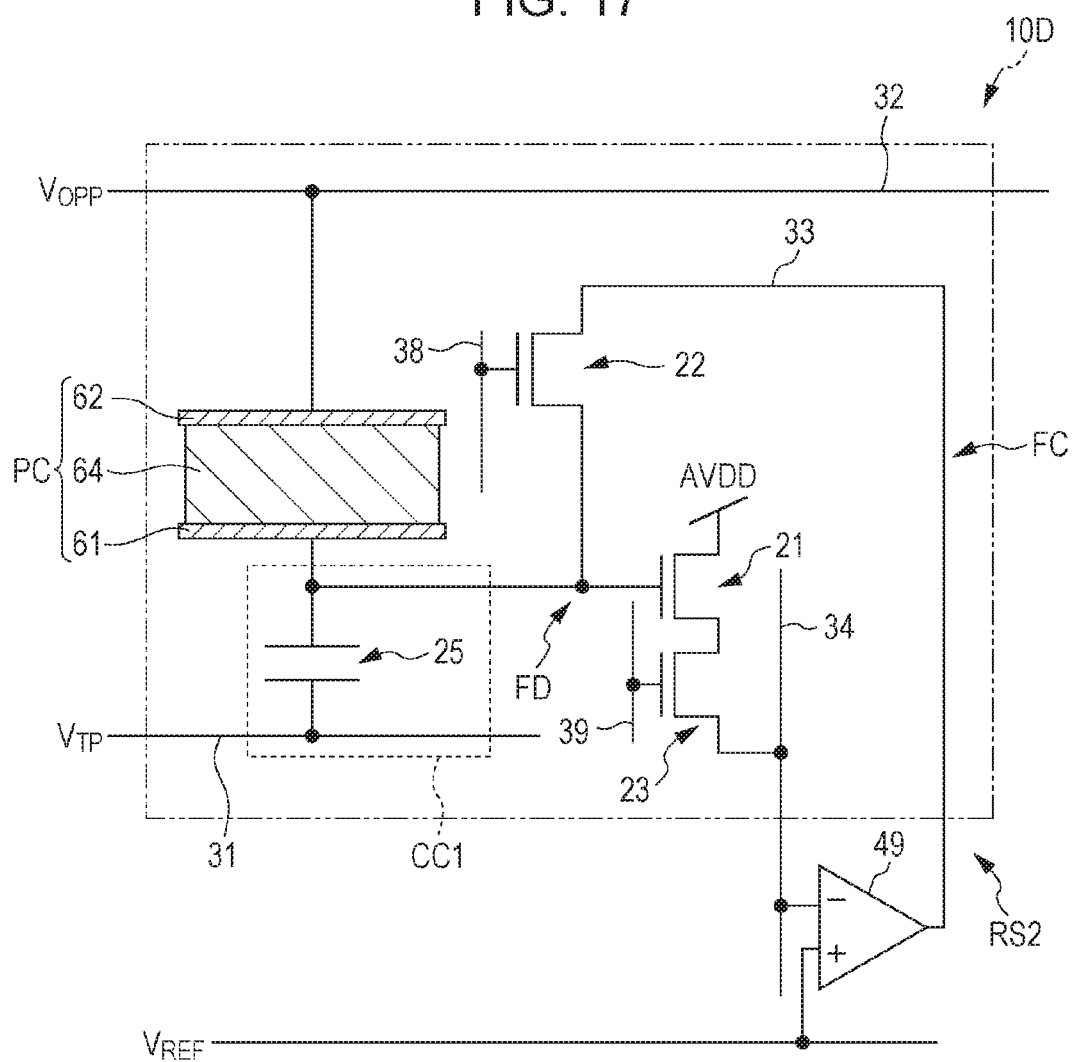
FIG. 17 is a diagram illustrating a variation of the circuit configuration of the imaging cell.

FIG. 17 illustrates a variation of the circuit configuration of the imaging cell. An imaging cell 10D illustrated in FIG. 17 has the capacitive circuit CC1 including the capacitor 25, and the feedback circuit FC described with reference to FIG. 12. The electrical coupling between the first signal line 31 and the pixel electrode 61 via the capacitor 25 allows the potential of the pixel electrode 61 to be temporarily increased (or decreased) in the charge accumulation period out of the period excluding a shutter period, for instance.

Embodiment 4

Figure 18:
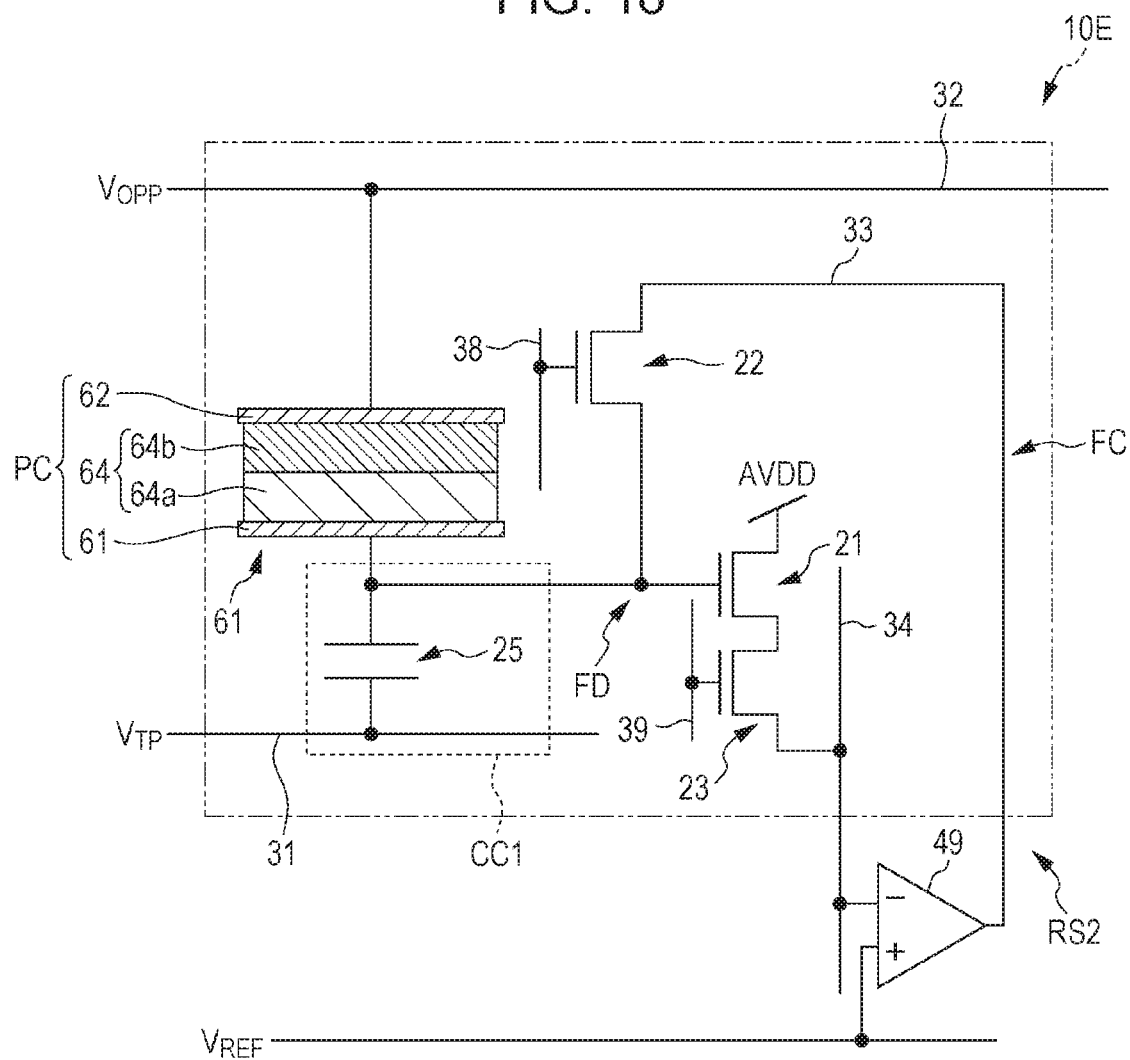
FIG. 18 is a diagram illustrating an exemplary circuit configuration of an imaging cell of an imaging device according to Embodiment 4 of the present disclosure.

FIG. 18 illustrates an exemplary circuit configuration of an imaging cell of an imaging device according to Embodiment 4 of the present disclosure. The point of difference between an imaging cell 10E illustrated in FIG. 18, and the imaging cell 10D described with reference to FIG. 17 is that the photoelectric conversion structure 64 of the photoelectric converter PC of the imaging cell 10E includes a multilayer structure having the first photoelectric conversion layer 64a and the second photoelectric conversion layer 64b.

The first photoelectric conversion layer 64a and the second photoelectric conversion layer 64b include the first material and the second material, respectively. A photoelectric conversion structure having sensitivity of a desired wavelength range can be implemented by using appropriate materials as the first material and the second material according to a wavelength range to be detected. For instance, a material having a high absorption coefficient in the visible range and a material having a high absorption coefficient in the infrared range may be used as the first material and the second material, respectively. An electron-donating material is typically selected as the first material and the second material. In the present description, the infrared range refers to a wavelength range of approximately 750 nm or greater, and particularly, near-infrared range refers to a wavelength range of 750 nm or greater and less than 2500 nm, for instance.

For instance, the impedance of the first photoelectric conversion layer 64a is greater than the impedance of the second photoelectric conversion layer 64b. Or, the ionization potential of the first material is greater than the ionization potential of the second material by 0.2 eV or more. The impedances of the first photoelectric conversion layer 64a and the second photoelectric conversion layer 64b may satisfy the above-mentioned relationship, or the ionization potentials of the first material and the second material may satisfy the above-mentioned relationship. In this case, the spectral sensitivity characteristic of the photoelectric conversion structure can be changed by changing the potential difference Φ between the pixel electrode 61 and the opposite electrode 62.

For instance, by changing the potential difference Φ between the pixel electrode 61 and the opposite electrode 62, it is possible to switch between a state where the imaging cell 10E selectively has sensitivity in a wavelength range of visible light, and a state where the imaging cell 10E selectively has sensitivity in a wavelength range of infrared light in addition to a wavelength range of visible light. The details of photoelectric conversion structure, which allows the spectral sensitivity characteristic to be modulated according to potential difference Φ, will be described later.

More diverse functions can be achieved by adopting a photoelectric conversion structure that includes a multilayer structure having the first photoelectric conversion layer 64a and the second photoelectric conversion layer 64b. When a photoelectric conversion structure including a multilayer structure having the first photoelectric conversion layer 64a and the second photoelectric conversion layer 64b is adopted, it is advantageous if the above-described voltage supply circuit 41 is configured to switch between three voltages and to allow a voltage to be applied.

Figure 19:
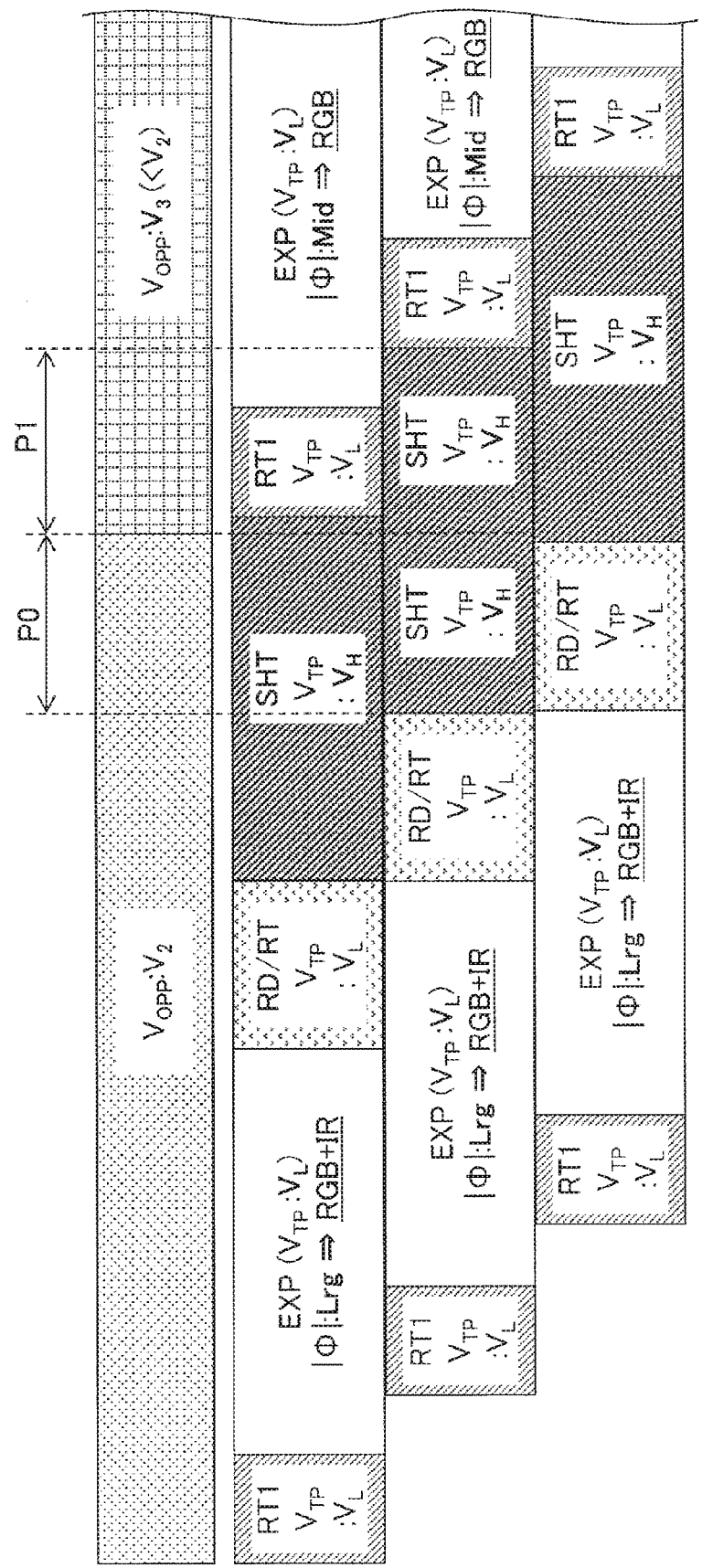
FIG. 19 is a diagram for explaining an instance of the operation of the imaging device to which an imaging cell illustrated in FIG. 18 is applied.

FIG. 19 illustrates an instance of the operation of the imaging device to which the imaging cell 10E illustrated in FIG. 18 is applied. The instance illustrated in FIG. 19 is an application instance utilizing a rolling shutter operation. In the instances described so far, a substantially constant voltage is applied as the opposite electrode voltage $V_{OPP}$. However, at the time of operation of the imaging device, the opposite electrode voltage $V_{OPP}$ does not have to be fixed at a certain level. Here, it is assumed that the voltage supply circuit 42 connected to the accumulation control line 32 is configured to switch between multiple voltages with different absolute values and to allow a voltage to be applied. The voltage supply circuit 42 is configured to switch between multiple voltages with different absolute values and to allow a voltage to be applied, and thus a circuit having a simpler configuration can used as the voltage supply circuit 41.

In this instance, in the first frame period, the voltage supply circuit 42 applies a certain voltage $V_2$ to the accumulation control line 32 as the opposite electrode voltage $V_{OPP}$. In the subsequent frame period, the voltage supply circuit 42 applies another voltage $V_3$ different from the voltage $V_2$ to the accumulation control line 32 as the opposite electrode voltage $V_{OPP}$. In other words, between the two frame periods illustrated in FIG. 19, the voltage supply circuit 42 switches the voltage applied to the accumulation control line 32 connected to the opposite electrode 62. Here, it is assumed that the relationship of voltage $V_3$<voltage $V_2$ holds between the voltage $V_2$ and the voltage $V_3$. The voltage $V_2$ is a voltage such that for instance, when the high-level voltage $V_H$ is applied to the first signal line 31, the potential difference between the pixel electrode 61 and the opposite electrode 62 is 0 V.

In the instance illustrated in FIG. 19, the voltage supply circuit 41 applies one of the high-level voltage $V_H$ and the low level voltage $V_L$ to the first signal line 31 as the offset voltage $V_{TP}$. When attention is focused on the charge accumulation period included in the first frame period, the absolute value of the potential difference Φ is high to some extent, and the imaging cell 10E has sensitivity in the wavelength ranges of visible light and infrared light. "|Φ|: Lrg" in FIG. 19 indicates that the potential difference Φ is relatively high.

When attention is focused on the charge accumulation period included in the subsequent frame period, the absolute value of potential difference Φ is reduced due to the relationship of voltage $V_3$<voltage $V_2$, and the imaging cell 10E selectively has sensitivity in the wavelength range of visible light. "|Φ|: Mid" in FIG. 19 indicates that the absolute value of potential difference Φ is relatively small as compared with a state where the voltage $V_2$ is applied to the accumulation control line 32. In this manner, the voltage applied to the opposite electrode 62 is changed between different frames. Thus, the voltage applied to the first signal line 31 is used common to the charge accumulation periods of different frames, and an image signal based on visible light and infrared light can be obtained in a frame period, and an image signal based on visible light can be obtained in another frame period.

In the instance illustrated, between the first frame period and the subsequent frame period, the high-level voltage $V_H$ is applied to the first signal line 31. In a state where the voltage $V_2$ is applied to the accumulation control line 32 as the opposite electrode voltage $V_{OPP}$, the potential difference Φ can be made closer to 0, and the sensitivity of the imaging cell 10E can be made substantially 0 by applying the high-level voltage $V_H$ to the first signal line 31 as the offset voltage $V_{TP}$. However, when the opposite electrode voltage $V_{OPP}$ is switched to the voltage $V_3$, and the absolute value of potential difference Φ is increased, and accumulation or discharge of signal charges may occur. The period indicated by a double-headed arrow P0 in FIG. 19 is a period in which the sensitivity of the imaging cells 10E belonging to the second row is substantially 0, and the period indicated by a double-headed arrow P1 is a period in which the sensitivity of the imaging cells 10E belonging to the second row is not substantially 0. Therefore, in the instance illustrated in FIG. 19, before the start of a charge accumulation period, an electronic shutter (indicated by the rectangle RT1) for discharging charges from a charge accumulation region is operated again.

The offset voltage $V_{TP}$ applied to the first signal line 31 may be switched between multiple voltages with different absolute values in the charge accumulation period according to a frame. With this control, an image signal based on visible light and infrared light can be obtained in a frame period, and an image signal based on visible light can be obtained in another frame period.

In the instance illustrated in FIG. 19, the opposite electrode voltage $V_{OPP}$ is switched between frame periods, however, similarly to the instances described so far, the opposite electrode voltage $V_{OPP}$ may be fixed to a constant value. The opposite electrode voltage $V_{OPP}$ is fixed to constant value, and the offset voltage $V_{TP}$ applied to the first signal line 31 may be switched between the voltages $V_H$ and $V_L$ between frame periods. Also with this control, similarly to the instance described with reference to FIG. 19, an image signal based on visible light and infrared light can be obtained in a frame period, and an image signal based on visible light can be obtained in another frame period. It is to be noted that in this case, a period in which the offset voltage $V_{TP}$ is switched to voltage $V_H$ and an electronic shutter (indicated by rectangle the RT1) period between two consecutive charge accumulation periods are omissible.

Embodiment 5

Figure 20:
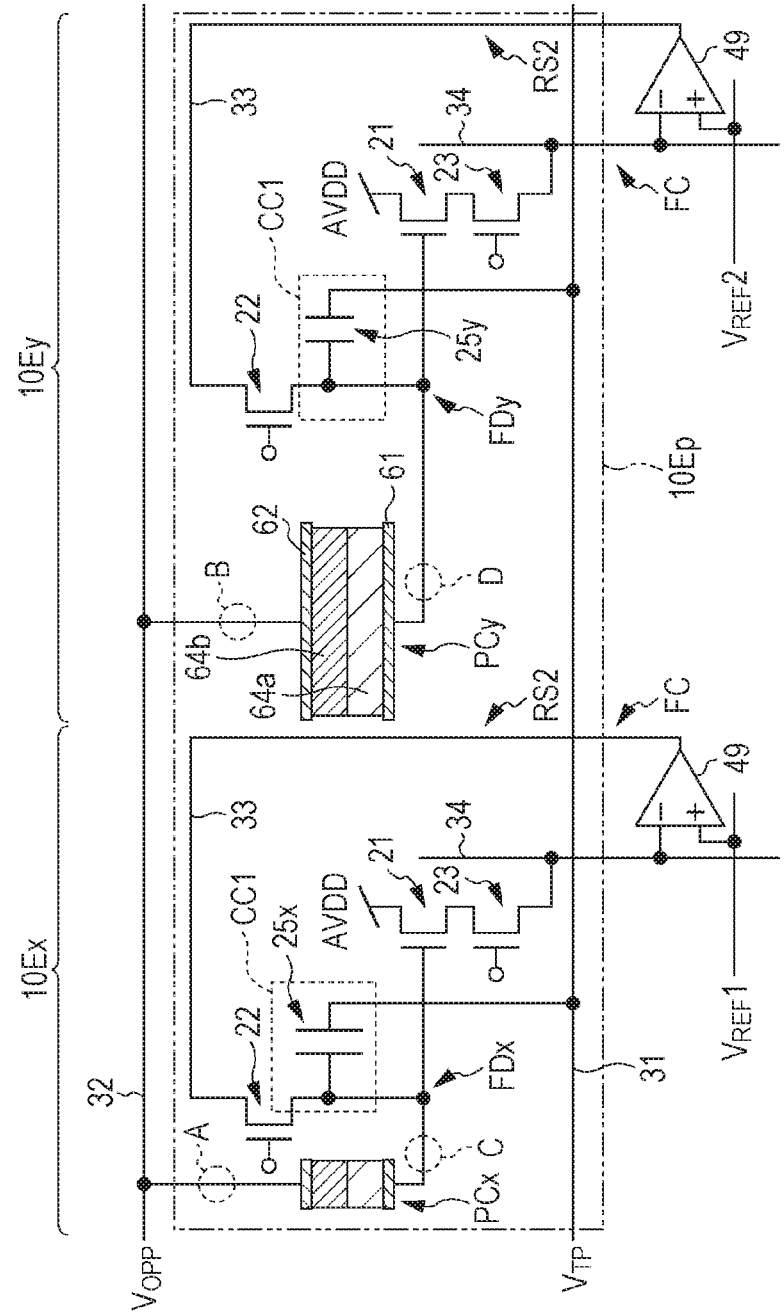
FIG. 20 is a diagram illustrating an exemplary circuit configuration of a pixel array of an imaging device according to Embodiment 5 of the present disclosure.

FIG. 20 illustrates an exemplary circuit configuration of a pixel array of an imaging device according to Embodiment 5 of the present disclosure. FIG. 20 schematically illustrates two adjacent imaging cells 10Ex and 10Ey in the row direction among multiple imaging cells included in the pixel array PA. The pixel array PA of the imaging device according to Embodiment 5 has a repetitive structure in which a unit such as a cell pair 10Ep including the two imaging cells 10Ex and 10Ey is repeated.

In FIG. 20, the circuit configuration of the imaging cells 10Ex and 10Ey is essentially the same as the circuit configuration of the imaging cell 10E described with reference to FIG. 18. However, a capacitor 25x in the capacitive circuit CC1 of the imaging cell 10Ex and a capacitor 25y in the capacitive circuit CC1 of the imaging cell 10Ey have different capacitive values.

In the configuration illustrated to FIG. 20, the capacitor 25x of the capacitive circuit CC1 of the imaging cell 10Ex and the capacitor 25y of the capacitive circuit CC2 of the imaging cell 10Ey are both connected to the first same signal line 31. Therefore, change in the potential of the side of the electrode, connected to the first signal line 31 is in common with the capacitor 25x and the capacitor 25y. However, here, the capacitive value of the capacitor 25x of the imaging cell 10Ex and the capacitive value of the capacitor 25y of the imaging cell 10Ey are different from each other. Therefore, even though the change in the offset voltage $V_{TP}$ is in common, the change in the voltage of the charge accumulation node is different between the imaging cells 10Ex and 10Ey. Hereinafter, this point will be described.

First, it is assumed that in a reset period and a signal read period, the low-level voltage $V_L$ is applied to the first signal line 31 as the offset voltage $V_{TP}$, and also in a charge accumulation period, the low-level voltage $V_L$ is applied to the first signal line 31. Here, the opposite electrode voltage $V_{OPP}$ is set to a constant value. Therefore, in the time of operation of the imaging device, the potential (potential of point A illustrated in FIG. 20) of the opposite electrode 62 of the imaging cell 10Ex is equal to the potential (potential of point B illustrated in FIG. 20) of the opposite electrode 62 of the imaging cell 10Ey.

Before photographing, the potentials of the charge accumulation node FDx of the imaging cell 10Ex and the charge accumulation node FDy of the imaging cell 10Ey are reset. As already described, the voltage level of the pixel electrode 61, that gives a level of image signal at a dark time is dependent on and determined by the reference voltage $V_{REF}$ applied to the inverting amplifier 49. In this instance, the reference voltage $V_{REF}1$ is applied to the non-inverting input terminal of the inverting amplifier 49 of the imaging cell 10Ex, and the reference voltage $V_{REF}2$ is applied to the non-inverting input terminal of the inverting amplifier 49 of the imaging cell 10Ey. The reference voltages $V_{REF}1$ and $V_{REF}2$ may be the same or may be different from each other. For instance, it is also possible to equalize the potential (potential of point C illustrated in FIG. 20) of the charge accumulation node FDx after the reset, and the potential (potential of point D illustrated in FIG. 20) of the charge accumulation node FDy after the reset by adjusting the reference voltages $V_{REF}1$ and $V_{REF}2$. Here, for the sake of simplicity, it is assumed that the voltages of the charge accumulation node FDx and the charge accumulation node FDy after the reset are the same voltage Vr.

In the charge accumulation period, the low-level voltage $V_L$ is applied to the 1st signal line 31. Therefore, in the charge accumulation period, the potential difference Φ between the pixel electrode 61 and the opposite electrode 62 is relatively high. Thus, in this instance, each of the imaging cells 10Ex and 10Ey has sensitivity to the wavelength range of infrared light in addition to the wavelength range of visible light, for instance.

Next, it is assumed that in a reset period and a signal read period, the low-level voltage $V_L$ is applied to the first signal line 31 as the offset voltage $V_{TP}$, and in the charge accumulation period, an intermediate level voltage $V_M$ is applied to the first signal line 31. Let Cx and Cy be the capacitive values of the capacitors 25x and 25y, respectively, then the change in the voltage of the charge accumulation nodes FDx and FDy by switching of the offset voltage $V_{TP}$ is expressed by the following Expressions (2) and (3) derived from Expression (1):

$$(Cx/(Cx+C_{FD}))(V_M-V_L) \quad (2)$$

$$(Cy/(Cy+C_{FD}))(V_M-V_L) \quad (3)$$

Here, assume that the capacitive value Cx of the capacitor 25x of the imaging cell 10Ex is sufficiently large with respect to $C_{FD}$, the change in the charge accumulation node FDx by switching of the offset voltage $V_{TP}$ is approximately equal to $(V_M-V_L)$. The voltage applied to the photoelectric conversion structure 64 is the difference between the potential of the opposite electrode voltage $V_{OPP}$ and the potential of the charge accumulation node FD. Thus, in the imaging cell 10Ex in which the capacitive value Cx of the capacitor 25x is sufficiently larger than the capacitive value $C_{FD}$ of the charge accumulation node FD, the potential difference Φ applied to the photoelectric conversion structure can be reduced to approximately the amount of change $\Delta V_{TP}=(V_M-V_L)$ in the offset voltage applied to the first signal line 31.

In contrast, when the capacitive value Cy of the capacitor 25y of the imaging cell 10Ey is smaller than the capacitive value Cx of the capacitor 25x, and is approximately equal to the $C_{FD}$, for instance, the amount of change in the voltage of the charge accumulation node FDy is approximately only half of $(V_M-V_L)$. When the capacitive value Cy is sufficiently smaller than the $C_{FD}$, it is found from Expression (3) that even if the offset voltage $V_{TP}$ is changed, the voltage of the charge accumulation node FDy hardly changes.

Like this, with the configuration in which the first signal line 31 is electrically coupled to the pixel electrode 61 via the capacitor, by changing the capacitive value of the capacitor between imaging cells, the change in the potential difference Φ between the pixel electrode 61 and the opposite electrode 62 can be made different between two imaging cells while the offset voltage $V_{TP}$ applied to the first signal line 31 is used in common. It is to be noted that reducing the capacitive value of the capacitor interposed between the first signal line 31 and the pixel electrode 61 is advantageous for miniaturization of pixel size. On the other hand, interposing a capacitor having a larger capacitive value between the first signal line 31 and the pixel electrode 61 allows the potential of the charge accumulation node FD to be changed by switching the voltage applied to the first signal line 31 without unnecessarily increasing the amount of change in the voltage applied to the first signal line 31.

Also, with this configuration, the change in the potential difference Φ between the pixel electrode 61 and the opposite electrode 62 can be made different between multiple imaging cells with the complexity of the configuration and wiring of the voltage supply circuit being avoided. Therefore, it is possible to achieve a state in which the photoelectric converter PCx of the imaging cell 10Ex has sensitivity in the wavelength range of visible light, and the photoelectric converter PCy of the imaging cell 10Ey also has sensitivity to the wavelength range of infrared light in addition to the wavelength range of visible light by switching the offset voltage $V_{TP}$ while the offset voltage $V_{TP}$ applied to the first signal line 31 is used in common, for instance.

For instance, it is assumed that the pixel array PA has a repetitive structure in which a unit formed by the cell pair 10Ep including the two imaging cells 10Ex and 10Ey is repeated, and the imaging cells 10Ex and 10Ey are alternately arranged in the row direction and the column direction. At this point, when the offset voltage $V_{TP}$ applied to the first signal line 31 is changed from a low-level to a high-level, for instance, the potential difference Φx applied to the photoelectric conversion structure 64 of the imaging cell 10Ex is reduced, whereas the potential difference Φy applied to the photoelectric conversion structure 64 of the imaging cell 10Ey hardly changes. In this case, due to the reduction of the potential difference Φx applied to photoelectric conversion structure 64, the photoelectric converter PCx of the imaging cell 10Ex substantially loses sensitivity to infrared light, and the imaging cell 10Ex selectively has sensitivity to the wavelength range of visible light. In contrast, the imaging cell 10Ey still has sensitivity to the wavelength range of infrared light in addition to the wavelength range of visible light. Therefore, similarly to the instance described with reference to FIG. 7, it is possible to achieve a state in which the imaging cells having different sensitivities (sensitivities to infrared light in this instance) are alternately arranged in the row direction and the column direction. In other words, the imaging cells with different spectral sensitivity characteristics can be mixed in the pixel array PA while the offset voltage $V_{TP}$ applied to the first signal line 31 is used in common. Therefore, it is possible to collectively obtain image signals based on light with different wavelength ranges.

According to Embodiments of the present disclosure, it is possible to form an image based on visible light and infrared light from an image signal obtained by one of two imaging cells with different potential differences Φ to be applied to the photoelectric conversion structure 64 in the charge accumulation period. In addition, it is possible to form an image based on visible light from an image signal obtained by the other of the two imaging cells. Furthermore, it is also possible to form an image based on infrared light by calculating the difference between the levels of output signals of these imaging cells. Each of these images is formed from an image signal based on the amount of signal charges accumulated in the same charge accumulation period, and thus synchronization is guaranteed. Therefore, even when a high-speed moving object is photographed, blur does not occur in the image based on the difference. This point is different from the case where the spectral sensitivity characteristic of the imaging cell is changed between two frames, and multiple image signals based on light with different wavelength ranges are successively obtained.

In this manner, with configuration illustrated in FIG. 20, an image based on visible light can be formed from the image signal obtained by the imaging cell 10Ey, and an image based on visible light and infrared light can be formed from the image signal obtained by the imaging cell 10Ex, for instance. Also, it is possible to form an image based on infrared light by calculating the difference between the level of the output signal of imaging cell 10Ex and the level of the output signal of imaging cell 10Ey. In short, a state similar to the control state illustrated in FIG. 7 can be achieved by a simpler configuration. In particular, when the pixel array PA is formed as a repetitive structure in which the cell pair 10Ep including the imaging cell 10Ex and 10Ey having capacitors with different capacitive values is repeated, imaging cells with different spectral sensitivity characteristics can be arranged uniformly in the pixel array PA, and thus it is advantageous for color resolution.

As is seen from Expressions (2) and (3), the above-mentioned effect is achieved when the ratio of the capacitive value of the capacitor that electrically couples the first signal line 31 and the pixel electrode 61 with respect to the capacitive value of the charge accumulation node is different between the imaging cells. Therefore, it is not required that the capacitive value of the capacitor that electrically couples the first signal line 31 and the pixel electrode 61 is made different between adjacent imaging cells. For instance, the capacitive value of the capacitor that electrically couples the first signal line 31 and the pixel electrode 61 may be made common between the multiple imaging cells, and the capacitive value of the charge accumulation node may be made different between the multiple imaging cells.

In the configuration illustrated to FIG. 20, the photoelectric converter PCy of the imaging cell 10Ey has a larger electrode surface area than the photoelectric converter PCx of the imaging cell 10Ex has. The photoelectric converter itself has a capacitive, and in the instance illustrated in FIG. 20, the photoelectric converter PCy of the imaging cell 10Ey has a larger capacitive value for the entire charge accumulation region than the photoelectric converter PCx of the imaging cell 10Ex has. Therefore, it can be said that the imaging cell 10Ey is less affected by switching of the voltage applied to the first signal line 31. Needless to say, the electrode surface area of the photoelectric converter PCx and the electrode surface area of the photoelectric converter PCy may be equal.

The photoelectric converter PCy of the imaging cell 10Ey has a relatively large electrode surface area, and the capacitive value of the capacitor 25y is relatively small. Therefore, it can be said that the imaging cell 10Ey has a high conversion gain, and a high sensitivity. In contrast, the photoelectric converter PCx of the imaging cell 10Ex has a smaller electrode surface area than that of the photoelectric converter PCy, and the capacitor 25x has a larger capacitive value than that of the capacitor 25y. Therefore, the imaging cell 10Ex has a relatively low conversion gain, and it is advantageous for photographing under high illumination. With this configuration, when a photoelectric conversion structure not including a multilayer structure having the first photoelectric conversion layer 64a and the second photoelectric conversion layer 64b is applied as in the photoelectric conversion structure 64 in Embodiments 1 to 3, even for a scene with a large contrast ratio, an image with no blown out highlights and blocked up shadows can be formed by composing the image data obtained by these two imaging cells. Such image formation is called "high dynamic range imaging". Like this, according to Embodiments of the present disclosure, it is also possible to obtain image data for high dynamic range imaging without performing photographing twice or more. In other words, photographing in a wide dynamic range is possible.

Embodiment 6

Figure 21:
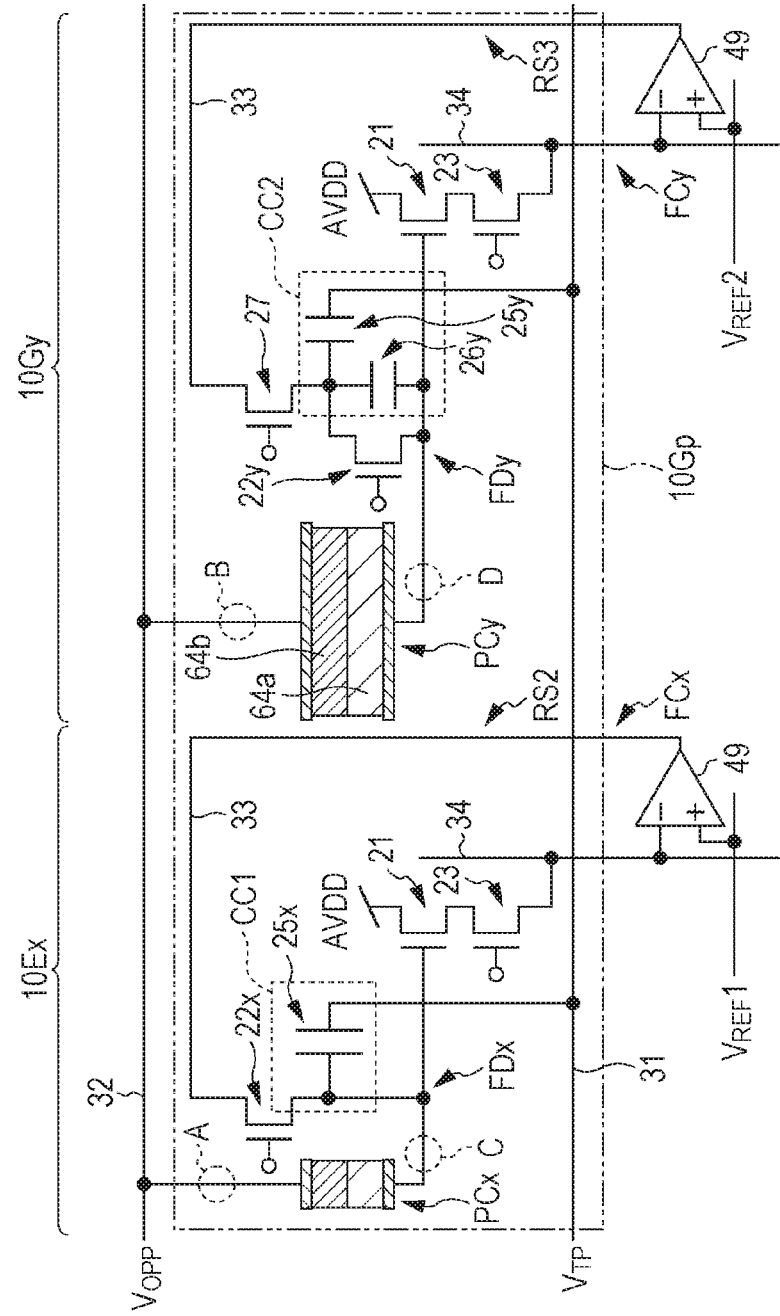
FIG. 21 is a diagram illustrating an exemplary circuit configuration of a pixel array of an imaging device according to Embodiment 6 of the present disclosure.

FIG. 21 illustrates an exemplary circuit configuration of a pixel array of an imaging device according to Embodiment 6 of the present disclosure. In contrast to the cell pair 10Ep described with reference to FIG. 20, a cell pair 10Gp illustrated in FIG. 21 has an imaging cell 10Gy instead of the imaging cell 10Ey.

A reset circuit RS3 of the imaging cell 10Gy illustrated on the right side of FIG. 21 has a feedback circuit FCy including a reset transistor 22y, an inverting amplifier 49, and a feedback transistor 27. The feedback transistor 27 is connected between the source of the reset transistor 22 and an output terminal of the inverting amplifier 49. A common signal line may be connected to the gate of the feedback transistor 27 and the gate of the reset transistor 22x of the imaging cell 10Ex. In other words, the ON and OFF operations of the feedback transistor 27 can be same as the ON and OFF operations in the reset transistor 22x of the imaging cell 10Ex.

The imaging cell 10Gy includes the capacitive circuit CC2 connected between the pixel electrode 61 and the first signal line 31. The capacitive circuit CC1 of the imaging cell 10Ex has the capacitor 25x connected between the pixel electrode 61 and the first signal line 31, and the capacitive circuit CC2 of the imaging cell 10Gy further has a second capacitor 26y in addition to the capacitor 25y connected between the pixel electrode 61 and the first signal line 31. In this instance, the charge detector of the imaging cell 10Gy includes not only the impurity region 50a (for instance, see FIG. 1), but also the capacitors 25y and 26y in part.

One of the electrodes of the capacitor 26y is connected to the pixel electrode 61, and the other of the electrodes is connected to the source of the reset transistor 22y. In short, the capacitor 26y is connected in parallel to the reset transistor 22y. The capacitor 26y has a capacitive value smaller than the capacitive value of the capacitor 25y. Accumulation of signal charges with the offset voltage $V_{TP}$ changed is executed with the reset transistor 22y OFF.

An increase in the synthetic capacity of the entire charge accumulation region can be suppressed by connecting the capacitor 26x to the charge accumulation node FDy via the capacitor 26y. In other words, the effect of the change in the voltage applied to the first signal line 31 on the potential difference Φ between the pixel electrode 61 and the opposite electrode 62 is reduced. As illustrates to FIG. 21, when the capacitor 25y is connected to the charge accumulation node FDy via the capacitor 26y, the capacitive value of the signal charges in the entire accumulation region in the configuration is expressed by the following: $(C_{FDy}+(Cy1Cy2)/(Cy1+Cy2))$. $C_{FDy}$, Cy1, and Cy2 in the Expression above indicate the capacitive value of the charge accumulation node FDy, the capacitive value of the capacitor 25y, and the capacitive value of the capacitor 26y, respectively. Here, when the capacitor 26y has a relatively small capacitive value Cy2, and the capacitor 25y has a relatively large capacitive value Cy1, the capacitive value of the signal charges in the entire accumulation region is approximately $(C_{FDy}+Cy2)$. That is, the increase in the capacitive value of the signal charges in the entire accumulation region is small. Like this, the effect is achieved that the change in the potential of the charge accumulation node FDy with respect to the change in the offset voltage $V_{TP}$ is changed by connecting the capacitor 25y to the charge accumulation node FDy via the capacitor 26y having a relatively small capacitive value.

For instance, assume that the offset voltage $V_{TP}$ applied to the first signal line 31 is 0 V and the potentials of the charge accumulation nodes FDx and FDy are both 1 V immediately after the reset, then the reset transistors 22x and 22y, and the feedback transistor 27 are OFF state. Here, assume that the offset voltage $V_{TP}$ applied to the first signal line 31 is increased to 5 V, for instance, then the potential of the charge accumulation node FDx is increased to 6 V, for instance. On the other hand, the potential of the charge accumulation node FDy remains at 1 V, for instance.

Also, since the capacitive circuit CC2 includes the capacitor 26y, the effect of noise cancellation can be improved by suppressing the decrease in the conversion gain. Hereinafter, an overview of noise cancellation utilizing negative feedback will be described.

For instance, the reset of a signal charge after the charge accumulation period is executed as follows. First, a feedback loop is formed by turning on the reset transistor 22y and the feedback transistor 27 with the address transistor 23 on. The formation of a feedback loop causes negative feedback of an output of the signal detection transistor 21. Due to the negative feedback of the output of the signal detection transistor 21, the potential of the charge accumulation node FDy converges a potential such that the voltage of the vertical signal line 34 is equalized to the $V_{REF}2$.

Next, the reset transistor 22y is turned off. kTC noise occurs by turning off the reset transistor 22y. Therefore, the voltage of the charge accumulation node FDy after the reset includes the kTC noise that accompanies the turning off of the reset transistor 22y. After the turning off of the reset transistor 22y, cancellation of the kTC noise is executed.

While the feedback transistor 27 is on, the formation of a feedback loop is maintained. Thus, the kTC noise generated by turning off the reset transistor 22y is reduced to the magnitude of 1/(1+A), where A is the gain of the feedback circuit FCy. In this instance, the voltage of the vertical signal line 34 immediately before the turning off the reset transistor 22y (immediately before the start of noise cancellation) is approximately equal to the reference voltage $V_{REF}2$ which is applied to the positive-side input terminal of the inverting amplifier 49. The kTC noise can be canceled in a relatively short time by setting the voltage of the vertical signal line 34 at the start of noise cancellation to a level close to the reference voltage $V_{REF}2$.

Next, the feedback transistor 27 is turned off. The kTC noise occurs accompanying the turning off of the feedback transistor 27. However, the size of kTC noise added to the voltage of the charge accumulation node FDy due to the turning off of the feedback transistor 27 is $(C_{FDy}/Cy1)^{1/2} \times (Cy2/(Cy2+C_{FDy}))$ times greater than the size of kTC noise when the feedback transistor 27 is directly connected to the charge accumulation node FDy without providing the capacitor 25y and the capacitor 26y in the imaging cell 10Gy ("x" in the Expression indicates multiplication).

From the above Expression, it is seen that larger the capacitive value Cy1 of the capacitor 25y, smaller the generated noise itself, and smaller the capacitive value Cy2 of the capacitor 26y, lower the attenuation rate. The kTC noise generated by turning off the feedback transistor 27 can be sufficiently reduced by setting the capacitive values Cy1 and Cy2 appropriately. After the feedback transistor 27 is turned off, a signal, in which the kTC noise has been canceled, is read.

The capacitor 25y is connected to the charge accumulation node FDy via the capacitor 26y with the reset transistor 22y and the feedback transistor 27 turned off. Here, it is assumed that the charge accumulation node FDy and the capacitor 25y are directly connected, not via the capacitor 26y. In this case, the capacitive value of the signal charges in the entire accumulation region when the capacitor 25y is directly connected is $(C_{FDy}+Cy1)$. That is, when the capacitor 25y has a relatively large capacitive value Cy1, the capacitive value of the signal charges in the entire accumulation region also becomes large, and a high conversion gain (may be referred to a high S/N ratio) is not obtained. On the other hand, when the capacitor 25y is connected to the charge accumulation node FDy via the capacitor 26y as illustrated in FIG. 21, and if the capacitive value Cy2 is relatively small and the capacitive value Cy1 is relatively large, the capacitive value of the signal charges in the entire accumulation region is $(C_{FDy}+Cy2)$ as described above. That is, the increase in the capacitive value of the signal charges in the entire accumulation region is small, and the decrease in the conversion gain is reduced.

Figure 22:
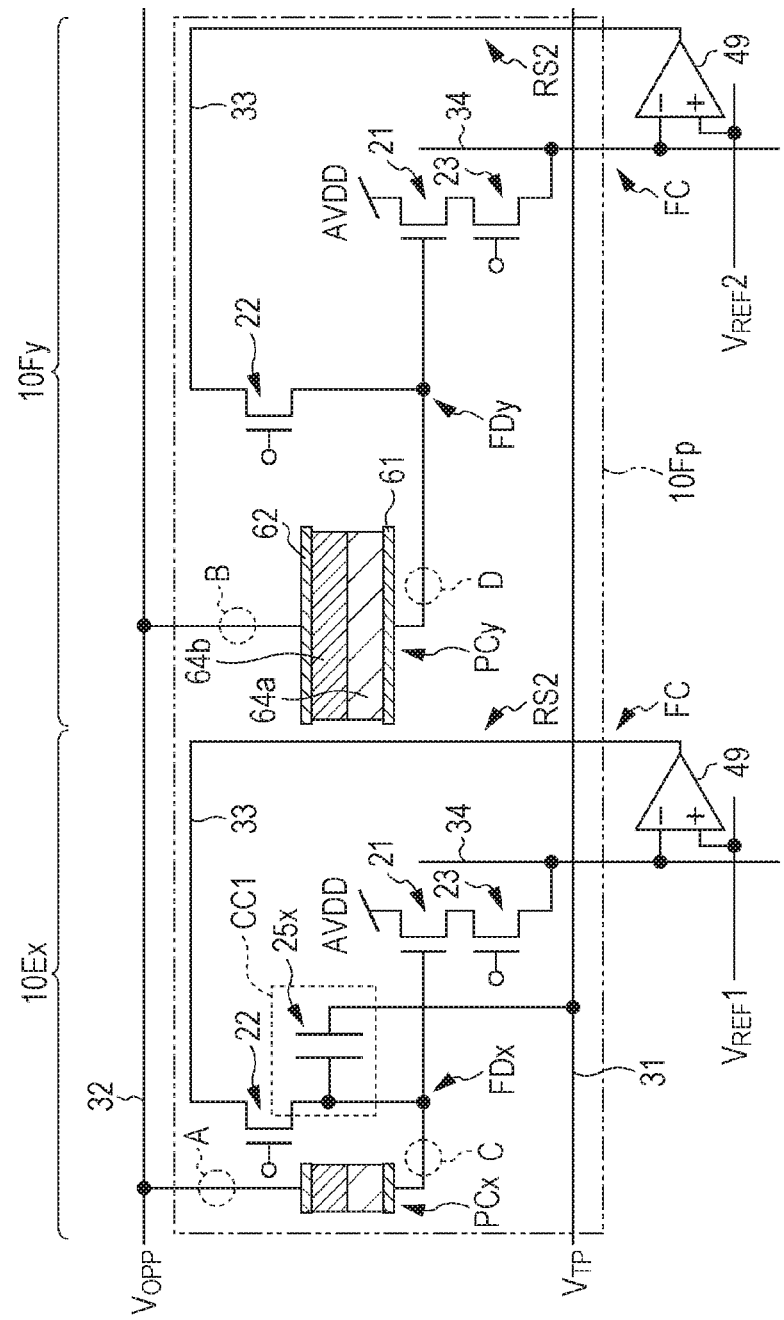
FIG. 22 is a diagram illustrating a variation of the pixel array of the imaging device according to Embodiment 6 of the present disclosure.

FIG. 22 illustrates a variation of the pixel array of the imaging device according to Embodiment 6 of the present disclosure. As illustrated in FIG. 22, a cell pair 10Fp includes the above-described imaging cell 10Ex and imaging cell 10Fy. The imaging cell 10Fy does not have a capacitor that electrically couples the first signal line 31 to the pixel electrode 61. Although a parasitic capacitance may be present between the first signal line 31 and the charge accumulation node FDy, the capacitive value of the parasitic capacitance is so small to be negligible compared with the capacitive value of the charge accumulation node FDy. That is, the first signal line 31 has no intentional electrical coupling between the imaging cell 10Fy and itself.

As illustrated in FIG. 22, an imaging cell that does not have a capacitor that electrically couples the first signal line 31 to the pixel electrode 61 may be included in the pixel array PA intentionally. In other words, an imaging cell Fy, in which the spectral sensitivity characteristic is not changed by switching of the offset voltage $V_{TP}$ applied to the first signal line 31, may be included in the pixel array PA. With this configuration, it is possible to selectively cause a modulation of the spectral sensitivity characteristic in an imaging cell in which the pixel electrode 61 is electrically coupled to the first signal line via a capacitor.

Figure 23:
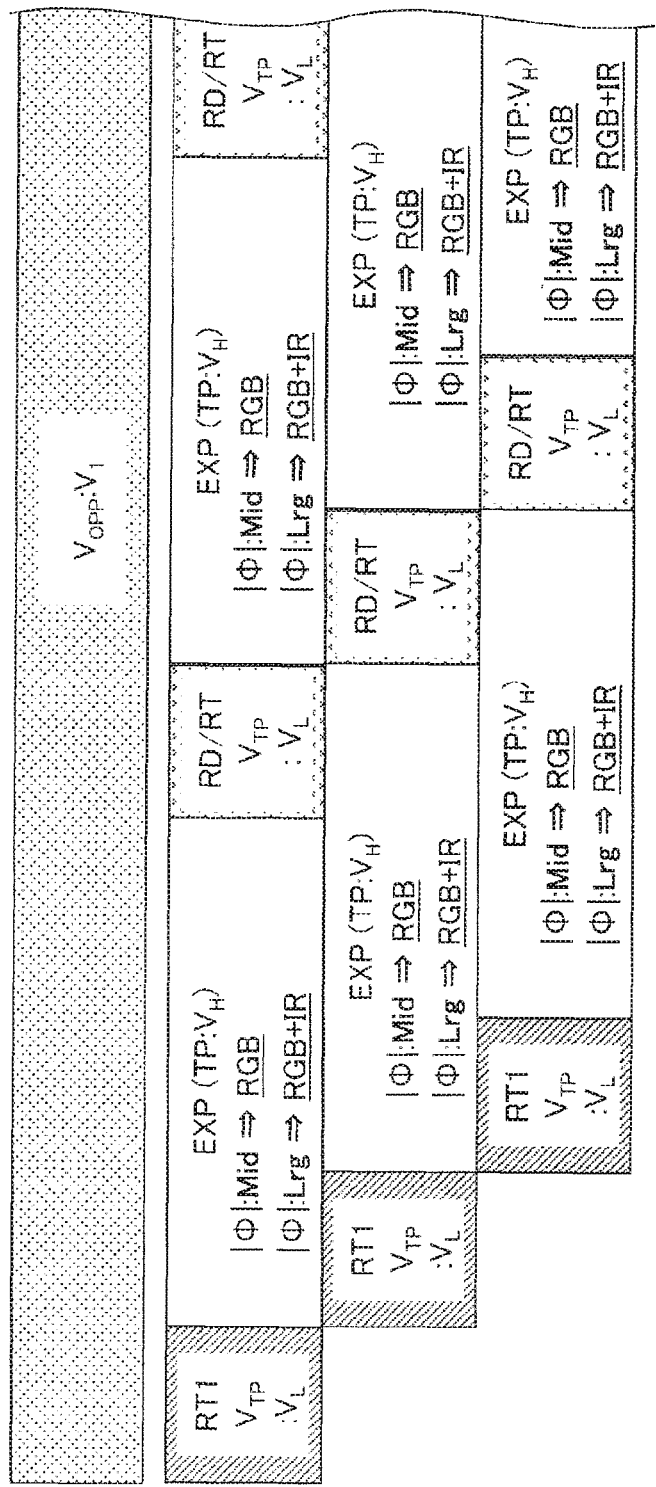
FIG. 23 is a diagram for explaining an instance of the operation of the imaging device to which imaging cells illustrated in FIG. 21 are applied.

FIG. 23 illustrates an instance of the operation of the imaging device to which the imaging cells 10Ex and 10Gy illustrated in FIG. 21 are applied. The instance illustrated in FIG. 23 is an application instance utilizing a rolling shutter operation.

As illustrated in FIG. 23, the voltage supply circuit 41 applies a high-level voltage $V_H$ to the first signal line 31 in each charge accumulation period denoted by rectangle EXP, and applies a low-level voltage $V_H$ to the first signal line 31 in a period other than the charge accumulation period. It is to be noted that in FIG. 23, the signal read periods indicated by rectangles RD1, RD2, and the reset periods indicated by rectangles RT2 in FIG. 4 are each represented by a single rectangle RD/RT. It is to be noted that each of the periods for reset represented by rectangles RT1 and the periods for reset included in periods represented by rectangles RD/RT in FIG. 23 includes a period in which a feedback loop is formed.

Here, for the sake of simplicity, it is assumed that the voltages of the charge accumulation node FDx and the charge accumulation node FDy after the reset are the same voltage Vr. When attention is focused on the charge accumulation period of each row, at the start timing of the charge accumulation period, the voltage supply circuit 41 switches the offset voltage $V_{TP}$ applied to the first signal line 31 from the low-level voltage $V_L$ which has been applied at the reset time to the high-level voltage $V_H$. At this point, when the capacitive value Cx of the capacitor 25x of the imaging cell 10Ex is sufficiently larger than the capacitive value CFDx of the charge accumulation node FDx, the potential difference Φ between the pixel electrode 61 and the opposite electrode 62 is reduced by increasing the offset voltage $V_{TP}$ from the low-level voltage $V_L$ to the voltage $V_H$. "|Φ|: Mid" in FIG. 23 indicates that the absolute value of potential difference Φ is relatively small as compared with a state where the low-level voltage $V_L$ is applied to the first signal line 31. Due to the reduction of the potential difference Φ, the imaging cell 10Ex loses the sensitivity to the wavelength range infrared light, for instance, and selectively has sensitivity to the wavelength range of visible light.

Assume that the capacitive value Cy of the capacitor 25y of the imaging cell 10Gy is sufficiently smaller than the capacitive value $C_{FDy}$ of the charge accumulation node FDy, then even when the offset voltage $V_{TP}$ is increased from the low-level voltage $V_L$ to the voltage $V_H$, the absolute value of the potential difference Φ between the pixel electrode 61 and the opposite electrode 62 is still a relatively large value due to the reason described above. "|Φ|: Lrg" in FIG. 23 indicates that the absolute value of the potential difference Φ is relatively large. Since the absolute value of potential difference Φ is relatively large, the imaging cell 10Gy has sensitivity in the wavelength ranges of visible light and infrared light, for instance.

Since the offset voltage $V_{TP}$ is increased before the start of accumulation of signal charges, the potential of the pixel electrode 61 is different between the imaging cell 10Ex and the imaging cell 10Gy at the start of the charge accumulation period. Therefore, the potential difference Φ is also different between the imaging cell 10Ex and the imaging cell 10Gy, and imaging cells with different spectral sensitivity characteristics are mixed in the pixel array PA. When the imaging cells 10Ex and 10Gy are two adjacent imaging cells in the row direction, and the pixel array PA has a repetitive structure in which a unit formed by the cell pair 10Gp including the imaging cells 10Ex and 10Gy is repeated, it is possible to achieve a state in which imaging cells with different spectral sensitivity characteristics are mixed in the same row. It is to be noted that the above-mentioned magnitude relationship of the potential difference Φ indicates a relative relationship, and a relatively high potential difference Φ may be less than 10 V.

Here, the opposite electrode voltage $V_{OPP}$ is a nearly constant voltage $V_1$ over the charge accumulation period, and the voltages of the charge accumulation node FDx and the charge accumulation node FDy after the reset are the same voltage Vr. Therefore, at the start of the charge accumulation period, in other words, at a time point immediately after the reset of the potential of the pixel electrode and before start of accumulation of charges in the charge accumulation region, the relationship Φx≠Φy holds between the potential difference Φx applied to the photoelectric conversion structure 64 of the imaging cell 10Ex and the potential difference Φy applied to the photoelectric conversion structure 64 of the imaging cell 10Gy. In other words, the bias voltage applied to the photoelectric conversion structure 64 before start of accumulation of signal charges can be made different between the imaging cell 10Ex and the imaging cell 10G. When the imaging cell 10Ex and the imaging cell 10Gy are arranged close to each other, for instance, adjacent to each other, the quantities of light incident to the imaging cell 10Ex and the imaging cell 10Gy are approximately equal. Therefore, in this case, when the charge accumulation region is in common with these, it can be said that the difference between the amounts of electrical change in each charge accumulation region is small, and the relationship of Φx≠Φy holds over the charge accumulation period. What is noteworthy here is that conditions are intentionally made such that the relationship of Φx≠Φy holds between the imaging cell 10Ex and imaging cell 10Gy immediately before the accumulation of signal charges.

After the completion of the charge accumulation period, the voltage supply circuit 41 returns the offset voltage $V_{TP}$ that has been applied to the first signal line 31, from the high-level voltage $V_H$ to the low-level voltage $V_L$. Subsequently, a signal charge is read. When the imaging cells 10Ex and 10Gy are two adjacent imaging cells in the pixel array PA, the pixel value of one pixel in an image may be determined by an image signal obtained by a pair of these imaging cells. For instance, each of multiple pairs of the imaging cells 10Ex and 10Gy included in the pixel array PA is associated with each pixel, the output of the imaging cell 10Ex is extracted from each of the multiple pairs of the imaging cells 10Ex and 10Gy included in the pixel array PA, and the pixel value of each pixel may be determined. Thus, an image based on visible light can be formed. Alternatively, when the pixel value of each pixel is given by the difference between the output of the imaging cell 10Gy and the output of the imaging cell 10Ex, an image based on visible light can be formed. The output signal of the imaging cell 10Ex and/or the output signal of the imaging cell 10Gy may be amplified by a predetermined gain, and subtraction processing may be performed. In this case, the gain does not need to be matched between the imaging cells 10Ex and 10Gy. It is sufficient that a ratio of gains be determined for each pair of the imaging cells 10Ex and 10Gy.

Although image signals obtained from both of the imaging cells 10Ex and 10Gy arranged close to each other in the pixel array PA are signals based on light with different wavelength ranges, synchronization is guaranteed. That is, it is possible to obtain multiple signals based on light with different wavelength ranges. When the pixel value of one pixel in an image is determined from an image signal obtained by a pair of two adjacent imaging cells in the pixel array PA, a microlens and/or a color filter may be shared by those imaging cells (for instance, the above-described imaging cells 10Ex and 10Gy). For instance, it is not required to dispose a microlens 74 corresponding to each of the imaging cells.

As illustrated in FIG. 23, after completion of reading of signal charges, accumulation of signal charge can be started continuously. In other words, it is possible to obtain image signals from multiple frames continuously, which contributes to reduction of the time taken for imaging.

As description above, according to Embodiments of the present disclosure, in a charge accumulation period included in a frame, the potential difference Φ between the pixel electrode 61 and the opposite electrode 62 can be controlled so that the potential difference Φ is made different between part of the imaging cells and other imaging cells in the pixel array PA. In an aspect, the potential of the pixel electrode 61 is changed through the change in the voltage applied to the first signal line 31. According to the aspect, it is relatively easy to make the magnitude of the change in the potential applied to the pixel electrode 61 different between the imaging cells belonging to the same row or the same column. An imaging cell, in which the pixel electrode 61 is electrically separated from the first signal line 31, may be intentionally mixed in the pixel array PA.

(Variations)

Figure 24:
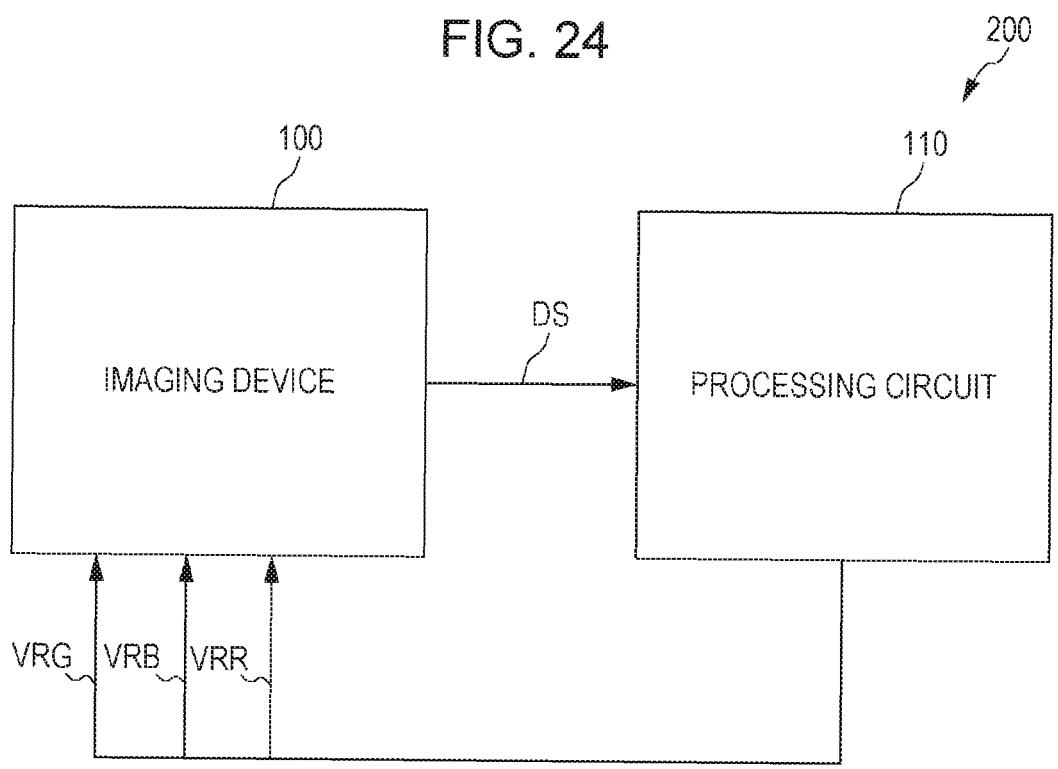
FIG. 24 is a functional block diagram of an exemplary imaging module having an imaging device according to an Embodiment of the present disclosure.

FIG. 24 illustrates a functional block of an imaging module having an imaging device according to an Embodiment of the present disclosure. An imaging module 200 illustrated in FIG. 24 has the imaging device 100 (for instance, the imaging device 100A) according to one of the above-described Embodiments, and a processing circuit 110. The imaging module 200 processes a signal obtained by the imaging device 100, and outputs the signal to the outside.

The processing circuit 110 is, for instance, a digital signal processor (DSP), and receives an output (digital pixel signal DS) from the imaging device 100. The processing circuit 110 performs processing, such as gamma correction, color interpolation processing, space interpolation processing, and auto white balance. The processing circuit 110 may be a microcomputer that controls the imaging device 100 in accordance with various settings specified by a user, and integrates the operations of the entire imaging module 200.

The processing circuit 110 processes digital pixel signal DS outputted from the imaging device 100, and calculates an optimal reset voltage (VRG, VRB, and VRR), for instance, for G pixel, B pixel, and R pixel, respectively. The processing circuit 110 feeds back a reset voltage to the voltage supply circuit 41 of the imaging device 100. Here, VRG, VRB, and VRR indicates a reset voltage for G pixel, a reset voltage for B pixel, and a reset voltage for R pixel, respectively. The reset voltage may be a feedback signal sent from the feedback line 33 or the vertical signal line 34. The imaging device 100 and the processing circuit 110 may be manufactured as a single semiconductor device (so-called a system on a chip (SoC)). Thus, an electronic device using the imaging device 100 can be miniaturized. Naturally, it is also possible to produce only the imaging device 100 is commercialized without being modulated. In this case, a signal processing circuit is externally connected to the imaging device 100, and signal processing may be performed externally of the imaging device 100.

As described above, in Embodiments of the present disclosure, at least voltage supply circuit 41 out of the voltage supply circuit 41 and the voltage supply circuit 42 is configured to switch between multiple voltages and to output a voltage. For instance, the voltage supply circuit 41 switches between voltages with different absolute values between a charge accumulation period and a shutter period, and applies a value to the first signal line 31. It is possible to electrically switch between various operations by switching a voltage to be applied to the first signal line 31 which is electrically coupled to the pixel electrode 61. For instance, the sensitivities of the imaging cells in the pixel array PA are reduced at once by switching a voltage applied to the first signal line 31, then a global shutter can be operated.

The voltage supply circuit 41 may be configured to apply a predetermined voltage to the first signal line 31 at the time of operation of the imaging device. The voltage supply circuit 41 is not limited to a specific power supply circuit, and may be a circuit that generates a predetermined voltage, or a circuit that converts a voltage supplied from another power supply into a predetermined voltage. Similarly, the voltage supply circuit 42 connected to the accumulation control line 32 may be configured to allow a predetermined voltage to be applied to the accumulation control line 32 at the time of operation of the imaging device. Each of the voltage supply circuits 41 and 42 may be part of a single voltage supply circuit, or a separate independent voltage supply circuit. It is to be noted that one or both of the voltage supply circuits 41 and 42 may be part of the vertical scanning circuit 48. Alternatively, a voltage from the voltage supply circuit 41 and/or an opposite electrode voltage from the voltage supply circuit 42 may be supplied to each imaging cell via the vertical scanning circuit 48.

The voltage supply circuit 41 may be configured to allow any of three or more different voltages to be applied to the first signal line 31. A voltage level which can be supplied by switching by the voltage supply circuit 41 is not limited to a discrete voltage level. The reset voltage $V_{RST}$, the reference voltage $V_{REF}$, or the offset voltage $V_{TP}$ may be applied as an analog signal from voltage supply circuit 41 to the first signal line 31. Similarly, the voltage supply circuit 42 may switch between three or more different voltages and may apply a voltage from the voltage supply circuit 42 to the accumulation control line 32, or may apply a continuously varying voltage from the voltage supply circuit 42 to the accumulation control line 32.

(Photoelectric Conversion Structure)

As described above, in Embodiments of the present disclosure, the photoelectric conversion structure 64 in the photoelectric converters PC, PCx, and PCy includes a multilayer structure that has the first photoelectric conversion layer 64a and the second photoelectric conversion layer 64b. The photoelectric conversion structure 64 has a thickness in a range 100 nm or greater and 1000 nm or less, for instance. The first photoelectric conversion layer 64a and the second photoelectric conversion layer 64b include the first material and the second material, respectively, and in an aspect of the present disclosure, the first photoelectric conversion layer has greater impedance than the second photoelectric conversion layer has. With this configuration, it is possible to switch the spectral sensitivity characteristic in the photoelectric converter PC by changing the voltage applied across the pixel electrode and the opposite electrode. It is possible to switch the wavelength range of an obtainable image by switching the spectral sensitivity characteristic in the imaging cell 10. It is to be noted that in the present description, for the sake of simplicity, the term of "impedance" may be used to indicate "absolute value of impedance".

In another aspect in the present disclosure, the ionization potential of the first material is greater than the ionization potential of the second material by 0.2 eV or more. As described later, when the difference between the ionization potentials of the first material and the second material is high to some extent, even when the impedance difference between the first photoelectric conversion layer 64a and the second photoelectric conversion layer 64b is small, the spectral sensitivity characteristic in the photoelectric converter PC can be changed by changing the voltage applied across the pixel electrode and the opposite electrode.

Figure 25:
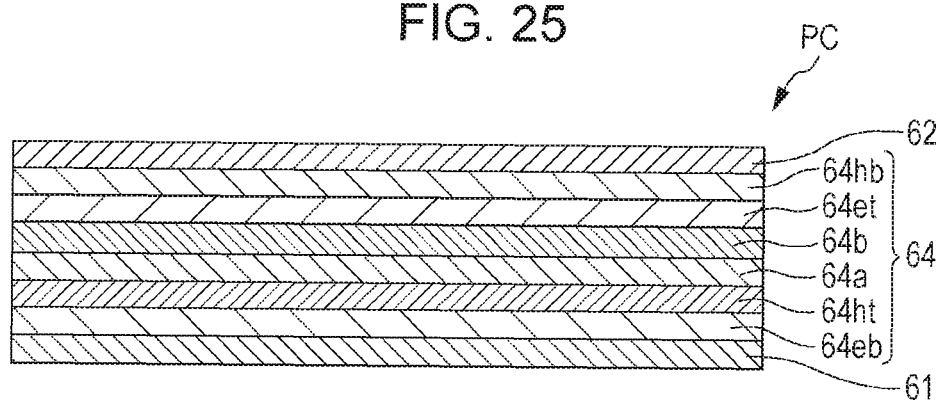
FIG. 25 is a schematic sectional view illustrating an instance of a photoelectric converter.

FIG. 25 illustrates an instance of the sectional structure of the photoelectric converter.

As already described, the photoelectric converter PC includes the pixel electrode 61, the opposite electrode 62, and the photoelectric conversion structure 64 interposed therebetween. The photoelectric conversion structure 64 typically has multiple layers including an organic material. In the configuration illustrated to FIG. 25, the photoelectric conversion structure 64 includes a multilayer structure of the first photoelectric conversion layer 64a and the second photoelectric conversion layer 64b. As illustrated, in this instance, the second photoelectric conversion layer 64b is positioned between the first photoelectric conversion layer 64a and the opposite electrode 62.

In the configuration illustrated to FIG. 25, the photoelectric conversion structure 64 includes an electronic blocking layer 64eb and a positive hole transport layer 64ht between the first photoelectric conversion layer 64a and the pixel electrode 61. The electronic blocking layer 64eb is adjacent to the pixel electrode 61, and the positive hole transport layer 64ht is adjacent to the first photoelectric conversion layer 64a. Also, the photoelectric conversion structure 64 includes an electron transport layer 64et and a positive hole blocking layer 64hb between the second photoelectric conversion layer 64b and the opposite electrode 62. The positive hole blocking layer 64hb is adjacent to the opposite electrode 62, and the electron transport layer 64et is adjacent to the second photoelectric conversion layer 64b.

The electronic blocking layer 64eb illustrated in FIG. 25 is provided to reduce dark current caused by injection of electrons from the pixel electrode 61, and the positive hole blocking layer 64hb is provided to reduce dark current caused by injection of positive holes from the opposite electrode 62. It is to be noted that the electronic blocking layer 64eb and the positive hole blocking layer 64hb each have a function of selectively transporting charges, and therefore are not insulation layers. The positive hole transport layer 64ht and the electron transport layer 64et are provided to efficiently transport positive and negative charges generated in the first photoelectric conversion layer 64a and/or the second photoelectric conversion layer 64b to the pixel electrode 61 and the opposite electrode 62, respectively. The materials of which the electronic blocking layer 64eb, the positive hole blocking layer 64hb, the positive hole transport layer 64ht, and the electron transport layer 64et are composed can be selected from publicly known materials in consideration of bonding strength, stability, a difference between ionization potentials, and a difference between electron affinities between each layer and adjacent layer. The material for forming the first photoelectric conversion layer 64a or the material for forming the second photoelectric conversion layer 64b may be for at least one of the materials of which the electronic blocking layer 64eb, the positive hole blocking layer 64hb, the positive hole transport layer 64ht, and the electron transport layer 64et are composed.

The first photoelectric conversion layer 64a and the second photoelectric conversion layer 64b include the first material and the second material, respectively. Therefore, typically, impedance per unit thickness in the first photoelectric conversion layer 64a is different from impedance per unit thickness in the second photoelectric conversion layer 64b. The first material and the second material are typically semiconductor materials. In an aspect of the present disclosure, impedance per unit thickness in the first photoelectric conversion layer 64a is greater than impedance per unit thickness in the second photoelectric conversion layer 64b. The impedance depends on the thickness of a photoelectric conversion layer, and when a photoelectric conversion layer includes multiple materials, the impedance also depends on the volume ratio of those materials in the photoelectric conversion layer. In Embodiments of the present disclosure, a layer having high impedance among multiple photoelectric conversion layers included in the multilayer structure can be used as the first photoelectric conversion layer 64a.

(Switching of Spectral Sensitivity Characteristic by Switching Bias Voltage Utilizing Impedance Difference)

When the photoelectric conversion structure 64 includes a multilayer structure having the first photoelectric conversion layer and the second photoelectric conversion layer which have different impedance, application of a bias voltage between the pixel electrode 61 and the opposite electrode 62 causes a voltage proportional to the different impedance to be applied to the first photoelectric conversion layer and the second photoelectric conversion layer. In other words, an electric field with a magnitude proportional to impedance is applied to the first photoelectric conversion layer and the second photoelectric conversion layer. An external quantum efficiency (E.Q.E.) for a wavelength range can be changed by changing the potential difference Φ to be applied across the pixel electrode 61 and the opposite electrode 62 that interpose a photoelectric conversion structure including a multilayer structure having photoelectric conversion layers with different impedance. In other words, in the imaging cell 10 having such a photoelectric conversion structure in the photoelectric converter PC, the spectral sensitivity characteristic may be electrically changed. For instance, when the potential difference to be applied is changed from potential difference Φ1 to the potential difference Φ2, an increase in the E.Q.E. in the absorption peak wavelength of the second material is greater than an increase in the E.Q.E. in the absorption peak wavelength of the first material.

For instance, let Z1 and Z2 be the impedance of the first photoelectric conversion layer 64a, and the impedance of the second photoelectric conversion layer 64b, respectively, then when Z1>Z2, a higher voltage is applied to the first photoelectric conversion layer 64a as compared with the second photoelectric conversion layer 64b. Therefore, even when the bias between the pixel electrode 61 and the opposite electrode 62 is small, an electric field having a sufficient magnitude for moving the charges generated by the photoelectric conversion to an electrode can be applied to the first photoelectric conversion layer 64a. In other words, positive and negative charges generated by the photoelectric conversion can reach the pixel electrode 61 and the opposite electrode 62, respectively. Specifically, signal charges generated by irradiation of the first photoelectric conversion layer 64a with light are collected by the pixel electrode 61, and are accumulated in the charge accumulation region.

On the other hand, the electric field applied to the second photoelectric conversion layer 64b is smaller than the electric field applied to the first photoelectric conversion layer 64a. Thus, when a smaller potential difference is applied to the photoelectric conversion structure 64 between the pixel electrode 61 and the opposite electrode 62, the electric field applied to the second photoelectric conversion layer 64*b* may fall below a necessary magnitude for signal charges to reach the pixel electrode 61, the signal charges being generated by irradiation of the second photoelectric conversion layer 64*b* with light. If signal charges do not reach the pixel electrode 61, even when signal charges are generated in the second photoelectric conversion layer 64*b*, the signal charges are not accumulated in the charge accumulation region. Therefore, the imaging cell 10 does not have sufficient sensitivity to the light with a wavelength range corresponding to the absorption spectrum of the material of which the second photoelectric conversion layer 64*b* is composed, particularly the absorption spectrum of the second material.

When the voltage applied across the opposite electrode 62 and the pixel electrode 61 is increased, the voltage applied to the second photoelectric conversion layer 64*b* is also increased. That is, the electric field applied to the second photoelectric conversion layer 64*b* is increased, and the signal charges reach the pixel electrode 61, for instance, by supplying a voltage with a larger absolute value to pixel electrode 61 or the opposite electrode 62. Therefore, the imaging cell 10 has sensitivity to the light with a wavelength range corresponding to the absorption spectrum of the material (particularly, the second material) of which the second photoelectric conversion layer 64*b*, in addition to the light with a wavelength range corresponding to the absorption spectrum of the material (particularly, the first material) of which the first photoelectric conversion layer 64*a* is composed.

In this manner, a multilayer structure having the first photoelectric conversion layer, and the second photoelectric conversion layer which has impedance smaller than impedance of the first photoelectric conversion layer is applied, and thus the spectral sensitivity characteristic can be switched by switching a voltage supplied to the pixel electrode 61 or the opposite electrode 62. The ratio of the impedance of the first photoelectric conversion layer 64*a* to the impedance of the second photoelectric conversion layer 64*b* is typically in a range of 100 times or more and $10^{10}$ times or less. When the ratio of the impedance of the first photoelectric conversion layer 64*a* to the impedance of the second photoelectric conversion layer 64*b* exceeds at least 44 times, such switching of the spectral sensitivity characteristic by switching the bias voltage can be achieved.

As the combination of the first material and the second material, for instance, a combination of a material exhibiting a high absorption coefficient in visible range and a material exhibiting a high absorption coefficient in infrared range may be used. With this combination of materials, it is possible to provide an imaging device that can obtain information on one or both of illumination of visible light and illumination of infrared light.

Typically, the first photoelectric conversion layer 64*a* and the second photoelectric conversion layer 64*b* include electron-donating (donor property, p-type) molecules, and electron-accepting (acceptor property, n-type) molecules.

For instance, electron-donating molecules are used as the first material and the second material. A typical instance of electron-donating molecules is an organic p-type semiconductor, and is mainly represented by a positive hole transport organic compound. The electron-donating molecules have a property of being likely to donate electrons. Examples of an organic p-type semiconductor include triaryl amine compounds such as DTDCTB, benzidine compounds, pyrazoline compounds, styryl amine compounds, hydrazone compounds, triphenylmethane compounds, carbazole compounds, polysilane compounds, α-sexithiophene (hereinafter referred to as "α-6T"), thiophene compounds such as P3HT, phthalocyanine compounds, cyanine compounds, merocyanine compounds, oxonol compounds, polyamine compounds, indolic compounds, pyrrole compounds, pyrazole compounds, polyarylene compounds, condensed aromatic carbon ring compounds, (naphthalene derivatives, anthracene derivatives, phenanthrene derivatives, tetracene derivatives such as rubrene, pyrene derivatives, perylene derivatives, fluoranthene derivatives), and metal complexes having a nitrogen-containing hetero ring compound as a ligand. Examples of phthalocyanine compounds include copper phthalocyanine (CuPc), subphthalocyanine (SubPc), aluminium chloride phthalocyanine (ClAlPc), $Si(OSiR_3)_2Nc$ (R indicates alkyl with a carbon number of 1 to 18), turnip phthalocyanine (SnNc), and lead phthalocyanine (PbPc). Donor organic semiconductors are not limited to these, and organic compounds with an ionization potential lower than the ionization potential of organic compounds used as n-type (acceptor property) compounds can be used as donor organic semiconductors. The ionization potential is the difference between the vacuum level and the energy level of a highest occupied molecular orbital (HOMO).

A typical instance of electron-accepting molecules is an organic n-type semiconductor, and is mainly represented by an electron transport organic compound. The electron-accepting molecules have a property of being likely to accept electrons. Examples of an organic n-type semiconductor include fullerene such as $C_{60}$ and $C_{70}$, fullerene derivatives such as phenyl $C_{61}$ butyric-acid methyl ester (PCBM), condensed aromatic carbon ring compounds, (naphthalene derivatives, anthracene derivatives, phenanthrene derivatives, tetracene derivatives, pyrene derivatives, perylene derivatives, fluoranthene derivatives), 5 to 7 membered hetero ring compounds containing nitrogen atoms, oxygen atoms, and sulfur atoms (for instance, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolo-pyridazine, triazolo-pyrimidine, tetrazaindene, oxadiazole, imidazopyridine, pyrrolidine, pyrrolopyridine, thiadiazolopyridine, dibenzazepine, tribenzazepine), subphthalocyanine (SubPc), polyarylene compounds fluorene compounds, cyclopentadiene compounds, silyl compounds, perylene tetracarboxylic diimide compounds (PTCDI), and metal complexes having a nitrogen-containing hetero ring compound as a ligand. Acceptor organic semiconductors are not limited to these, and organic compounds with an electron affinity greater than the electron affinity of organic compounds used as p-type (donor property) compounds can be used as acceptor organic semiconductors. The electron affinity is the difference between the vacuum level and the energy level of a lowest unoccupied molecular orbital (LUMO).

FIG. 26 illustrates the chemical formulas of SnNc, DTDCTB, and $C_{70}$. Without being limited to those mentioned above, as long as organic compounds or organic molecules allows film formation by one of a dry system and a wet system, the organic compounds and organic molecules can be used as the material of which the first photoelectric conversion layer 64*a* is composed or the material of which the second photoelectric conversion layer 64*b* is composed, regardless of low-molecular or high-molecular compounds.

A photoelectric conversion structure 64 having sensitivity of a desired wavelength range can be implemented by using appropriate materials as the first material and the second material according to a wavelength range to be detected. For instance, a material having a high absorption coefficient in the visible range and a material having a high absorption coefficient in the infrared range may be used as the first material and the second material, respectively. The above-mentioned DTDCTB has an absorption peak at a wavelength of approximately 700 nm, and CuPc and SubPc have absorption peaks at wavelengths of approximately 620 nm and 580 nm, respectively. Rubrene has an absorption peak at a wavelength of approximately 530 nm, and α-6T has an absorption peak at a wavelength of approximately 440 nm. In short, the absorption peaks of these materials are in the wavelength range of visible light, and can be used as the first material, for instance. In contrast, SnNc has an absorption peak at a wavelength of approximately 870 nm, and ClAlPc has an absorption peak at a wavelength of approximately 750 nm. In short, the absorption peaks of these materials are in the wavelength range of infrared light, and can be used as the second material, for instance.

The second material includes SnNc represented by the following structural formula (1), for instance.

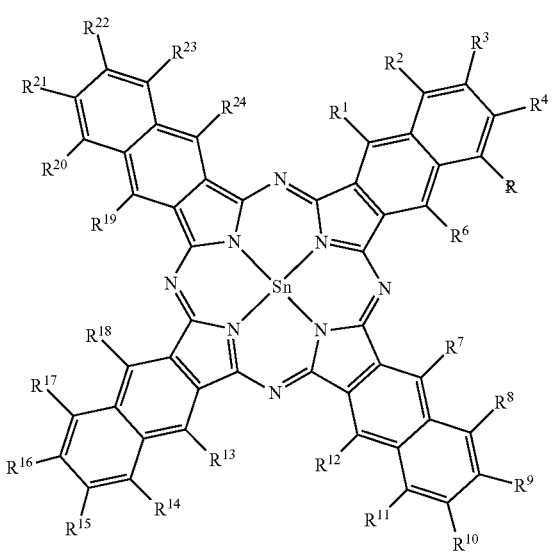

(1)

$R^1$ to $R^{24}$ in the structural formula (1) each independently indicate a hydrogen atom or a substituent. The substituent is not limited to a specific substituent. The substituent may be a deuterium atom, a halogen atom, alkyl groups (including a cycloalkyl group, a bicycloalkyl group, a tricycloalkyl group), an alkenyl group (including a cycloalkenyl group, a bicycloalkenyl group), an alkynyl group, an aryl group, a heterocyclic group (may be called a heterocyclic group), a cyano group, a hydroxy group, a nitro group, a carboxy group, an alkoxy group, an aryloxy group, a silyloxy group, a heterocyclic oxy group, a acyloxy group, a carbamoyloxy group, an alkoxy carbonyloxy group, an aryloxy carbonyloxy group, an amino group (including an anilino group), an ammonio group, an acylamino group, an aminocarbonyl amino group, an alkoxycarbonylamino group, an aryloxycarbonylamino group, an aryloxycarbonylamine group, a sulfamoylamino group, an alkylsulfonylamino group, an arylsulfonylamino group, an mercapto group, an alkylthio group, an arylthio group, a heterocyclic thio group, a sul-famoyl group, a sulfonic group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imide group, a phosphino group, a phosphinyl group, a phosphinyloxy group, a phosphinyl amino group, a phosphono group, a silyl group, a hydrazino group, a ureido group, a boron acid group (—B(OH)$_2$), a phosphato group (—OPO(OH)$_2$), a sulphato group (—OSO$_3$H), or other publicly known substituent groups.

Commercially available products may be used as SnNc represented by the above-mentioned structural formula (1). Alternatively, for instance, as described in Japanese Unexamined Patent Application Publication No. 2010-232410, SnNc represented by the above-mentioned structural formula (1) can be synthesized using naphthalene derivative represented by the structural formula (2) below as starting material. $R^{25}$ to $R^{30}$ in the structural formula (2) can be the same substituent groups as $R^1$ to $R^{24}$ in the structural formula (1).

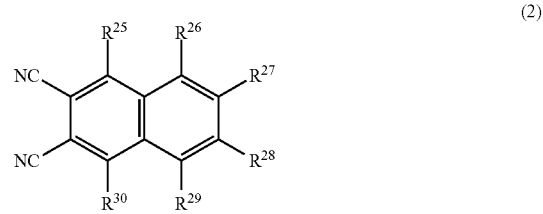

(2)

From the viewpoint of easiness of control over aggregation state of molecules in tin naphthalocyanine represented by the above-mentioned structural formula (1), it is useful when eight or more of $R^1$ to $R^{24}$ are each a hydrogen atom or a deuterium atom, and it is more useful when 16 or more of $R^1$ to $R^{24}$ are each a hydrogen atom or a deuterium, and it is further useful when all of $R^1$ to $R^{24}$ are each a hydrogen atom or a deuterium. In addition, SnNc represented by the following structural formula (3) is advantageous from the viewpoint of easiness of synthesis.

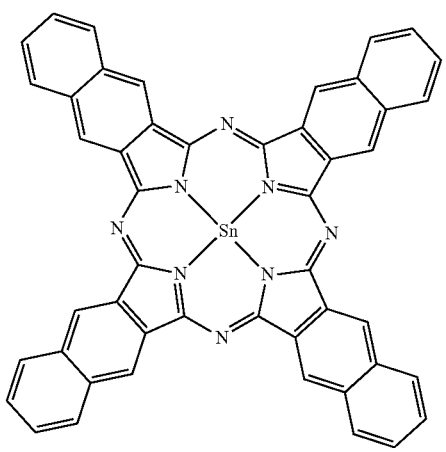

(3)

Figure 30:
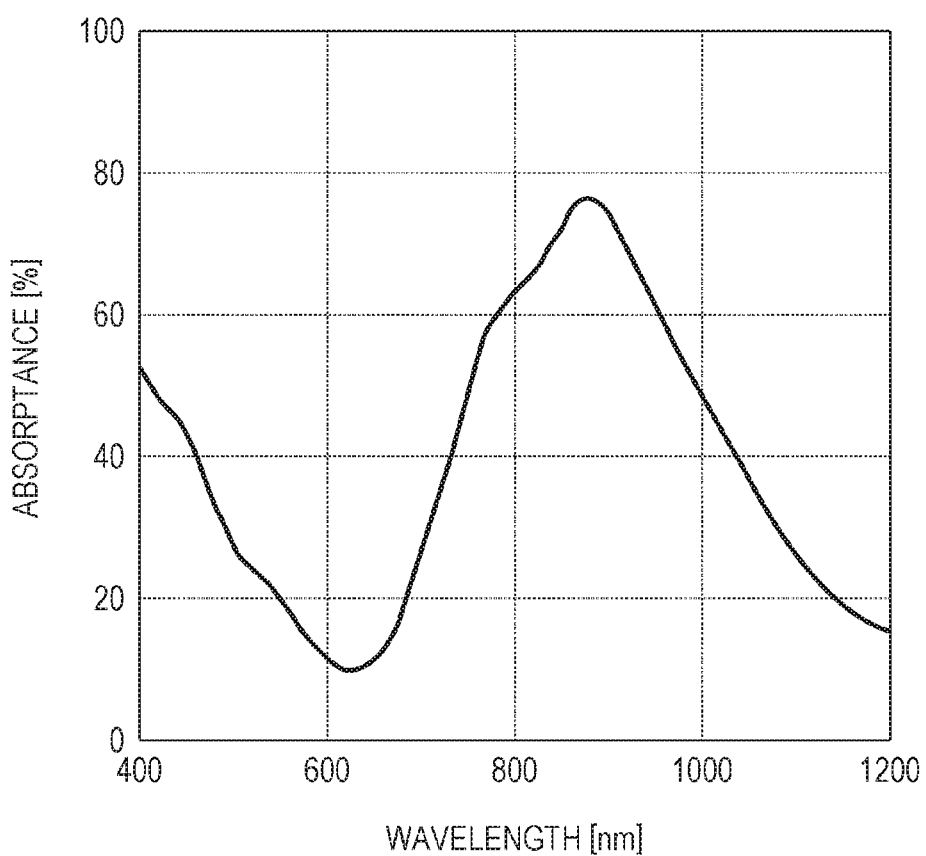
FIG. 30 is a diagram illustrating an instance of an absorption spectrum in a photoelectric conversion layer including tin naphthalocyanine.

SnNc represented by the above-mentioned structural formula (1) has an absorption in a wavelength range of approximately 200 nm or more and 1100 nm or less. For instance, SnNc represented by the above-mentioned structural formula (3) has an absorption peak at a wavelength of approximately 870 nm as illustrated in FIG. 30. FIG. 30 is an instance of an absorption spectrum in a photoelectric conversion layer including SnNc represented by the above-mentioned structural formula (3). It is to be noted that for the measurement of an absorption spectrum, a sample was used in which a photoelectric conversion layer with a thickness of 30 nm is stacked on a quartz substrate.

For instance, a material having an absorption peak in a first wavelength range included in the visible range is used as the first material, and a material having an absorption peak in a second wavelength range included in the infrared range is used as the second material, thereby making it possible to electrically change the sensitivity in the infrared range. Needless to say, a material having a high absorption coefficient in the infrared range and a material having a high absorption coefficient in the visible range may be used as the first material and the second material, respectively.

For instance, it is assumed that impedance Z1 of the first photoelectric conversion layer for which a material having a high absorption coefficient in the visible light is used as the first material is greater than impedance Z2 of the second photoelectric conversion layer for which a material having a high absorption coefficient in the infrared light is used as the second material (Z1>Z2). At this point, when the voltage applied across the opposite electrode 62 and the pixel electrode 61 is lower than or equal to a threshold value, the photoelectric converter PC has a relatively high sensitivity in the visible range. Therefore, an image signal based on the visible light can be obtained. On the other hand, when the voltage applied across the opposite electrode 62 and the pixel electrode 61 is higher than a threshold value, the photoelectric converter PC has sensitivity in the visible range and the infrared range. Therefore, an image signal based on the visible light and the infrared light can be obtained. In other words, let Φ1 be a voltage that allows imaging with the visible light, and let Φ2 be a voltage that allows imaging with the visible light and the infrared light in the potential difference applied across the opposite electrode 62 and the pixel electrode 61, then the relationship of Φ1<Φ2 holds.

Conversely, when the impedance Z1 of the first photoelectric conversion layer is lower than the impedance Z2 of the second photoelectric conversion layer (Z1<Z2), and the voltage applied across the opposite electrode 62 and the pixel electrode 61 is lower than or equal to a threshold value, the photoelectric converter PC has a relatively high sensitivity in the infrared range. Consequently, the imaging device according to an Embodiment of the present disclosure can obtain an image signal based on the infrared light. On the other hand, when the voltage applied across the opposite electrode 62 and pixel electrode 61 higher than a threshold value, the photoelectric converter PC has sensitivity in the visible light range and the infrared light range. Therefore, an image signal based on the visible light and the infrared light can be obtained. At this point, let Φ3 be a potential difference that allows imaging with the infrared light, and let Φ4 be a potential difference that allows imaging with the visible light and the infrared light in the voltage applied across the opposite electrode 62 and the pixel electrode 61, then the relationship of Φ3<Φ4 holds after all. What is noteworthy here is that the wavelength range of an obtainable image can be switched by the potential difference applied across the opposite electrode 62 and the pixel electrode 61.

When the first photoelectric conversion layer 64a and the second photoelectric conversion layer 64b do not sufficiently have desired sensitivity characteristic by using a single organic material, one or both of the first photoelectric conversion layer 64a and the second photoelectric conversion layer 64b may be formed by mixing two or more organic materials. Alternatively, one or both of the first photoelectric conversion layer 64a and the second photoelectric conversion layer 64b may be formed by stacking two or more layers including different organic materials. The first photoelectric conversion layer 64a and/or the second photoelectric conversion layer 64b may be, for instance, a bulk heterojunction structure layer including a p-type semiconductor and an n-type semiconductor. The bulk heterojunction structure is described in detail in Japanese Patent No. 5553727. The entire contents of Japanese Patent No. 5553727 are incorporated herein by reference.

Figure 27:
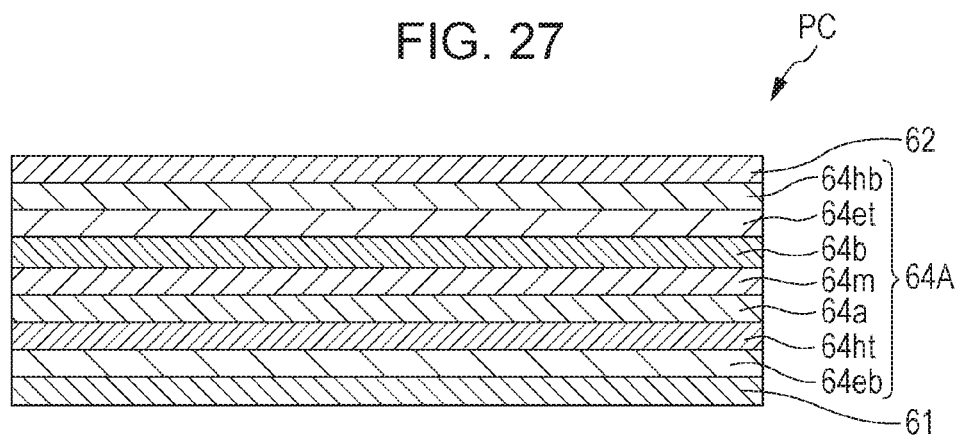
FIG. 27 is a schematic sectional view illustrating another example of the photoelectric converter.

FIG. 27 illustrates another instance of the sectional structure of the photoelectric converter PC. The photoelectric conversion structure 64A illustrated in FIG. 27 includes a multilayer structure having the first photoelectric conversion layer 64a, a mixed layer 64m, and the second photoelectric conversion layer 64b. The mixed layer 64m is a layer that includes the first material and the second material at least, and is positioned between the first photoelectric conversion layer 64a and the second photoelectric conversion layer 64b. It is to be noted that FIG. 27 and the aforementioned FIG. 25 are merely schematic diagrams, and the boundary of each layer included in the photoelectric conversion structure may not be strictly defined. The same goes with other sectional views of the present disclosure.

As just described, the configuration of the photoelectric converter PC is not limited to the configuration illustrated in FIG. 25. For instance, the arrangement of the first photoelectric conversion layer 64a and the second photoelectric conversion layer 64b and the arrangement illustrated in FIGS. 25 and 27 may be reversed. When negative charges (typically, electrons) among positive and negative charges generated in the photoelectric conversion structure 64 are used as signal charges, a positive hole blocking layer and an electron transport layer may be used instead of the electronic blocking layer 64eb and the positive hole transport layer 64ht, and a positive hole transport layer and an electronic blocking layer may be used instead of the electron transport layer 64et and the positive hole blocking layer 64hb.

The material of which the first photoelectric conversion layer 64a and the second photoelectric conversion layer 64b are composed is not limited to an organic semiconductor material, and the first photoelectric conversion layer 64a and/or the second photoelectric conversion layer 64b may include a compound semiconductor represented by hydrogenation amorphous silicon, CdSe, and an inorganic semiconductor material of a metal oxide semiconductor such as ZnO. For instance, the volume resistivity of amorphous silicon is adjustable by changing an impurity density. The first photoelectric conversion layer 64a and/or the second photoelectric conversion layer 64b may include a layer composed of an organic material and a layer composed of an inorganic material.

(Switching of Spectral Sensitivity Characteristic by Switching Bias Voltage Utilizing Ionization Potential Difference)

As described below, even when the impedance difference between the first photoelectric conversion layer 64a and the second photoelectric conversion layer 64b is small, when the difference between the ionization potentials of the first material and the second material is high to some extent, the spectral sensitivity characteristic can be changed by changing the potential difference Φ between the pixel electrode 61 and the opposite electrode 62.

Figure 28:
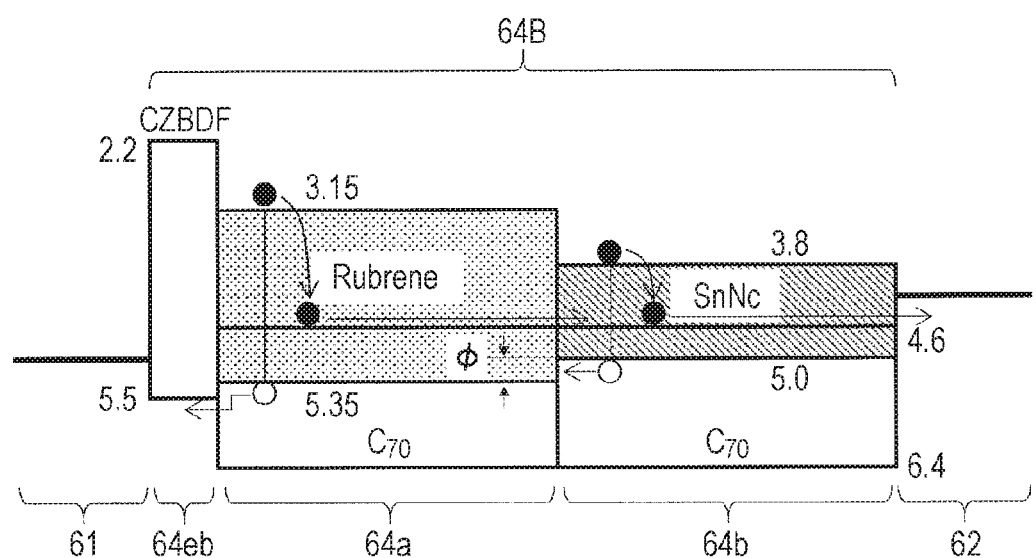
FIG. 28 is an energy diagram in still another configuration example of the photoelectric converter.

FIG. 28 is an energy diagram in still another configuration instance of the photoelectric converter PC. The rectangles in FIG. 28, schematically illustrate LUMO and HOMO in each material. The numerical value given near each of the upper sides and the lower sides of these rectangles indicates the electron affinity and the ionization potential of each material. The thick horizontal lines in FIG. 28 schematically indicate the exemplary Fermi levels of the opposite electrode 62 and the pixel electrode 61.

Figure 29:
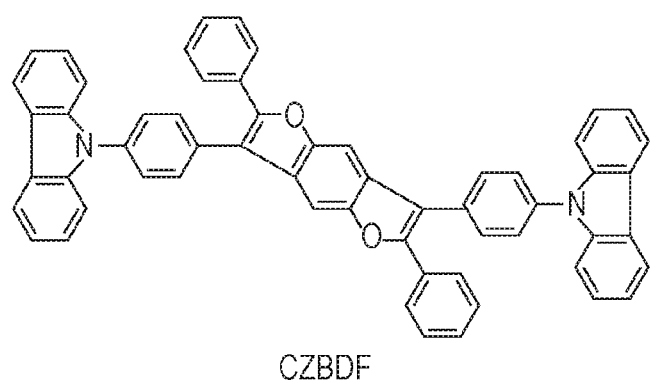
FIG. 29 is a diagram illustrating the chemical formula of CZBDF.

In the configuration illustrated to FIG. 28, the photoelectric conversion structure 64B has a multilayer structure in which the electronic blocking layer 64eb, the first photoelectric conversion layer 64a, and the second photoelectric conversion layer 64b are stacked from the pixel electrode 61 to the opposite electrode 62. In this instance, as the first material, the second material, and the material for the electronic blocking layer 64eb, rubrene, SnNc, and bis (carbazolyl) benzodifuran (CZBDF) which is an ambipolar organic semiconductor are used, respectively. FIG. 29 illustrates the chemical formula of CZBDF. AS schematically illustrated in FIG. 28, the first photoelectric conversion layer 64a and the second photoelectric conversion layer 64b include $C_{70}$ as an acceptor organic semiconductor. The first photoelectric conversion layer 64a in this instance receives the visible light to generate charge pairs by photoelectric conversion, and the second photoelectric conversion layer 64b receives the infrared light to generate charge pairs by photoelectric conversion. Each open circle "○" and solid circle "●" in FIG. 28 respectively indicate a positive charge and a negative charge generated by photoelectric conversion.

As already described, when positive charges are collected by the pixel electrode 61, a predetermined voltage is supplied to the opposite electrode 62, for instance, and the opposite electrode 62 has a higher potential than the potential of the pixel electrode 61. In this state, when the visible light is incident to the first photoelectric conversion layer 64a and positive and negative charges are generated in the first photoelectric conversion layer 64a, the positive charges are collected by the pixel electrode 61. Specifically, the imaging cell 10 has sensitivity to the wavelength range of visible light with signal charges generated by irradiation with visible light accumulated in a charge accumulation region. The negative charges transfer from the LUMO level to the LUMO level of $C_{70}$, and moves toward the opposite electrode 62 by the electric field between the pixel electrode 61 and the opposite electrode 62. Since $C_{70}$ is used in common as an acceptor organic semiconductor between the first photoelectric conversion layer 64a and the second photoelectric conversion layer 64b, the negative charges, which have transferred to the LUMO level of $C_{70}$, continuously move to the opposite electrode 62, and can be collected by the opposite electrode 62.

Here, a state is assumed in which infrared light is incident to the second photoelectric conversion layer 64b, and positive and negative charges are generated in the second photoelectric conversion layer 64b. When attention is focused on the positive charges, the positive charges move toward the pixel electrode 61 by the electric field between the pixel electrode 61 and the opposite electrode 62. However, as illustrated in FIG. 28, the ionization potential of rubrene is greater than the ionization potential of SnNc, and thus a potential barrier for the positive charges is formed between the HOMO level of SnNc and the HOMO level of rubrene. Therefore, when the bias between the pixel electrode 61 and the opposite electrode 62 is low, the positive charges cannot overcome the potential barrier, and do not reach the pixel electrode 61. This indicates a state in which the imaging cell 10 has no sensitivity to the wavelength range of infrared light.

When the bias between the pixel electrode 61 and the opposite electrode 62 is increased, and energy for overcoming the potential barrier is given to the positive charges, the positive charges overcome the potential barrier, and reach the pixel electrode 61. That is, the positive charges generated in the second photoelectric conversion layer 64b can be collected by the pixel electrode 61 by applying a greater potential difference between the pixel electrode 61 and the opposite electrode 62. In other words, sensitivity in the wavelength range of infrared light can be given to the imaging cell 10 by switching the potential difference Φ to be applied across the pixel electrode 61 and the opposite electrode 62. At this point, the imaging cell 10 has sensitivity in the wavelength ranges of visible light and infrared light, for instance.

When the difference Φ from the ionization potential of the second material to the ionization potential of the first material is approximately 0.2 eV or more, the effect of such switching of spectral sensitivity characteristic by switching the potential difference Φ is obtained. At this point, as illustrated in FIG. 28, in a configuration in which the second photoelectric conversion layer 64b is positioned between the first photoelectric conversion layer 64a and the opposite electrode 62, it is only necessary to cause the opposite electrode 62 to be higher in potential than the pixel electrode 61.

Like this, when the ionization potential of the first material is greater than the ionization potential of the second material by a certain difference or more, the spectral sensitivity characteristic in the imaging cell 10 can be electrically switched even when the impedance difference between the first photoelectric conversion layer 64a and the second photoelectric conversion layer 64b is low. Impedance difference may be further provided between the first photoelectric conversion layer 64a and the second photoelectric conversion layers 64b such that the impedance difference is sufficiently large to allow the spectral sensitivity characteristic to be electrically switched.

A HOMO level of organic material can be determined, for instance, based on photoelectron spectroscopy, and photoemission yield spectroscopy. Also, a LUMO level may be determined based on inverse photoemission spectroscopy or by subtracting the energy at an absorption spectrum end from the HOMO level.

EXAMPLES

A sample having a multilayer structure similar to an instance of the above-described photoelectric converter PC was produced, and the change of spectral sensitivity characteristic with respect to the change of the bias in the produced sample was evaluated by measuring E.Q.E. with the bias changed. The sample was produced in the following manner.

Example 1-1

First, a glass substrate was prepared. Subsequently, the materials listed in Table 1 were deposited sequentially on a glass substrate by vacuum deposition, and thus a multilayer structure is formed on the glass substrate, the multilayer structure including a lower-surface electrode, an electronic blocking layer, a lower-side photoelectric conversion layer, an upper-side photoelectric conversion layer, and an upper-surface electrode. Table 1 also illustrates the thickness of each layer formed. In the formation of the lower-side photoelectric conversion layer, SnNc and $C_{70}$ were co-evaporated. Similarly, the upper-side photoelectric conversion layer was formed by co-evaporating DTDCTB and $C_{70}$. In the formation of the lower-side photoelectric conversion layer and the formation of the upper-side photoelectric conversion layer, the conditions for vapor deposition were adjusted so that the volume ratio between SnNc and $C_{70}$, and the volume ratio between DTDCTB and $C_{70}$ become 1:1. In this manner, the sample of Example 1-1 was obtained.

TABLE 1

| LAYER | MATERIAL | THICKNESS (nm) |
| --- | --- | --- |
| UPPER-SURFACE ELECTRODE | Al | 80 |
| UPPER-SIDE PHOTOELECTRIC CONVERSION LAYER | DTDCTB:$C_{70}$ (1:1) | 60 |
| LOWER-SIDE PHOTOELECTRIC CONVERSION LAYER | SnNc:$C_{70}$ (1:1) | 60 |
| ELECTRON BLOCKING LAYER | CZBDF | 10 |
| LOWER-SURFACE ELECTRODE | ITO | 150 |

Next, spectral sensitivity measuring device CEP-25RR manufactured by Bunkoukeiki Co., Ltd was connected to the lower-surface electrode and the upper-surface electrode, and E.Q.E. in the sample of Example 1-1 was measured while changing the bias to be applied across the lower-surface electrode and the upper-surface electrode. Here, with the quantity of light to a measurement target fixed, E.Q.E. was measured by changing the potential of the lower-surface electrode to −3 V, −5 V, −8 V, −10 V, and −11 V with the potential of the upper-surface electrode is grounded. Application of these biases corresponds to the configuration in which positive charges are collected by the pixel electrode 61 in the above-described photoelectric converter PC. Specifically, in this instance, positive charges generated by photoelectric conversion move toward the lower-surface electrode, and the lower-surface electrode and the upper-surface electrode in the sample of Example 1-1 can be associated with the pixel electrode 61 and the opposite electrode 62 in the above-described photoelectric converter PC, respectively. However, because light was incident from the glass substrate side in the measurement, ITO was used as the material for the lower-surface electrode, and Al was used as the material for the upper-surface electrode.

Figure 31:
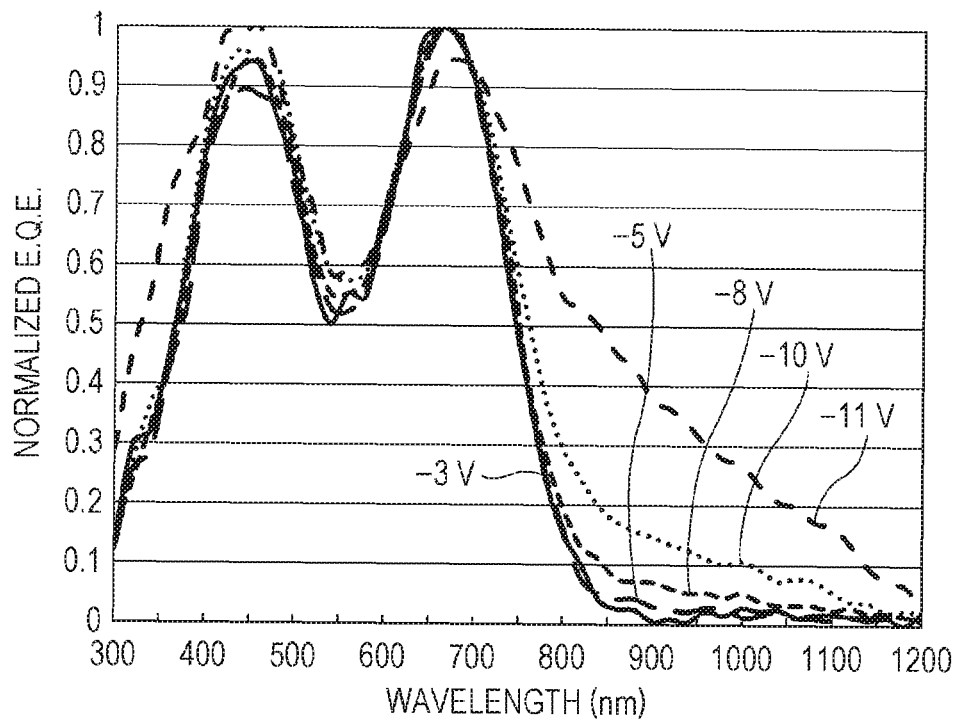
FIG. 31 is graph illustrating the voltage dependence of external quantum efficiency in a sample of Example 1-1.

FIG. 31 illustrates the voltage dependence of E.Q.E. in the sample of Example 1-1. Each of the graphs illustrated in FIG. 31 is normalized so that the peak value of E.Q.E. equals 1. It is to be noted that in each graph after FIG. 31 related to the voltage dependence of E.Q.E., is normalized so that the peak value of E.Q.E. equals 1.

When the absolute value of the bias voltage applied to the lower-surface electrode is small, in other words, when the potential difference applied across two electrodes is low, it is found from FIG. 31 that E.Q.E. in near an absorption peak position of SnNc included in the lower-side photoelectric conversion layer has a relatively low value. In short, the sensitivity in the infrared range is low. In contrast, in the visible range where DTDCTB included in the upper-side photoelectric conversion layer has an absorption peak, a relatively high E.Q.E. was obtained. Furthermore, it is found from FIG. 31 that when the absolute value of the bias voltage applied to the lower-surface electrode is increased, the E.Q.E. in the infrared range increases as the absolute value of the bias voltage is increased. Consequently, it is found that sensitivity in the wavelength range corresponding to the absorption spectrum of SnNc increases depending on the magnitude of the bias.

For instance, at the wavelength (near 870 nm) corresponding to the absorption peak of SnNc, the E.Q.E. when the potential of the lower-surface electrode was set to −3 V is compared with the E.Q.E. when the potential of the lower-surface electrode was set to −11 V, the latter was approximately 33.7 times the former. It is although it did not illustrate in FIG. 31, at the wavelength (near 870 nm) corresponding to the absorption peak of SnNc, the E.Q.E. when the potential of the lower-surface electrode was set to −15 V was approximately 33.7 times the E.Q.E. when the potential of the lower-surface electrode was set to −3 V.

Next, the impedance of the upper-side photoelectric conversion layer was compared with the impedance of the lower-side photoelectric conversion layer. For the measurement of impedance, a sample having only the upper-side photoelectric conversion layer between the lower-surface electrode and the upper-surface electrode, and a sample having only the lower-side photoelectric conversion layer between the lower-surface electrode and the upper-surface electrode were used. The configuration of the sample used for measurement of the impedance of the upper-side photoelectric conversion layer is the same as the configuration of the sample of Example 1-1 except that the lower-side photoelectric conversion layer and the electronic blocking layer were not formed, and the thickness of the upper-side photoelectric conversion layer was 200 nm. The configuration of the sample used for measurement of the impedance of the lower-side photoelectric conversion layer is the same as the configuration of the sample of Example 1-1 except that the upper-side photoelectric conversion layer and the electronic blocking layer were not formed, and the thickness of the lower-side photoelectric conversion layer was 200 nm. For the measurement and analysis of the impedance, ModuLab XM ECS manufactured by TOYO Corporation and Zplot software were used. Frequency sweep mode was used as the operation mode, the amplitude was set to 10 mV, and the frequency was changed from 1 Hz to 1 MHz. Measurement was made with start delay of 5 sec. The values of impedance were compared between the upper-side photoelectric conversion layer and the lower-side photoelectric conversion layer with the bias voltage to the lower-surface electrode with respect to the upper-surface electrode at −8 V and the frequency at 1 Hz.

The value of impedance with the bias voltage of −8 V and the frequency of 1 Hz was 7.5×10$^6$Ω, for the upper-side photoelectric conversion layer including DTDCTB, and 4.2×10$^3$Ω for the lower-side photoelectric conversion layer including SnNc. That is, the impedance of the upper-side photoelectric conversion layer was approximately 1800 times greater than the impedance of the lower-side photoelectric conversion layer.

Figure 32:
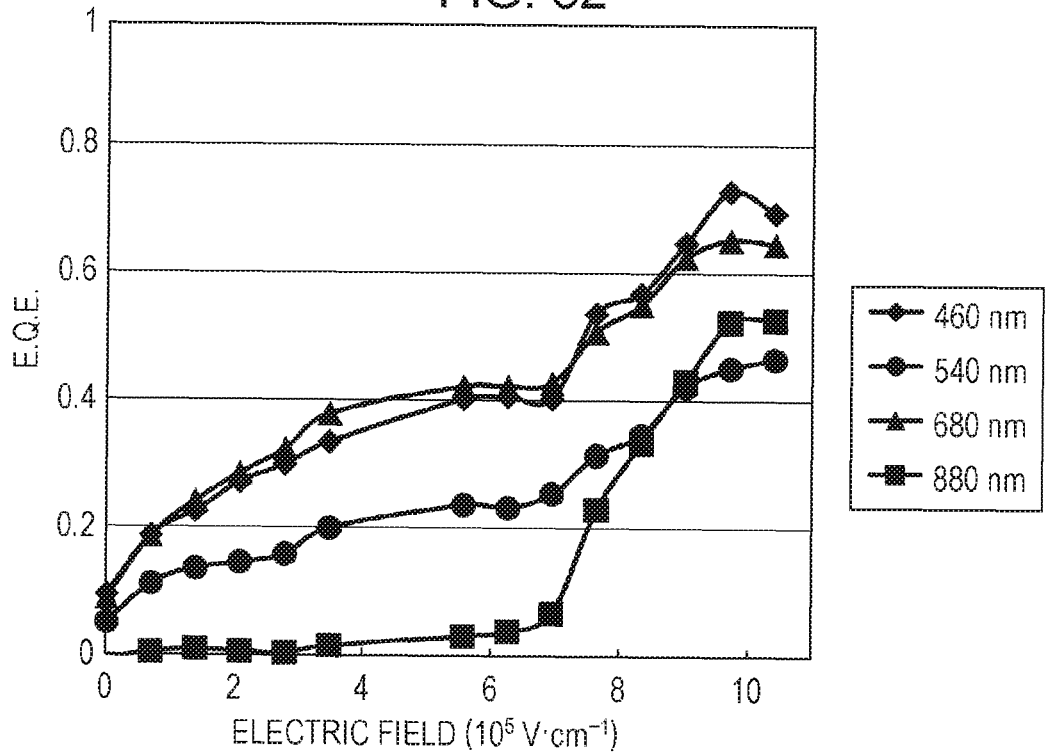
FIG. 32 is a graph illustrating the relationship between external quantum efficiency and applied electric field with wavelengths of 460 nm, 540 nm, 680 nm, and 880 nm for the sample of Example 1-1.

FIG. 32 illustrates the relationship between E.Q.E. and applied electric field with wavelengths of 460 nm, 540 nm, 680 nm, and 880 nm for the sample of Example 1-1. The horizontal axis of the graph illustrated in FIG. 32 indicates the value obtained by dividing the bias voltage applied across the upper-surface electrode and the lower-surface electrode by the sum of thicknesses of the upper-side photoelectric conversion layer, the lower-side photoelectric conversion layer, and the electronic blocking layer. That is, the horizontal axis of the graph illustrated in FIG. 32 corresponds to the magnitude of the electric field applied across the upper-surface electrode and the lower-surface electrode.

In the instance illustrated in FIG. 32, the E.Q.E. for the light with a wavelength of 880 nm is substantially zero with the electric field strength less than approximately $4\times10^5$ V/cm, and the E.Q.E. starts to increase with the electric field strength of a threshold value or greater, here approximately $4\times10^5$ V/cm or greater. A sufficiently high bias can be applied to a layer having relatively lower impedance of two photoelectric conversion layers by applying a sufficiently high bias to the photoelectric conversion structure (for instance, see FIG. 25) including a multilayer structure having the first and second photoelectric conversion layers. From FIG. 32, it is found that when a sufficiently high bias is applied to a layer (that is, here the lower-side photoelectric conversion layer) having relatively lower impedance between two photoelectric conversion layers, the E.Q.E. of the layer has a relatively large value. From FIG. 32, it is found that the E.Q.E. for each of wavelengths 460 nm, 540 nm, 680 nm, and 880 nm tends to be saturated when the magnitude of the electric field between the upper-surface electrode and the lower-surface electrode is approximately $9\times10^5$ V/cm or greater.

Reference Example 1

A sample of Reference Example 1 substantially the same as the sample of Example 1-1 was produced except that a mixed layer including SnNc and DTDCTB was disposed between the lower-side photoelectric conversion layer and the upper-side photoelectric conversion layers. Table 2 below lists the material and the thickness of each layer in the sample of Reference Example 1. The mixed layer was formed by co-evaporating three materials: SnNc, DTDCTB, and $C_{70}$. In the formation of the mixed layer, the conditions for vapor deposition were adjusted so that the volume ratio between SnNc, DTDCTB, and $C_{70}$ becomes 1:1:8. Also, in the formation of the lower-side photoelectric conversion layer and the formation of the upper-side photoelectric conversion layer, the conditions for vapor deposition were adjusted so that the volume ratio between SnNc and $C_{70}$, and the volume ratio between DTDCTB and $C_{70}$ become 1:4.

TABLE 2

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | DTDCTB:$C_{70}$ (1:4) | 50 |
| MIXED LAYER | SnNc:DTDCTB:$C_{70}$ (1:1:8) | 20 |
| LOWER-SIDE PHOTOELECTRIC CONVERSION LAYER | SnNc:$C_{70}$ (1:4) | 50 |
| ELECTRON BLOCKING LAYER | CZBDF | 10 |
| LOWER-SURFACE ELECTRODE | ITO | 150 |

Figure 33:
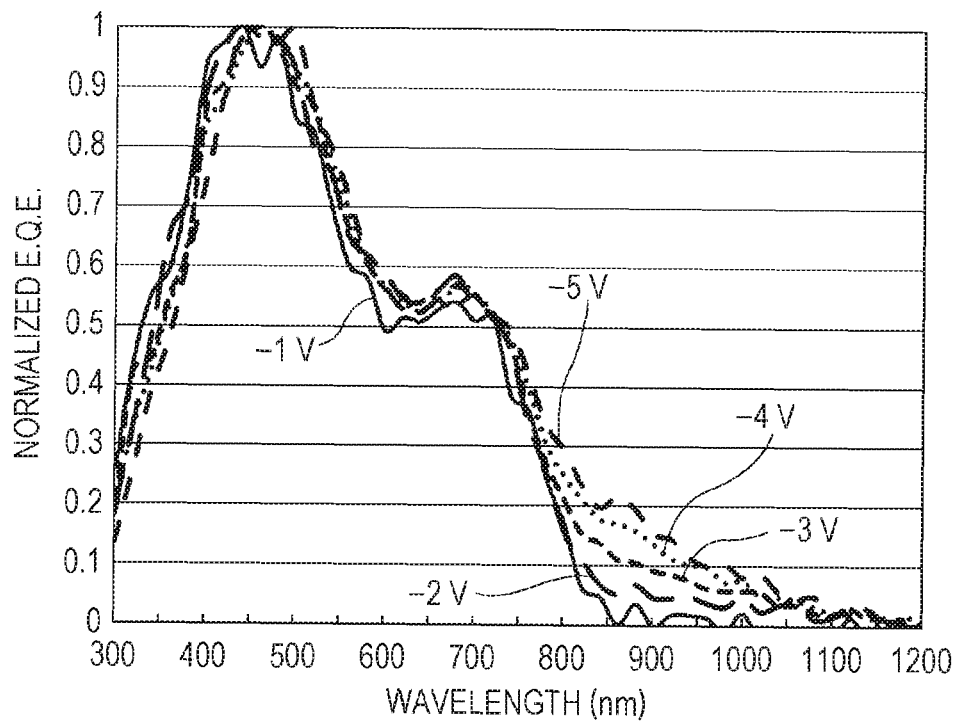
FIG. 33 is a graph illustrating the voltage dependence of external quantum efficiency in a sample of Reference Example 1.

Similarly to the sample of Example 1-1, for the sample of Reference Example 1, the voltage dependence of the E.Q.E. was measured. FIG. 33 illustrates the voltage dependence of E.Q.E. in the sample of Reference Example 1.

As illustrated in FIG. 33, similarly to the sample of Example 1-1, in the sample of Reference Example 1, due to the increase in the absolute value of the bias voltage applied to the lower-surface electrode, the E.Q.E. at near (near 870 nm) the absorption peak position of SnNc included in the lower-side photoelectric conversion layer increases. From FIG. 33, even with the configuration in which the mixed layer including both the first material and the second material is disposed between the photoelectric conversion layers in the multilayer structure having the first and second photoelectric conversion layers, the effect of sensitivity modulation can be obtained by switching the bias voltage.

Example 1-2

Similarly to the sample of Example 1-1, a sample of Example 1-2 was produced except that ClAlPc and $C_{70}$ were used as the material to form the lower-side photoelectric conversion layer. In the formation of the lower-side photoelectric conversion layer, the conditions for vapor deposition were adjusted so that the volume ratio between ClAlPc and $C_{70}$ becomes 1:9. Table 3 below lists the material and the thickness of each layer in the sample of Example 1-2.

TABLE 3

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | DTDCTB:$C_{70}$ (1:9) | 60 |
| LOWER-SIDE PHOTOELECTRIC CONVERSION LAYER | ClAlPc:$C_{70}$ (1:1) | 60 |
| ELECTRON BLOCKING LAYER | CZBDF | 10 |
| LOWER-SURFACE ELECTRODE | ITO | 150 |

Comparative Example 1

Similarly to the sample of Example 1-2, a sample of Comparative Example 1 was produced except that the conditions for vapor deposition were adjusted so that the volume ratio between ClAlPc and $C_{70}$, and the volume ratio between DTDCTB and $C_{70}$ become 1:4. Table 4 below lists the material and the thickness of each layer in the sample of Comparative Example 1.

TABLE 4

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | DTDCTB:$C_{70}$ (1:4) | 60 |
| LOWER-SIDE PHOTOELECTRIC CONVERSION LAYER | ClAlPc:$C_{70}$ (1:4) | 60 |
| ELECTRON BLOCKING LAYER | CZBDF | 10 |
| LOWER-SURFACE ELECTRODE | ITO | 150 |

Figure 34:
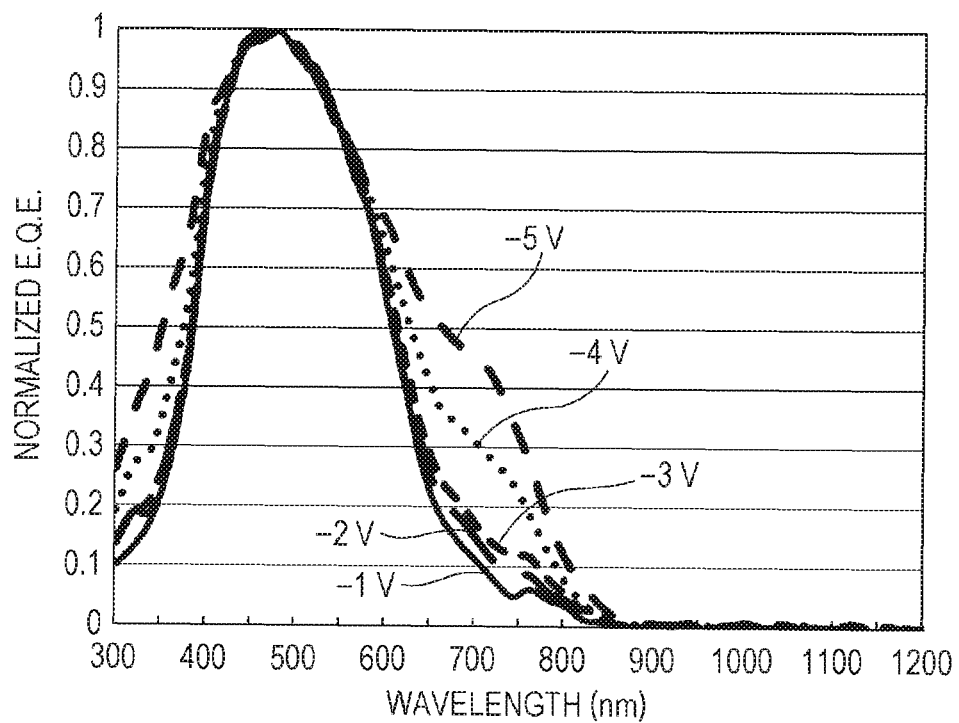
FIG. 34 is a graph illustrating the voltage dependence of external quantum efficiency in a sample of Example 1-2.
Figure 35:
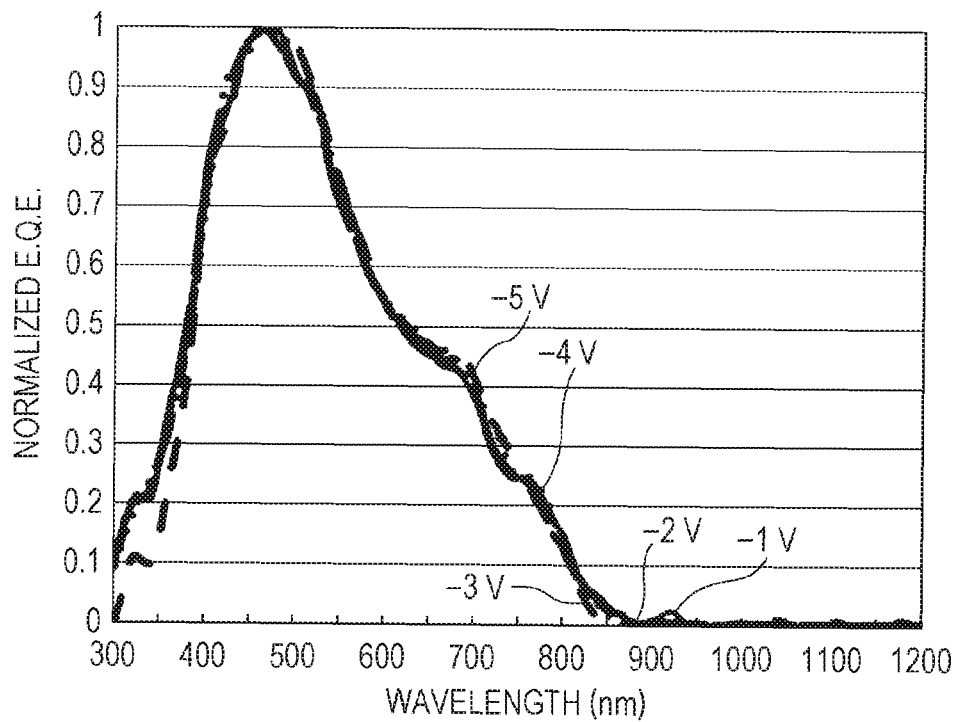
FIG. 35 is a graph illustrating the voltage dependence of external quantum efficiency in a sample of Comparative Example 1.

Similarly to the sample of Example 1-1, for the samples of Example 1-2 and Comparative Example 1, the voltage dependence of the E.Q.E. was measured. FIGS. 34 and 35 illustrate the voltage dependence of the E.Q.E. in the samples of Example 1-2 and Comparative Example 1, respectively.

As illustrated in FIG. 34, in the sample of Example 1-2, the E.Q.E. in the infrared range increases as the electric field strength applied across two electrodes increases. That is, in the sample of Example 1-2, due to the increase in the absolute value of the bias voltage applied to the lower-surface electrode, the E.Q.E. at near (near 750 nm) the absorption peak position of ClAlPc included in the lower-side photoelectric conversion layer increases. In other words, modulation of sensitivity occurred in the infrared range by switching the bias voltage. For instance, at the wavelength corresponding to the absorption peak of ClAlPc, the E.Q.E. when the potential of the lower-surface electrode was set to −1 V is compared with the E.Q.E. when the potential of the lower-surface electrode was set to −5 V, the latter was approximately 6.55 times the former. In contrast, as illustrated in FIG. 35, in the sample of Comparative Example 1, even when the bias voltage applied to the lower-surface electrode is changed, no significant change was observed in the graph of E.Q.E., and it is found that no modulation of sensitivity occurred in the infrared range by switching the bias voltage.

Next, similarly to the sample of Example 1-1, for each of the samples of Example 1-2 and the sample of Comparative Example 1, a sample having only the upper-side photoelectric conversion layer between the lower-surface electrode and the upper-surface electrode, and a sample having only the lower-side photoelectric conversion layer between the lower-surface electrode and the upper-surface electrode were produced, and the impedance of the upper-side photoelectric conversion layer and the impedance of the lower-side photoelectric conversion layer were measured. The thicknesses of the upper-side photoelectric conversion layer and the lower-side photoelectric conversion layer in the sample of a measurement target are both 200 nm. Table 5 below lists the result of measurement of impedance. Each of the values of impedance listed below is a value when the bias voltage to the lower-surface electrode with respect to the upper-surface electrode at −8 V and the frequency at 1 Hz.

TABLE 5

| SAMPLE | LAYER | DONOR-ACCEPTOR RATIO | IMPEDANCE ($\Omega$) |
|---|---|---|---|
| EXAMPLE 1-2 | UPPER-SIDE PHOTOELECTRIC CONVERSION LAYER | DTDCTB:$C_{70}$ (1:9) | $1.2 \times 10^7$ |
| | LOWER-SIDE PHOTOELECTRIC CONVERSION LAYER | ClAlPc:$C_{70}$ (1:1) | $6.3 \times 10^4$ |
| COMPARATIVE EXAMPLE 1 | UPPER-SIDE PHOTOELECTRIC CONVERSION LAYER | DTDCTB:$C_{70}$ (1:4) | $3.0 \times 10^7$ |
| | LOWER-SIDE PHOTOELECTRIC CONVERSION LAYER | ClAlPc:$C_{70}$ (1:4) | $1.0 \times 10^7$ |

As seen from Table 5, in the sample of Comparative Example 1, the impedance of the upper-side photoelectric conversion layer was approximately three times greater than the impedance of the lower-side photoelectric conversion layer, whereas in the sample of Example 1-2, the impedance of the upper-side photoelectric conversion layer was approximately 190 times greater than the impedance of the lower-side photoelectric conversion layer. Modulation of sensitivity by switching the bias voltage was not observed in the sample of Comparative Example 1, whereas modulation of sensitivity by switching the bias voltage was observed in the sample of Example 1-2. This is probably because the impedance difference between the upper-side photoelectric conversion layer and the lower-side photoelectric conversion layers has increased.

It is to be noted that in the samples of Example 1-1 and Example 1-2, the ionization potential of DTDCTB used for formation of the upper-side photoelectric conversion layer is approximately 5.6 eV. The ionization potential of SnNc used for formation of the lower-side photoelectric conversion layer in the sample of Example 1-1 and the ionization potential of ClAlPc used for formation of the lower-side photoelectric conversion layer in the sample of Example 1-2 are 5.0 eV and 5.5 eV, respectively. Therefore, in the samples of Example 1-1 and Example 1-2, no potential barrier for the positive charges is formed between the lower-side photoelectric conversion layer and the upper-side photoelectric conversion layers. Thus, when the impedance difference between two photoelectric conversion layers in the multilayer structure is high to some extent, modulation of sensitivity by switching the bias voltage is obtained even when no potential barrier for the positive charges is present.

Example 2-1

Similarly to the sample of Example 1-1 essentially, a sample of Example 2-1 was produced except that SnNc and $C_{70}$ were used as the material to form the upper-side photoelectric conversion layer, and rubrene and $C_{70}$ were used as the material to form the lower-side photoelectric conversion layer. The volume ratio between SnNc and $C_{70}$, and the volume ratio between rubrene and $C_{70}$ were adjusted to be 1:4. Table 6 below lists the material and the thickness of each layer in the sample of Example 2-1. As illustrated in Table 6, both the thickness of the upper-side photoelectric conversion layer and the lower-side photoelectric conversion layer were 200 nm.

TABLE 6

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | SnNc:$C_{70}$ (1:4) | 200 |
| LOWER-SIDE PHOTOELECTRIC CONVERSION LAYER | Rubrene:$C_{70}$ (1:4) | 200 |
| ELECTRON BLOCKING LAYER | CZBDF | 10 |
| LOWER-SURFACE ELECTRODE | ITO | 150 |

Comparative Example 2-1

Similarly to the sample of Example 2-1, a sample of Comparative Example 2-1 was produced except that Rubrene and $C_{70}$ were used as the material to form the upper-side photoelectric conversion layer, and SnNc and $C_{70}$ were used as the material to form the lower-side photoelectric conversion layer. In other words, the sample of Comparative Example 2-1 has a configuration in which the upper-side photoelectric conversion layer and the lower-side photoelectric conversion layer in the sample of Example 2-1 are swapped. Table 7 below lists the material and the thickness of each layer in the sample of Comparative Example 2-1.

TABLE 7

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | Rubrene:$C_{70}$ (1:4) | 200 |

TABLE 7-continued

| LAYER | MATERIAL | THICKNESS (nm) |
|---|---|---|
| LOWER-SIDE PHOTOELECTRIC CONVERSION LAYER | SnNc:$C_{70}$ (1:4) | 200 |
| ELECTRON BLOCKING LAYER | CZBDF | 10 |
| LOWER-SURFACE ELECTRODE | ITO | 150 |

Figure 36:
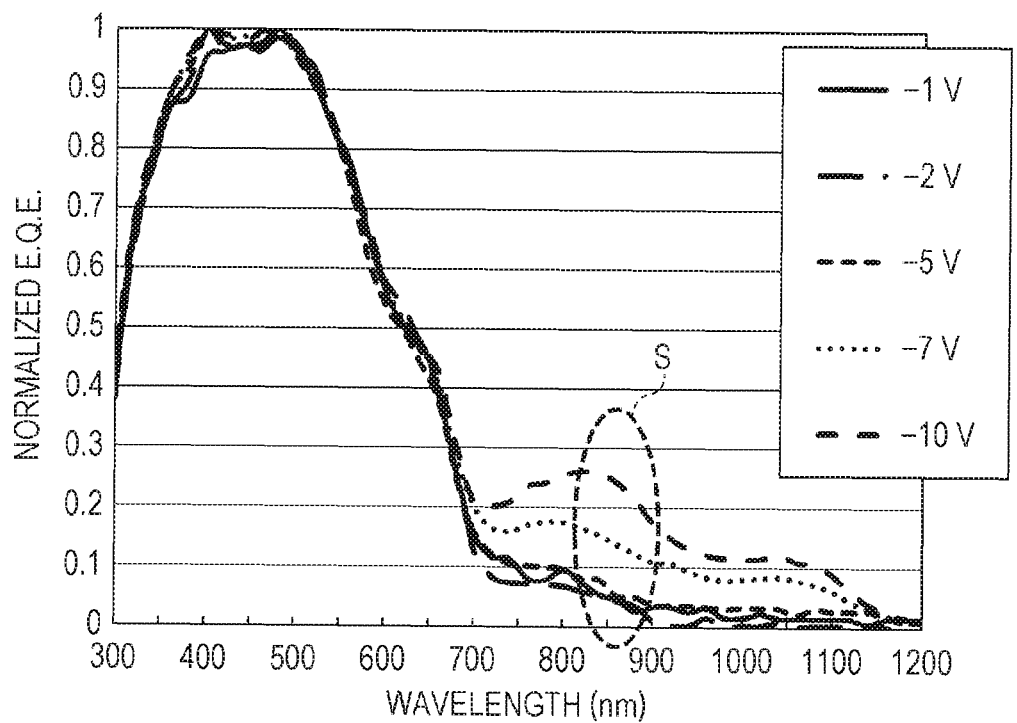
FIG. 36 is a graph illustrating the voltage dependence of external quantum efficiency in a sample of Example 2-1.
Figure 37:
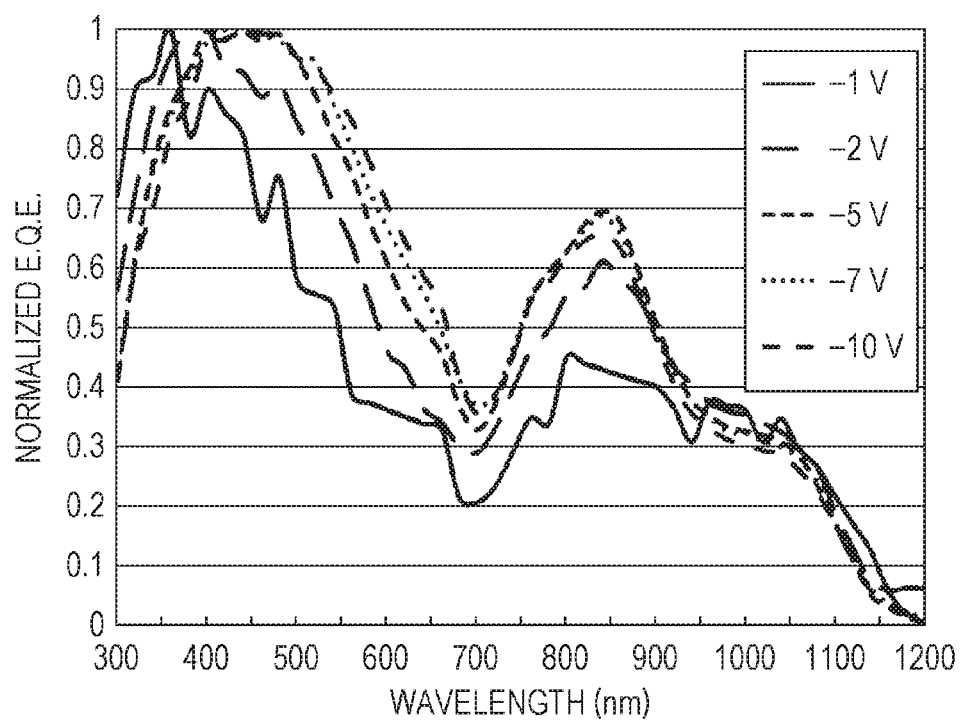
FIG. 37 is a graph illustrating the voltage dependence of external quantum efficiency in a sample of Comparative Example 2-1.

Similarly to the sample of Example 1-1, for the samples of Example 2-1 and Comparative Example 2-1, the voltage dependence of the E.Q.E. was measured. FIGS. 36 and 37 illustrate the voltage dependence of the E.Q.E. in the samples of Example 2-1 and Comparative Example 2-1, respectively.

In FIG. 36, as illustrated by a dashed ellipse S, in the sample of Example 2-1, the E.Q.E. in the infrared range increases as the electric field strength applied across two electrodes increases. In this instance, sufficient sensitivity has occurred in the infrared range at near a point where the bias voltage applied to the lower-surface electrode falls below −5V. In other words, in the sample of Example 2-1, due to the increase in the absolute value of the bias voltage applied to the lower-surface electrode, the E.Q.E. at near the absorption peak position of SnNc included in the lower-side photoelectric conversion layer increases. For instance, at the wavelength (near 870 nm) corresponding to the absorption peak of SnNc, the E.Q.E. when the potential of the lower-surface electrode was set to −3 V is compared with the E.Q.E. when the potential of the lower-surface electrode was set to −10 V, the latter was approximately 4.27 times the former.

In contrast, as illustrated in FIG. 37, in the sample of Comparative Example 2-1, both the E.Q.E. in the infrared range and the E.Q.E. in the visible range increase as the electric field strength applied across two electrodes increases. That is, in the sample of Comparative Example 2-1, no distinct modulation of sensitivity occurred in the infrared range by switching the bias voltage.

Next, similarly to the sample of Example 1-1, for each of the samples of Example 2-1 and the sample of Comparative Example 2-1, a sample having only the upper-side photoelectric conversion layer between the lower-surface electrode and the upper-surface electrode, and a sample having only the lower-side photoelectric conversion layer between the lower-surface electrode and the upper-surface electrode were produced, and the impedance of the upper-side photoelectric conversion layer and the impedance of the lower-side photoelectric conversion layer were measured. The thicknesses of the upper-side photoelectric conversion layer and the lower-side photoelectric conversion layer in the sample of a measurement target are both 200 nm. Table 8 below lists the result of measurement of impedance.

TABLE 8

| SAMPLE | LAYER | DONOR-ACCEPTOR RATIO | IMPEDANCE (Ω) |
|---|---|---|---|
| EXAMPLE 2-1 | UPPER-SIDE PHOTOELECTRIC CONVERSION LAYER | SnNc:$C_{70}$ (1:4) | $1.0 \times 10^4$ |
| | LOWER-SIDE PHOTOELECTRIC CONVERSION LAYER | Rubrene:$C_{70}$ (1:4) | $9.0 \times 10^3$ |
| COMPARATIVE EXAMPLE 2-1 | UPPER-SIDE PHOTOELECTRIC CONVERSION LAYER | Rubrene:$C_{70}$ (1:4) | $9.0 \times 10^3$ |
| | LOWER-SIDE PHOTOELECTRIC CONVERSION LAYER | SnNc:$C_{70}$ (1:4) | $1.0 \times 10^4$ |

As seen in Table 8, in the sample of Comparative Example 2-1, the impedance of the upper-side photoelectric conversion layer is lower than the impedance of the lower-side photoelectric conversion layer. In contrast, in the sample of Example 2-1, the impedance of the upper-side photoelectric conversion layer is greater than the impedance of the lower-side photoelectric conversion layer. However, the ratio of the impedance of the upper-side photoelectric conversion layer to the lower-side photoelectric conversion layer is approximately 1.1 times, and a large difference was observed between the lower-side photoelectric conversion layer and the upper-side photoelectric conversion layer.

Here, when attention is focused on the ionization potentials of rubrene and SnNc, the ionization potential of rubrene is 5.35 eV and the ionization potential of SnNc is 5.0 eV. Therefore, in the sample of Example 2-1, for the positive charges that move toward the lower-surface electrode, a potential barrier of 0.35 eV is present between the HOMO level of rubrene and the HOMO level of SnNc (see FIG. 28). In contrast, in the sample of Comparative Example 2-1, for the positive charges that move toward the lower-surface electrode, no potential barrier is present between the HOMO level of rubrene and the HOMO level of SnNc. It is presumed that the reason why no distinct modulation of sensitivity in the infrared range was observed in the sample of Comparative Example 2-1, and yet distinct modulation of sensitivity in the infrared range was observed in the sample of Example 2-1 is that a potential barrier for the positive holes was formed between two photoelectric conversion layers.

Example 2-2

The materials listed in Table 9 below were deposited sequentially on a glass substrate by vacuum deposition, and thus a sample of Example 2-2 was produced. In the formation of the lower-side photoelectric conversion layer, ClAlPc and Coo were co-evaporated, and in the formation of the upper-side photoelectric conversion layer, α-6T and $C_{70}$ were co-evaporated. In the formation of the lower-side photoelectric conversion layer, the conditions for vapor deposition were adjusted so that the volume ratio between ClAlPc and $C_{60}$ becomes 1:4, and in the formation of the upper-side photoelectric conversion layer, the conditions for vapor deposition were adjusted so that the volume ratio between α-6T and $C_{70}$ becomes 1:1.

TABLE 9

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | α-6T:$C_{70}$ (1:1) | 60 |

TABLE 9-continued

| LAYER | MATERIAL | THICKNESS (nm) |
|---|---|---|
| LOWER-SIDE PHOTOELECTRIC CONVERSION LAYER | ClAlPc:C$_{60}$ (1:4) | 60 |
| ELECTRON BLOCKING LAYER | CZBDF | 10 |
| LOWER-SURFACE ELECTRODE | ITO | 150 |

Figure 38:
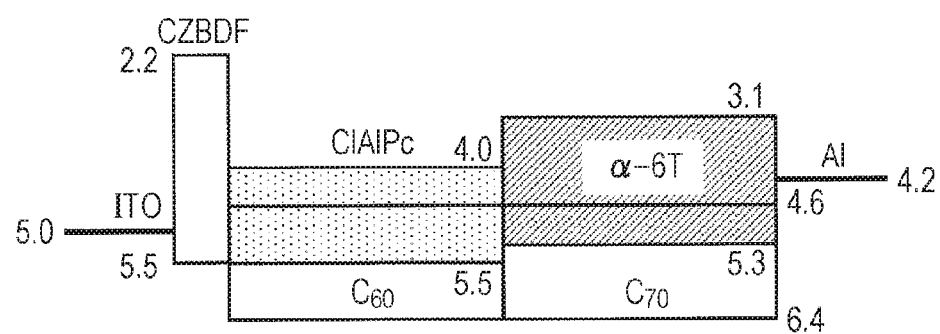
FIG. 38 is an energy diagram for a sample of Example 2-2.

FIG. 38 illustrates an energy diagram for the sample of Example 2-2. As illustrated in FIG. 38, the ionization potentials of ClAlPc and α-6T are 5.5 eV and 5.3 eV, respectively, and in the sample of Example 2-2, a potential barrier of 0.2 eV is formed between the HOMO level of ClAlPc and the HOMO level of α-6T.

Figure 39:
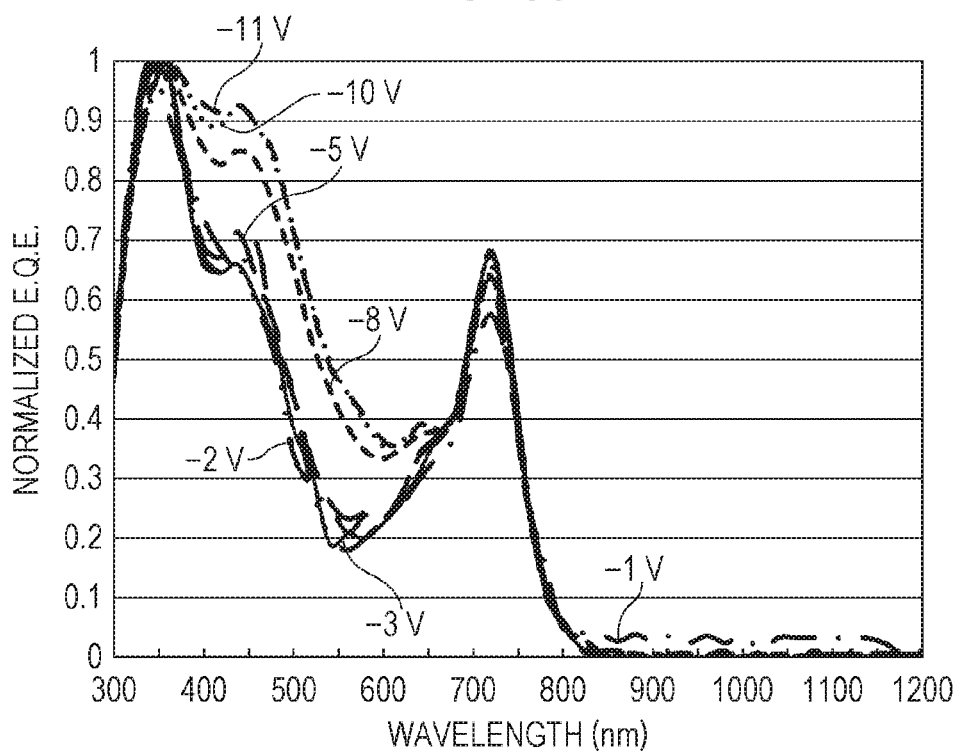
FIG. 39 is a graph illustrating the voltage dependence of external quantum efficiency in a sample of Example 2-2.

Similarly to the sample of Example 1-1, for the sample of Example 2-2, the voltage dependence of the E.Q.E. was measured. FIG. 39 illustrates the voltage dependence of the E.Q.E. in the sample of Example 2-2. As illustrated in FIG. 39, in the sample of Example 2-2, due to the increase in the absolute value of the bias voltage applied to the lower-surface electrode, the E.Q.E. at near (near 440 nm) the absorption peak position of α-6T increases. In other words, the E.Q.E. in the visible range increases. That is, in this instance, the effect of modulation of sensitivity by switching the bias voltage in the visible range is obtained.

Comparative Example 2-2

Similarly to the sample of Example 2-2, a sample of Comparative Example 2-2 was produced except that the material to form the upper-side photoelectric conversion layer and the material to form the lower-side photoelectric conversion layer are swapped. Table 10 below lists the material and the thickness of each layer in the sample of Example 2-2.

TABLE 10

| LAYER | MATERIAL | THICKNESS (nm) |
|---|---|---|
| UPPER-SURFACE ELECTRODE | Al | 80 |
| UPPER-SIDE PHOTOELECTRIC CONVERSION LAYER | ClAlPc:C$_{60}$ (1:4) | 60 |
| LOWER-SIDE PHOTOELECTRIC CONVERSION LAYER | α-6T:C$_{70}$ (1:1) | 60 |
| ELECTRON BLOCKING LAYER | CZBDF | 10 |
| LOWER-SURFACE ELECTRODE | ITO | 150 |

Figure 40:
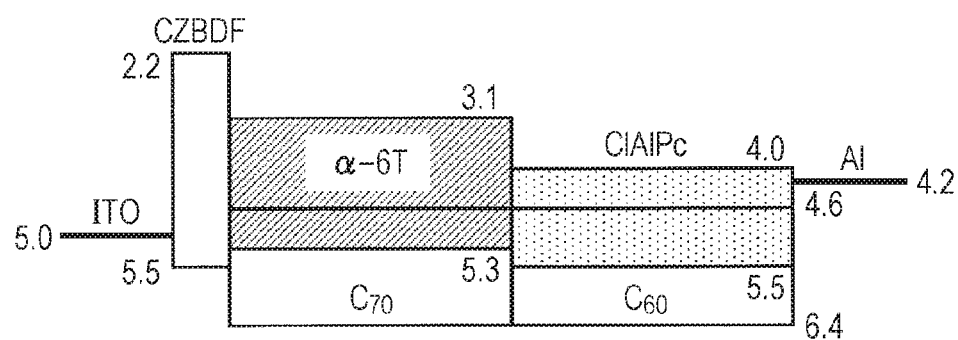
FIG. 40 is an energy diagram for a sample of Comparative Example 2-2.

FIG. 40 illustrates an energy diagram for the sample of Comparative Example 2-2. As seen from FIG. 40, in this instance, no potential barrier for the positive charges is formed between the HOMO level of ClAlPc and the HOMO level of α-6T.

Figure 41:
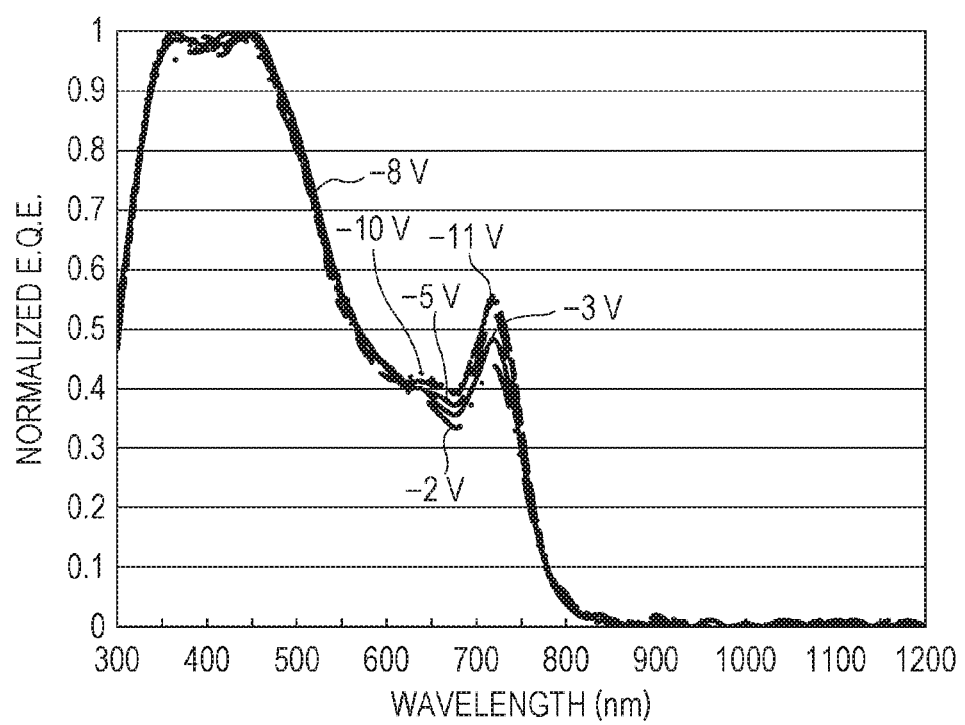
FIG. 41 is a graph illustrating the voltage dependence of external quantum efficiency in a sample of Comparative Example 2-2.

Similarly to the sample of Example 1-1, for the sample of Comparative Example 2-2, the voltage dependence of the E.Q.E. was measured. FIG. 41 illustrates the voltage dependence of E.Q.E. in a sample of Comparative Example 2-2. As illustrated in FIG. 41, in the sample of Comparative Example 2-2, even when the bias voltage applied to the lower-surface electrode is changed, no significant change was observed in the graph of E.Q.E., and no modulation of sensitivity occurred by switching the bias voltage.

It is found from FIGS. 36 to 41 that sensitivity modulation can be achieved through switching the bias voltage by forming a potential barrier for the positive charges between the HOMO level of the material of which the upper-side photoelectric conversion layer is composed and the HOMO level of the material of which the lower-side photoelectric conversion layer is composed. From comparison between Example 2-2 and Comparative Example 2-2, distinct increase in the E.Q.E. can be achieved even in the visible range by appropriately selecting materials for the two photoelectric conversion layers in the multilayer structure.

It is found from comparison between Example 2-2 and Comparative Example 2-2 that when the material for one photoelectric conversion layer has an ionization potential greater than the ionization potential of the material for the other photoelectric conversion layer by 0.2 eV or more, the effect of distinct increase in the E.Q.E. can be achieved in a specific wavelength range in addition to the infrared range, the one photoelectric conversion layer being one of two photoelectric conversion layers included in the multilayer structure in the photoelectric conversion structure and being closer to an electrode relatively low in potential (the lower-surface electrode in this instance). For instance, the ionization potential of Si(OSiR$_3$)$_2$Nc and the ionization potential of CuPc are 5.4 eV and 5.2 eV, respectively, and thus when Si(OSiR$_3$)$_2$Nc and CuPc are used as the first material and the second material, respectively, it is expected that distinct modulation of sensitivity in the visible range occurs. Instead of rubrene of Example 2-2, CuPc may be used.

(Typical Example of Photoelectric Current Characteristics in Photoelectric Conversion Layer)

Furthermore, a photoelectric conversion structure that exhibits photocurrent characteristics as described below is used for the photoelectric converter PC, and the potential difference Φ between the pixel electrode 61 and the opposite electrode 62 is reduced to some extent, thereby making it possible to suppress movement of signal charges already accumulated in the charge accumulation region to the opposite electrode 62 via the photoelectric conversion structure 64, and further accumulation of the signal charges in the charge accumulation region after the potential difference is reduced. Consequently, the function of a shutter can be electrically achieved by controlling the magnitude of the bias voltage to be applied to the photoelectric conversion structure. Therefore, for instance, a global shutter function can be achieved without separately providing a device such as a transfer transistor in each of the multiple imaging cells.

Figure 42:
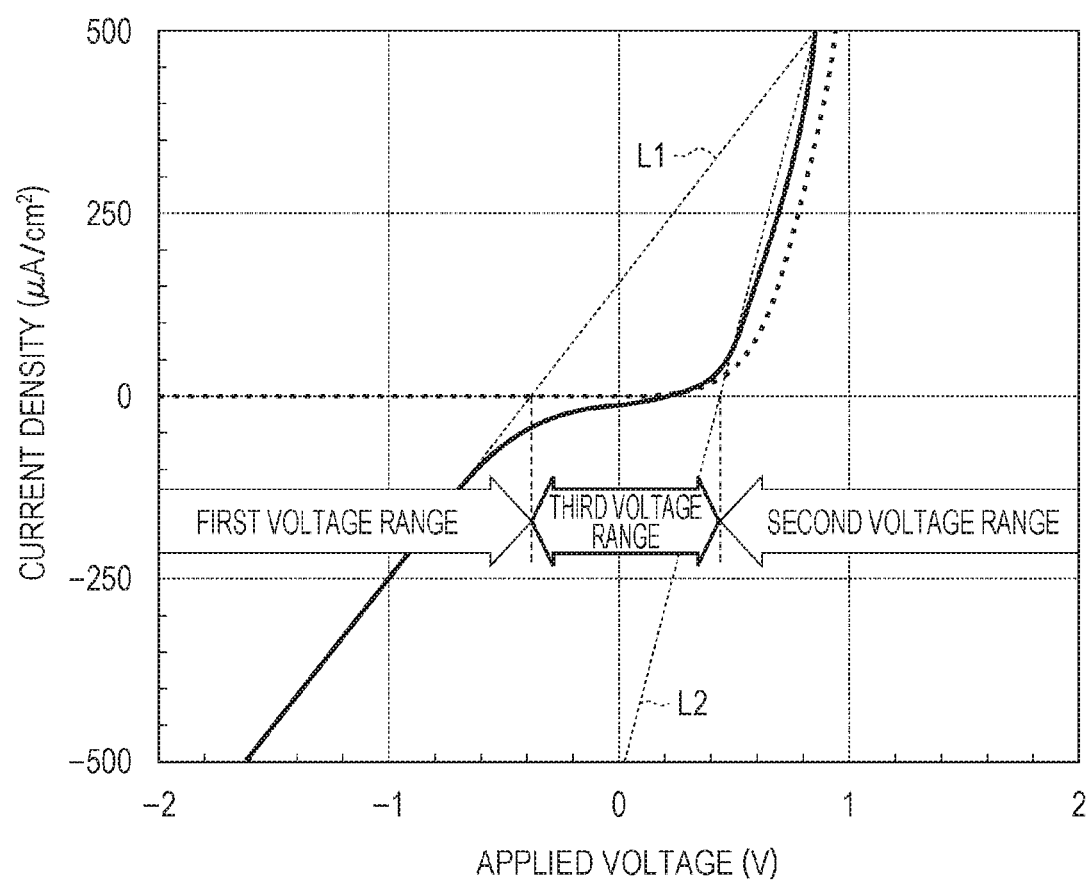
FIG. 42 is a graph illustrating a typical photocurrent characteristic of a photoelectric conversion structure according to Embodiments of the present disclosure.

FIG. 42 illustrates a typical photocurrent characteristic of a photoelectric conversion structure according to Embodiments of the present disclosure. The thick solid graph in FIG. 42 illustrates an exemplary I-V characteristics of the photoelectric conversion structure under irradiation with light. It is to be noted that FIG. 42 also illustrates an instance of I-V characteristics under no irradiation with light by a thick dashed line.

FIG. 42 illustrates the change in the current density between the major surfaces of the photoelectric conversion structure (the photoelectric conversion structure 64, 64A, or 64B) when the bias voltage to be applied across the two major surfaces is changed under certain illumination. In the present description, the forward direction and the reverse direction in the bias voltage are defined as follows: When the photoelectric conversion structure has a structure of junction between a layered p-type semiconductor and a layered n-type semiconductor, a bias voltage that causes the potential of a layer of p-type semiconductor to be higher than the potential of a layer of n-type semiconductor is defined as the bias voltage in the forward direction. On the other hand, a bias voltage that causes the potential of a layer of p-type semiconductor to be lower than the potential of a layer of n-type semiconductor is defined as the bias voltage in the reverse direction. Similarly to the case where an inorganic semiconductor material is used, in the case where an organic semiconductor material is used, the forward direction and the reverse direction can be defined. When the photoelectric conversion structure has a bulk heterojunction structure, as schematically illustrated in FIG. 1 in Japanese Patent No. 5553727 mentioned above, a p-type semiconductor appears more often than an n-type semiconductor on one of the two major surfaces of a bulk heterojunction structure, which face respective electrodes, and an n-type semiconductor appears more often than a p-type semiconductor on the other major surface. Therefore, a bias voltage that causes the potential of one major surface in which a p-type semiconductor appears more often than an n-type semiconductor to be higher than the potential of the other major surface in which an n-type semiconductor appears more often than a p-type semiconductor can be defined as the bias voltage in the forward direction.

As illustrated in FIG. 42, for instance, the photoelectric current characteristics of the photoelectric conversion structure 64 is schematically characterized by first to third voltage ranges. The first voltage range is a reverse bias voltage range in which the absolute value of output current density increases as a reverse direction bias voltage increases. The first voltage range may be a voltage range such that a photoelectric current increases as the bias voltage applied across the major surfaces of the photoelectric conversion structure increases. The second voltage range is a forward bias voltage range in which the absolute value of output current density increases as a forward direction bias voltage increases. In other words, the second voltage range may be a voltage range such that a forward direction current increases as the bias voltage applied across the major surfaces of the photoelectric conversion structure increases. The third voltage range is a voltage range between the first voltage range and the second voltage range.

The first to third voltage ranges can be distinguished by the slope of a graph of photoelectric current characteristics when linear vertical axis and horizontal axis are used. For reference, in FIG. 42, an average slope of the graph in each of the first voltage range and the second voltage range is indicated by a dashed line L1 and a dashed line L2, respectively. As illustrated in FIG. 42, a rate of change in the output current density for an increase in the bias voltage in the first voltage range, the second voltage range, and the third voltage range is different from range to range. The third voltage range is defined as the voltage range in which the rate of change in the output current density for the bias voltage is lower than the rate of change in the first voltage range and the rate of change in the second voltage range. Alternatively, the third voltage range may be determined based on a rising or falling position in the graph illustrating the I-V characteristics. The third voltage range is typically a voltage range greater than −1 V and smaller than 1 V. In the third voltage range, even when the bias voltage is changed, the current density between the major surfaces of the photoelectric conversion structure hardly changes. As illustrated in FIG. 42, in the third voltage range, the absolute value of current density is typically 100 µA/cm$^2$ or less.

For instance, the potential of the pixel electrode 61 is adjusted by switching the voltage applied to the first signal line 31 from the voltage supply circuit 41, and thereby the potential difference between the pixel electrode 61 and the opposite electrode 62, in other words, the bias voltage applied across the major surfaces of the photoelectric conversion structure at the start of a signal accumulation period can be within the third voltage range. A state can be achieved in which substantially no charges are moved between the photoelectric conversion structure and the electrodes, by maintaining the bias voltage applied across the major surfaces of the photoelectric conversion structure within the third voltage range. In short, an electrical shutter can be achieved.

The imaging device in the present disclosure is applicable to an image sensor, for instance. The imaging device in the present disclosure can be used for a digital camera, a camera for medical use, and a camera for robots. Acquisition of an image utilizing the infrared light is also possible by appropriately selecting the material for the photoelectric conversion structure, and the voltage applied to the first signal line. Embodiments of the present disclosure are also useful for a security camera, and a camera mounted and used in a vehicle.

What is claimed is:

1. An imaging device comprising:
   an imaging cell including
      a photoelectric converter including a first electrode, a second electrode, and a photoelectric conversion layer between the first electrode and the second electrode,
      a first transistor one of a source and a drain of which is coupled to the first electrode, and
      a second transistor having a gate coupled to the first electrode;
   first voltage supply circuitry coupled to the other of the source and the drain of the first transistor, the first voltage supply circuitry being configured to supply a first voltage in a first period and a second voltage different from the first voltage in a second period different from the first period, and
   second voltage supply circuitry different from the first voltage supply circuitry, second voltage supply circuitry being coupled to one of a source and a drain of the second transistor and being configured to supply a third voltage.

2. The imaging device according to claim 1, further comprising:
   an inverting amplifier having a inverting input terminal, a non-inverting input terminal, and an output terminal, wherein
   the other of the source and the drain of the second transistor is coupled to the inverting input terminal,
   the other of the source and the drain of the first transistor is coupled to the first output terminal, and
   the first voltage supply circuitry is coupled to the non-inverting input terminal.

3. An imaging device comprising:
   an imaging cell including
      a photoelectric converter including a first electrode, a second electrode, and a photoelectric conversion layer between the first electrode and the second electrode, and
      a first transistor one of a source and a drain of which is coupled to the first electrode;
   voltage supply circuitry coupled to the other of the source and the drain of the first transistor, the voltage supply circuitry being configured to supply a first voltage in a first period and a second voltage different from the first voltage in a second period different from the first period; and
   selection circuitry coupled to a first control line and a second control line, the selection circuitry switching between ON and OFF of the first transistor based on a voltage of the first control line and a voltage of the second control line.

4. An imaging device comprising:
an imaging cell including
a photoelectric converter including a first electrode, a second electrode, and a photoelectric conversion layer between the first electrode and the second electrode, and
a first transistor one of a source and a drain of which is coupled to the first electrode; and
voltage supply circuitry coupled to the other of the source and the drain of the first transistor, the voltage supply circuitry being configured to supply a first voltage in a first period and a second voltage different from the first voltage in a second period different from the first period,
wherein the voltage supply circuitry supplies the first voltage to the other of the source and the drain of the first transistor in a reset period in a first frame period, and supplies the second voltage to the other of the source and the drain of the first transistor in a reset period in a second frame period different from the first frame period.

5. The imaging device according to claim 2, wherein the first voltage supply circuitry supplies the first voltage to the non-inverting input terminal in a reset period in a first frame period, and supplies the second voltage to the non-inverting input terminal in a reset period in a second frame period different from the first frame period.

6. The imaging device according to claim 1, wherein
the photoelectric conversion layer includes a first layer and a second layer, and
impedance of the first layer is greater than impedance of the second layer.

7. The imaging device according to claim 1, wherein the photoelectric conversion layer includes a first layer and a second layer, the first layer includes a first material, the second layer includes a second material, and
an ionization potential of the first material is greater than an ionization potential of the second material by 0.2 eV or more.

8. The imaging device according to claim 6, wherein the first layer includes a first material,
the second layer includes a second material, and the first material and the second material are both electron-donating molecules.

9. The imaging device according to claim 7, wherein the first material and the second material are both electron-donating molecules.

10. The imaging device according to claim 1, wherein each of the first voltage and the second voltage is different from the third voltage.

11. The imaging device according to claim 1, wherein the first voltage supply circuitry is coupled to the other of the source and the drain of the first transistor not through the second transistor.

* * * * *